United States Patent
Yu et al.

(10) Patent No.: US 8,060,670 B2
(45) Date of Patent: Nov. 15, 2011

(54) METHOD AND SYSTEMS FOR STORING AND ACCESSING DATA IN USB ATTACHED-SCSI (UAS) AND BULK-ONLY-TRANSFER (BOT) BASED FLASH-MEMORY DEVICE

(75) Inventors: I-Kang Yu, San Jose, CA (US); Charles C. Lee, San Jose, CA (US); Shimon Chen, San Jose, CA (US); Abraham C. Ma, San Jose, CA (US)

(73) Assignee: Super Talent Electronics, Inc., San Jose, CA (US)

( * ) Notice: Subject to any disclaimer, the term of this patent is extended or adjusted under 35 U.S.C. 154(b) by 104 days.

(21) Appl. No.: 12/717,918

(22) Filed: Mar. 4, 2010

(65) Prior Publication Data
US 2010/0185808 A1 Jul. 22, 2010

Related U.S. Application Data

(60) Continuation-in-part of application No. 12/254,428, filed on Oct. 20, 2008, now Pat. No. 7,849,242, which is a division of application No. 10/803,597, filed on Mar. 17, 2004, now Pat. No. 7,457,897, application No. 12/717,918, which is a continuation-in-part of application No. 10/854,004, filed on May 25, 2004, now Pat. No. 7,836,236, and a continuation-in-part of application No. 12/576,216, filed on Oct. 8, 2009, and a continuation-in-part of application No. 11/623,863, filed on Jan. 17, 2007, now Pat. No. 7,814,337, and a continuation-in-part of application No. 11/876,597, filed on Oct. 22, 2007, now Pat. No. 7,815,469, and a continuation-in-part of application No. 11/925,933, filed on Oct. 27, 2007, now abandoned, and a continuation-in-part of application No. 12/651,334, filed on Dec. 31, 2009, and a continuation-in-part of application No. 12/124,081, filed on May 20, 2008, now Pat. No. 7,872,873, and a continuation-in-part of application No. 11/874,767, filed on Oct. 18, 2007, and a continuation-in-part of application No. 11/866,927, filed on Oct. 3, 2007, and a continuation-in-part of application No. 11/864,696, filed on Sep. 28, 2007, and a continuation-in-part of application No. 12/608,842, filed on Oct. 29, 2009, now Pat. No. 7,844,763.

(51) Int. Cl.
G06F 12/02 (2006.01)
G06F 13/36 (2006.01)
G06F 3/00 (2006.01)

(52) U.S. Cl. ............. 710/62; 710/8; 710/315; 710/10; 710/63; 710/72; 710/105; 710/100; 711/103; 711/E12.008

(58) Field of Classification Search .................. None
See application file for complete search history.

(56) References Cited

U.S. PATENT DOCUMENTS 4,572,604 A 2/1986 Ammon et al.
(Continued)

OTHER PUBLICATIONS

Universal Serial Bus Mass Storage Class USB Attached SCSI Protocol (UASP), Revision 1.0, Jun. 24, 2009.*

(Continued)

*Primary Examiner* — Tammara Peyton
(74) *Attorney, Agent, or Firm* — Roger H. Chu

(57) ABSTRACT

Methods and systems for storing and accessing data in UAS based flash memory device are disclosed. UAS based flash memory device comprises a controller and a plurality of non-volatile memories (e.g., flash memory) it controls. Controller is configured for connecting to a UAS host via a physical layer (e.g., plug and wire based on USB 3.0) and for conducting data transfer operations via two sets of logical pipes. Controller further comprises a random-access-memory (RAM) buffer configured for enabling parallel and duplex data transfer operations through the sets of logical pipes. In addition, a Smart Storage Switch configured for connecting multiple non-volatile memory devices is included in the controller. Finally, a security module/engine/unit is provided for data security via user authentication data encryption/decryption of the device. Furthermore, the flash memory device includes an optical transceiver configured for optical connection to a host also configured with an optical transceiver.

2 Claims, 50 Drawing Sheets

U.S. PATENT DOCUMENTS

| | | | |
|---|---|---|---|
| 5,652,839 A | 7/1997 | Giorgio et al. | |
| 5,766,033 A | 6/1998 | Davis | |
| 6,353,866 B1 | 3/2002 | Fensore et al. | |
| 6,356,582 B1 | 3/2002 | Mazer et al. | |
| 6,370,603 B1 | 4/2002 | Silverman et al. | |
| 6,415,342 B1 | 7/2002 | Wahl et al. | |
| 6,438,638 B1 | 8/2002 | Jones et al. | |
| 6,501,163 B1 | 12/2002 | Utsumi | |
| 6,634,561 B1 | 10/2003 | Wallace | |
| 6,651,212 B1 | 11/2003 | Katayama et al. | |
| 6,666,724 B1 | 12/2003 | Lwee | |
| 6,671,808 B1 | 12/2003 | Abbott et al. | |
| 6,721,337 B1 * | 4/2004 | Kroeger et al. | 370/477 |
| 6,733,329 B2 | 5/2004 | Yang | |
| 6,778,401 B1 | 8/2004 | Yu et al. | |
| 6,854,984 B1 | 2/2005 | Lee et al. | |
| 7,004,780 B1 | 2/2006 | Wang | |
| 7,021,971 B2 | 4/2006 | Chou et al. | |
| 7,066,742 B2 | 6/2006 | Liang et al. | |
| 7,069,369 B2 | 6/2006 | Chou et al. | |
| 7,104,848 B1 | 9/2006 | Chou et al. | |
| 7,125,287 B1 | 10/2006 | Chou et al. | |
| 7,165,998 B2 | 1/2007 | Lee et al. | |
| 7,186,147 B1 | 3/2007 | Chou et al. | |
| 7,295,431 B2 | 11/2007 | Chuang | |
| 7,416,419 B2 | 8/2008 | Collantes et al. | |
| 7,418,524 B2 * | 8/2008 | Beasley et al. | 710/2 |
| 7,673,080 B1 | 3/2010 | Yu et al. | |
| 2004/0064559 A1 | 4/2004 | Kupst et al. | |
| 2004/0111668 A1 * | 6/2004 | Cragun et al. | 715/512 |
| 2005/0079738 A1 | 4/2005 | Ahn | |
| 2005/0160223 A1 | 7/2005 | Chen et al. | |
| 2005/0164532 A1 | 7/2005 | Ni et al. | |
| 2005/0181645 A1 | 8/2005 | Ni et al. | |
| 2006/0026348 A1 | 2/2006 | Wallace et al. | |
| 2006/0198113 A1 * | 9/2006 | Lambert et al. | 361/783 |
| 2007/0292009 A1 | 12/2007 | Nguyen et al. | |
| 2008/0046608 A1 * | 2/2008 | Lee et al. | 710/30 |
| 2011/0022769 A1 * | 1/2011 | Hung et al. | 710/313 |
| 2011/0106989 A1 * | 5/2011 | Solomon et al. | 710/63 |
| 2011/0161530 A1 * | 6/2011 | Pietri et al. | 710/14 |

OTHER PUBLICATIONS

Ismail, R., "USB 3.0 Presentation slides At INTEL Developer Forum", San Francisco, Sep. 18, 2007.*

* cited by examiner

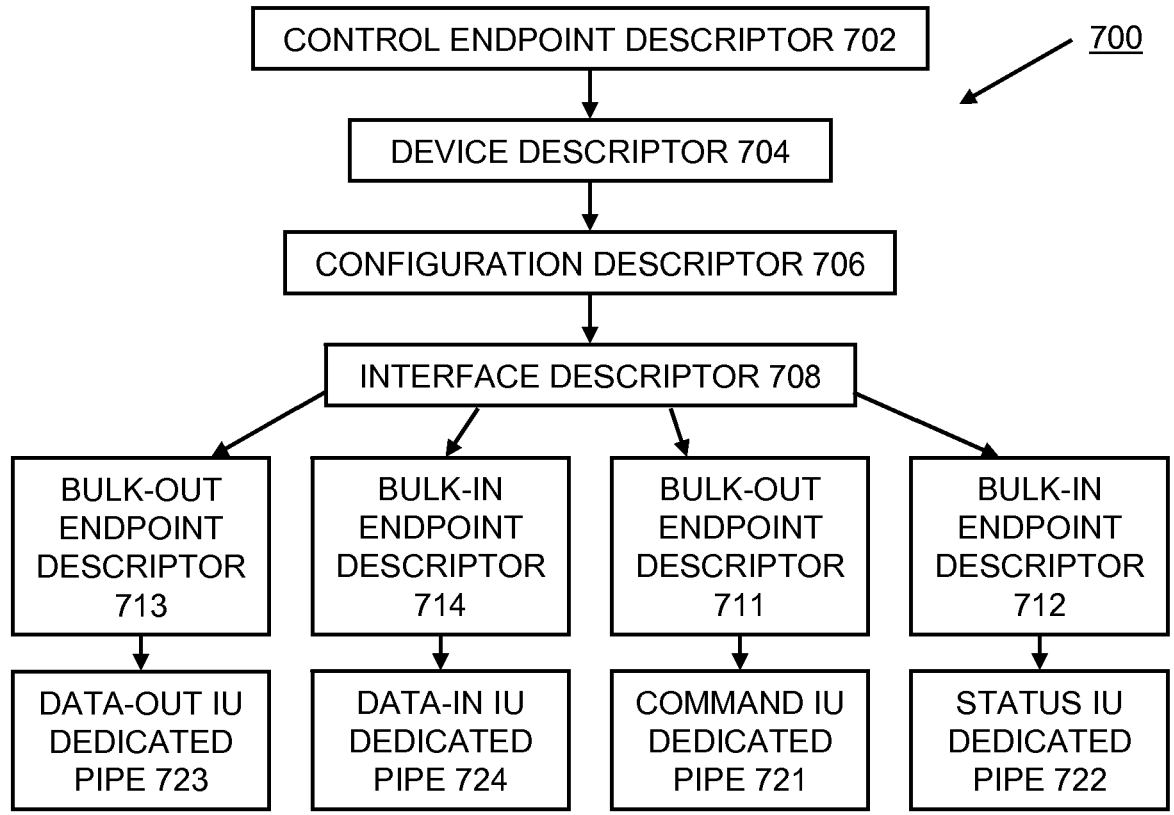

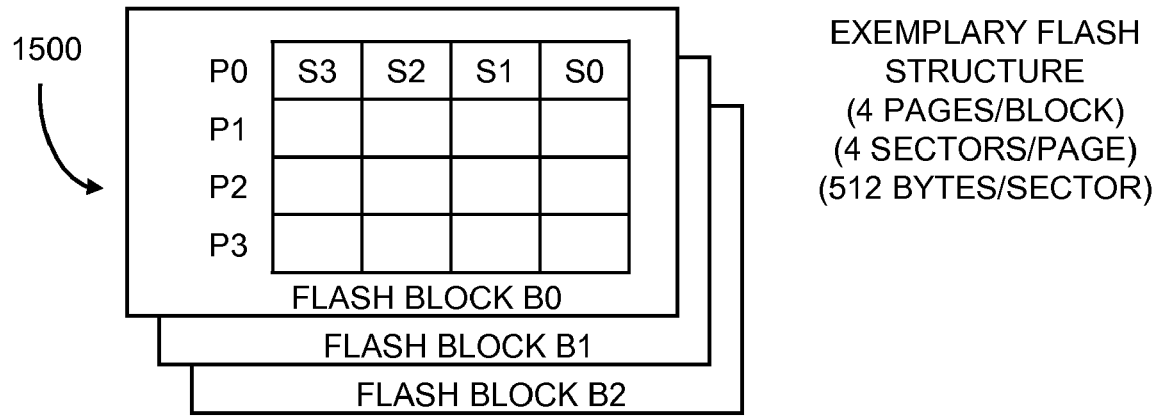
FIG. 15A
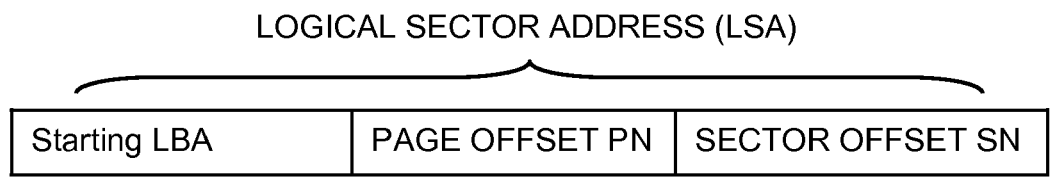
LSA OF (5,3,3) = 5X16+3X4+3 = 95
FIG. 15B
UAS COMMAND QUEUE DATA STRUCTURE
| TAG ID | CMD TYPE | START LSA | SECTOR COUNT | START SECTOR BUFFER POINTER (SID) |
|---|---|---|---|---|
|  |  |  |  |  |
FIG. 15C

PARTIAL OVERLAPPED SECTORS
EXAMPLE 1
FIG. 19A
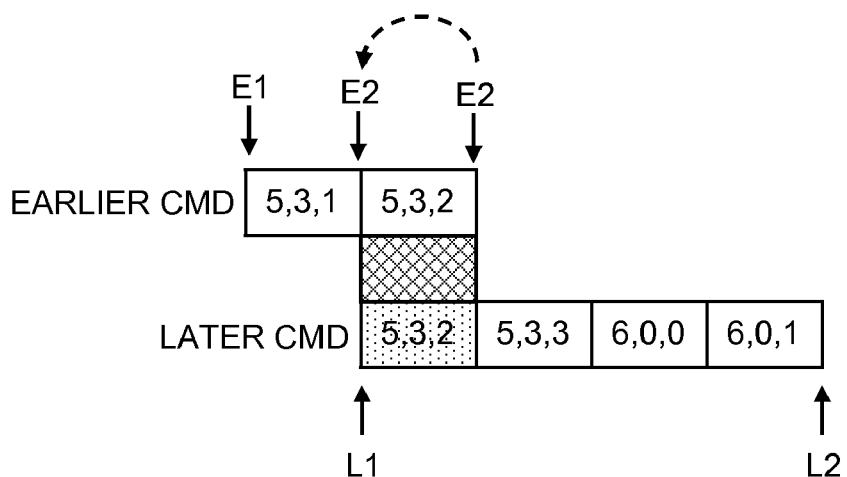
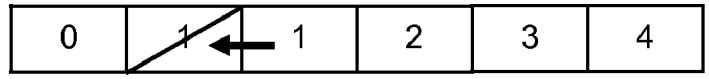
DATA SECTOR BUFFER
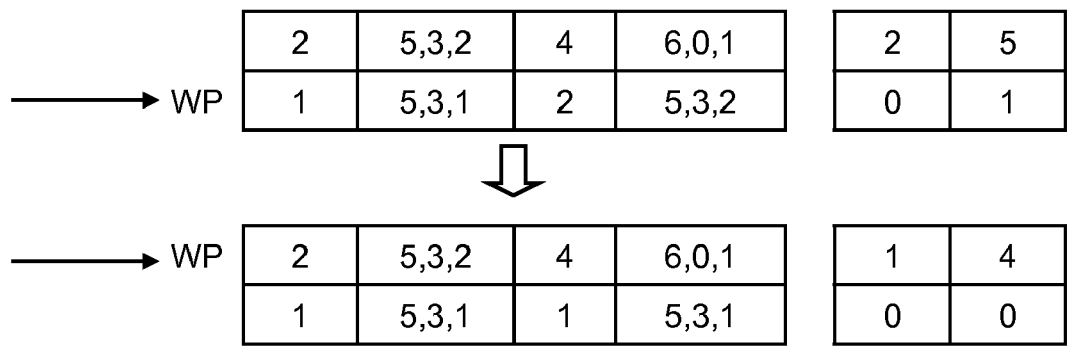

PARTIAL OVERLAPPED SECTORS
EXAMPLE 2
FIG. 19B
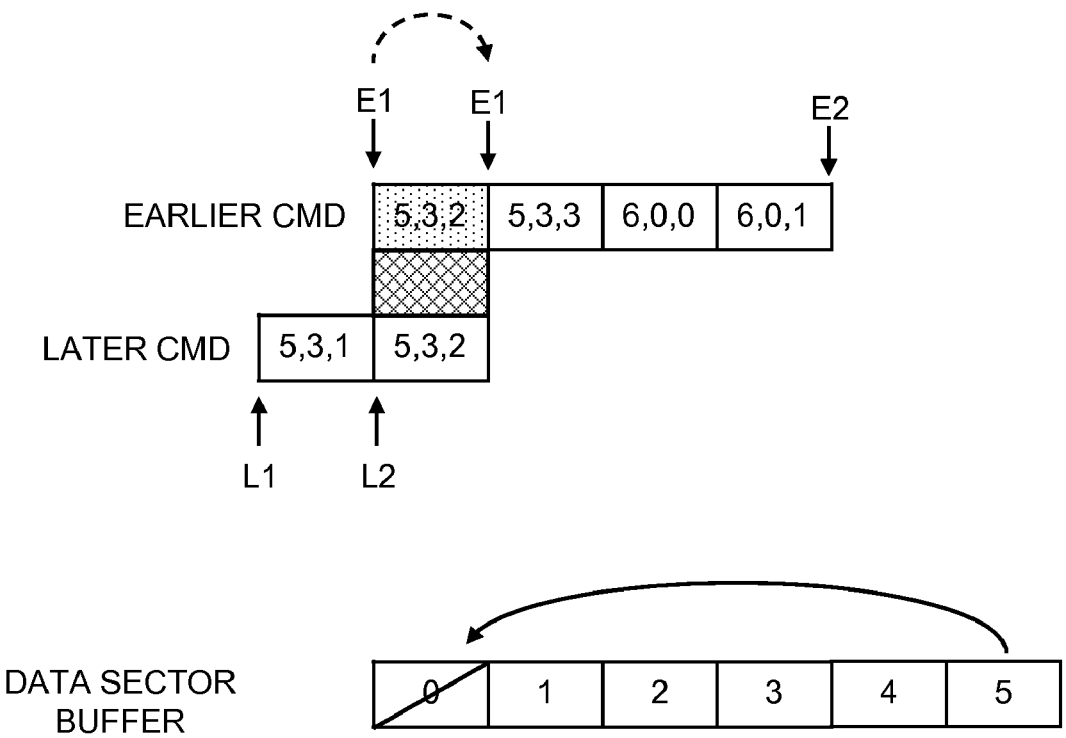
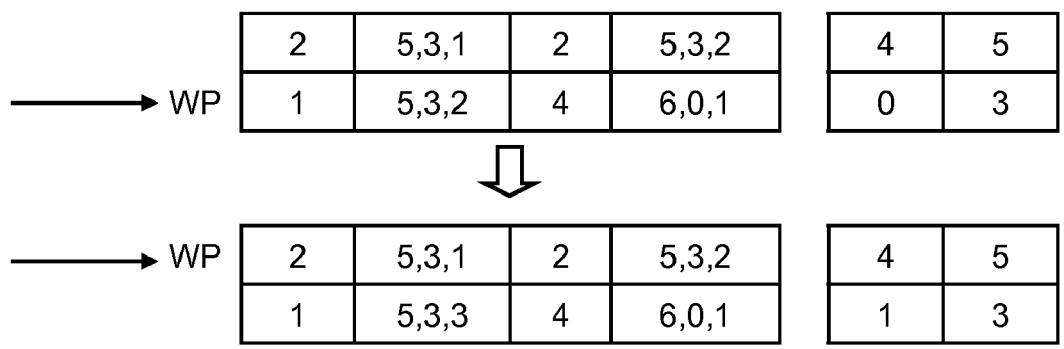

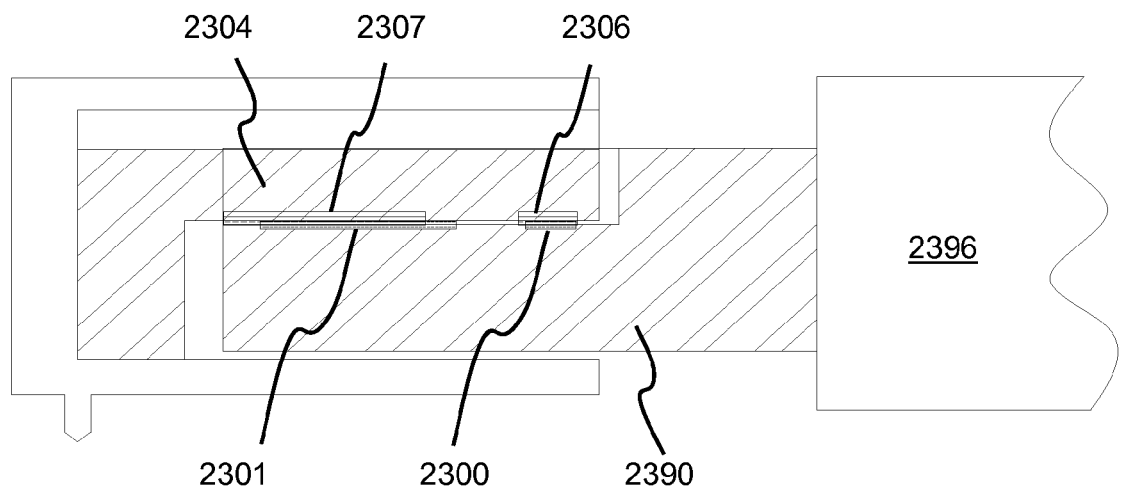
FIG. 23C
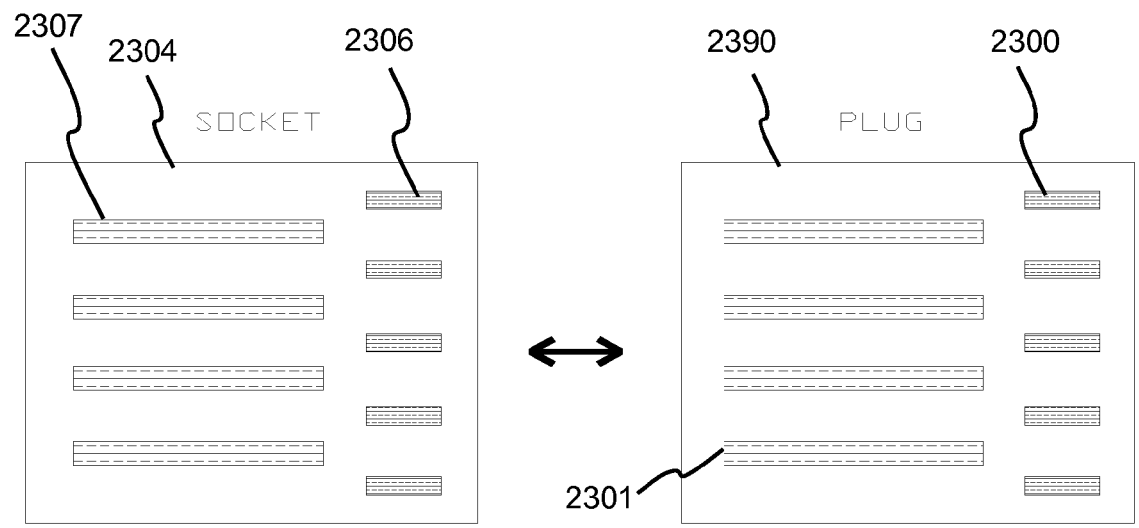
FIG. 23D  FIG. 23E

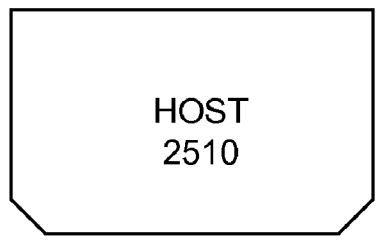
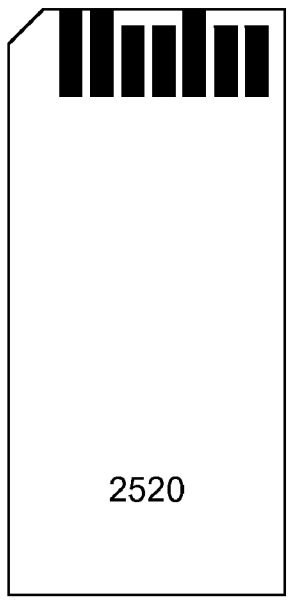
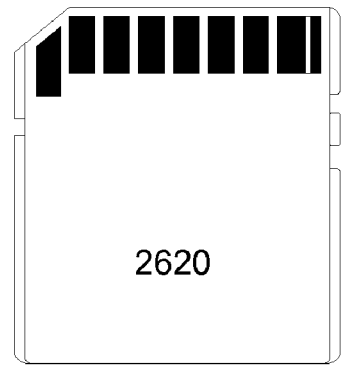
FIG. 26
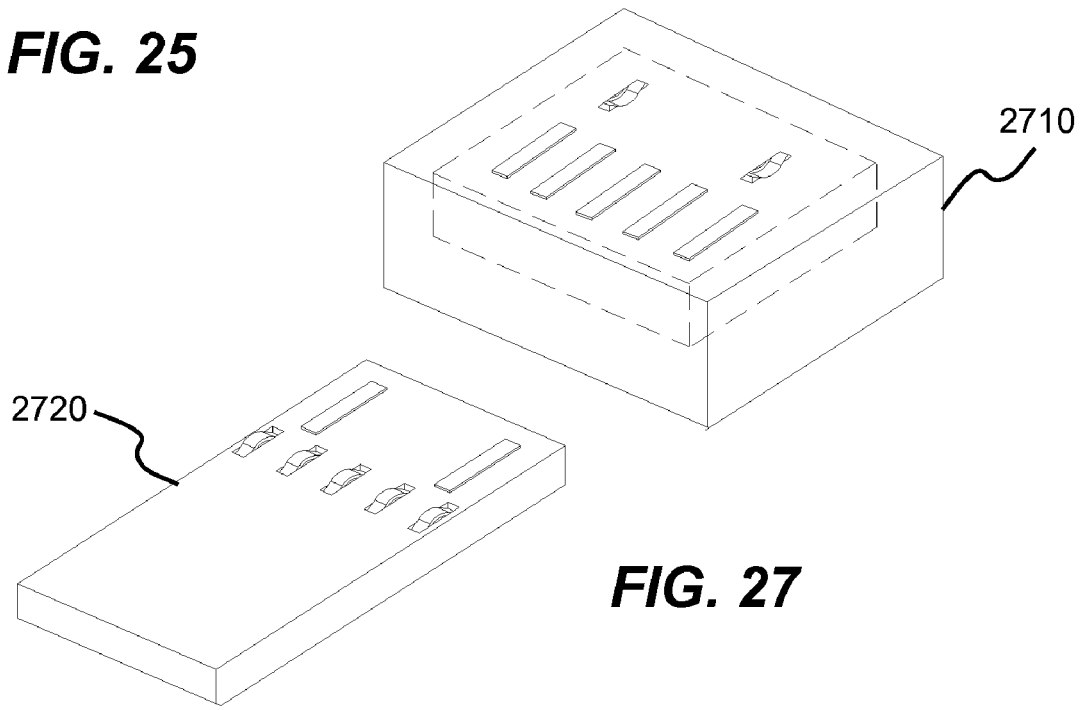
FIG. 25
FIG. 27

METHOD AND SYSTEMS FOR STORING AND ACCESSING DATA IN USB ATTACHED-SCSI (UAS) AND BULK-ONLY-TRANSFER (BOT) BASED FLASH-MEMORY DEVICE

CROSS REFERENCE TO RELATED APPLICATIONS

This application is a continuation-in-part (CIP) of U.S. patent application Ser. No. 12/254,428 for "PCI EXPRESS-COMPATIBLE CONTROLLER AND INTERFACE FOR FLASH MEMORY", filed on Oct. 20, 2008 now U.S. Pat. No. 7,849,242, which is a divisional application of U.S. patent application Ser. No. 10/803,597 for the same title, filed on Mar. 17, 2004, now U.S. Pat. No. 7,457,897.

This application is also a CIP of "EXTENDED SECURE-DIGITAL (SD) DEVICES AND HOSTS", U.S. application Ser. No. 10/854,004, filed on May 25, 2004 now U.S. Pat. No. 7,836,236.

This application is also a CIP of "Flash-Memory System with Enhanced Smart-Storage Switch and Packed Meta-Data Cache for Mitigating Write Amplification by Delaying and Merging Writes until a Host Read" U.S. application Ser. No. 12/576,216, filed on Oct. 8, 2009.

This application is also a CIP of "Secure Flash-Memory Card Reader with Host-Encrypted Data on a Flash-Controller-Mastered Bus Parallel to a Local CPU Bus Carrying Encrypted Hashed Password and User ID" U.S. application Ser. No. 11/623,863 filed on Jan. 17, 2007 now U.S. Pat. No. 7,814,337.

This application is also a CIP of "Dual-Personality Extended USB Plugs and Receptacles Using With PCBA and Cable Assembly" U.S. application Ser. No. 11/876,597, filed on Oct. 22, 2007 now U.S. Pat. No. 7,815,469.

This application is also a CIP of "Low-Power extended USB Flash Device Without Polling" U.S. application Ser. No. 11/925,933, filed on Oct. 27, 2007 now abandoned.

This application is also a CIP of "USB-Attached-SCSI Flash-Memory System with Additional Command, Status, and Control Pipes to a Smart-Storage Switch" U.S. application Ser. No. 12/651,334, filed on Dec. 31, 2009.

This application is a CIP of "Extended COB-USB with Dual Personality Contacts" U.S. application Ser. No. 12/124,081, filed on May 20, 2008 now U.S. Pat. No. 7,872,873.

This application is a CIP of "Extended USB Plug, USB PCBA, and USB Flash Drive With Dual-Personality for Embedded Application with Mother Boards" U.S. application Ser. No. 11/874,767, filed on Oct. 18, 2007.

This application is a CIP of "Extended USB Plug, USB PCBA and USB Flash Drive with Dual-Personality" U.S. application Ser. No. 11/866,927, filed on Oct. 3, 2007.

This application is a CIP of "Backward Compatible Extended USB Plug And Receptacle With Dual Personality" U.S. application Ser. No. 11/864,696, filed on Sep. 28, 2007.

This application is CIP of "Differential Data Transfer for Flash Memory Card" U.S. application Ser. No. 12/608,842, filed on Oct. 29, 2009 now U.S. Pat. No. 7,844,763.

FIELD OF THE INVENTION

This invention relates to flash memory device configured for data storage, more particularly to methods and systems for storing and accessing data in Universal-Serial-Bus-Attached-Small-Computer-System-Interface (USB-Attached-SCSI or UAS) based flash-memory device.

BACKGROUND OF THE INVENTION

With advance of non-volatile memory (e.g., flash memory), attempts have been made to use non-volatile memory as data storage, for example, flash memory drive, solid state drive (SSD), etc. One of the most commonly used interfaces for the non-volatile memory devices is based on a specification referred to as Universal Serial Bus (USB). Not only personal computers have adopted USB as standard method for connecting peripherals, but other devices (e.g., smartphone, video game console, personal digital assistant (PDA) and power cord for charging).

FIG. 1A is a schematic circuit block diagram illustrating an electronic data storage medium disclosed in the parent application. The electronic data storage medium with fingerprint verification capability can be accessed by external computer 109 using input/output interface circuit 105, which may use a USB or similar interface. The electronic data storage medium can be located inside or outside of the external computer 109. Card reader 106 may be attached to external computer 109 or may act as a substitute for external computer 109 through the host computer link 108 with a USB-Attached-SCSI (UAS) bus, which has one set of two pairs of differential serial buses:
  (i) first pair differential serial bus with a first pin carry "+" signal and a second pin carry "−" signal, and;
  (ii) second pair differential serial bus with a first pin carry "+" signal and a second pin carry "−" signal.

UAS protocol is used in conjunction with the latest USB 3.0, which specifies a maximum data transfer rate of five Gigabits/second (Gb/s) via the two pairs of differential serial bus.

Card reader 106 accepts card body 101. The card reader interface can connect with various standard buses including, but not limited to, Secure Digital (SD) bus, Compact Flash (CF) card, Serial ATA (SATA) bus, and Serial SCSI (SAS) bus. Electronic data storage medium packaged in card body 101 includes processing unit 102, memory device 103, security unit 104, and input/output interface circuit 105. Additionally, card reader 106 can connect to the host computer 109 with a link 110 substantially similar to the computer link 108.

Memory device 103 can be a solid state flash memory device rather than a rotational hard disk drive. Using flash memory provides lighter weight, lower power, and more rigidity than the rotational hard drive. Memory device 103 is generally configured for storing data files such as text, video and/or audio files. Data files may need security and encryption/decryption that can be processed by security and encryption/decryption unit 104. Security unit 104 may be configured for AES, IEEE 1667, fingerprint sensor, or other types of security functions, such as encryption and decryption and password verification or management. Processing unit 102 connects to other components and can operate in various modes, such as a programming mode, a data retrieving mode, and a data resetting mode. Power converter 107 can be a DC-DC (direct-current to direct-current) converter that converts from a higher voltage, such as 5 volts, to a lower voltage such as 3.3 or 1.8 volts or some other value that can be used by other units.

Flash memories use non-volatile memory cells such as electrically-erasable programmable read-only memory, (EE-PROM), but are not randomly accessible at the byte level. Instead, whole pages or sectors of 512 bytes or more are read or written together as a single page. NAND flash memory is commonly used for data storage of blocks. Pages in the same block may have to be erased together, and limitations on writing may exist, such as only being allowed to write each page once between erases.

These small portable electronic devices often are able to connect to a host computer such as a personal computer (PC). While a proprietary connector may be used, a connector for a standard expansion bus is preferable. USB is often used to connect such portable flash-memory devices to a PC.

The USB 3.0 bus standard uses two pairs of differential lines that are full-duplexed, or used for transmission in both directions. The older USB 2.0 standard provides that the host, such as the personal computer, controls the bus as the bus master, while USB devices plugged into the host act as slave devices. A USB controller on the host PC generates data transfer transactions and waits for USB devices to respond, either by transmitting requested data to the host, or by writing host data into the USB device's memory.

Often a host system contains several different buses. For example, the host may have a Peripheral Components Interconnect Express (PCIE) bus, a Universal-Serial Bus (USB), an Integrated Device Electronics (IDE) bus, and an AT bus. Peripherals using the Small-Computer System Interface (SCSI) that connect to a host through USB are known as USB-Attached-SCSI (UAS).

Devices to convert one bus type to another bus type are known as bridges. Legacy host systems are not equipped for the newer bus protocols since these legacy systems are older and were designed before the new bus protocols were available. Bridges are often slow since all protocol layers may be present and are traversed. Data packets must flow up through the stack of protocol layers and then back down another stack of protocol layers for the other bus. When multiple bus standards are present on a host system, several bridges may be used in series, causing increased delays for multiple successive format conversions by multiple bridge devices.

FIG. 1B is a block diagram of host with an Enhanced USB (EUSB) receptacle that supports single-mode EUSB communication. EUSB card 111 can be plugged into EUSB receptacle 122 of host 121. Host 121 is an electronic device, for example, a cell phone or a digital camera, etc. EUSB receptacle 122 supports single-mode EUSB communication. Terms, USB, Enhanced USB and USB 3.0 are interchangeably used herein in this document. Unless explicitly stated as USB 2.0, all other references are referred to USB 3.0. Host 121 has a processor system 125 for executing programs such as EUSB management. EUSB protocol processor 124 performs protocol processing such as conversions to EUSB or USB 3.0 over bus 123 for host processor system 125. EUSB card 111 is a EUSB device with a plug that supports EUSB communication. EUSB card 111 has EUSB protocol processor 114 for executing programs including device initializations and bus-response programs. Single-personality bus interface 113 communicates processed data from EUSB protocol processor 114 using the EUSB protocol to its plug 112. Data is ultimately stored in flash memory array 115.

FIG. 1C is a block diagram of a USB UAS card reader with a flash-serial buffer bus 140 in parallel with the CPU bus 138. One or more flash-card controllers 150, 154 connect to both CPU bus 138 and to flash-serial buffer bus 140. When a flash-memory card is inserted, embedded, or surface mounted into 'slot-A' of card reader 190, flash-card controller 154 can transfer data, while when a flash-memory card is inserted into 'slot-B', flash-card controller 154 can transfer data. CPU 180 sends commands over CPU bus 138 to flash-card controllers 150, 154 using their slave ports 151, 155 and CPU master port 185.

Therefore, it would be desirable to have a flash memory device that uses the faster extended modes of operation to take the advantage of additional pipes provided in UAS and USB 3.0.

BRIEF SUMMARY OF THE INVENTION

This section is for the purpose of summarizing some aspects of the present invention and to briefly introduce some preferred embodiments. Simplifications or omissions in this section as well as in the abstract and the title herein may be made to avoid obscuring the purpose of the section. Such simplifications or omissions are not intended to limit the scope of the present invention.

Methods and systems for storing and accessing data in UAS based flash memory device are disclosed. According to one aspect of the present invention, a UAS based flash memory device is configured for storing data in accordance with the UAS/USB 3.0 standard. UAS based flash memory device comprises a non-volatile memory controller and a plurality of non-volatile memory arrays (e.g., flash memory). Controller is configured for connecting to a UAS host via a physical layer (e.g., plug and wire based on USB 3.0) and for conducting data transfer operations via two sets of logical pipes. Controller further comprises a random-access-memory (RAM) buffer configured for enabling parallel and duplex data transfer operations through the sets of logical pipes. In addition, a Smart Storage Switch configured for connecting multiple non-volatile memory devices is included in the controller. Finally, a security module/engine/unit is provided for data security via user authentication data encryption/decryption of the EUSB device.

According to another aspect, UAS based host uses a UAS based flash memory device as data storage. Specifically, UAS based host is configured with multiple data communication layers—physical, data link, protocol, transport and application. Physical layer is so configured that a USB 3.0 based connector can be used. Similarly protocol layer is in compliance with the USB 3.0 standard.

According to yet another aspect, logical pipes are configured as data-in, data-out, command and status pipes. Data transfer operations are sent from EUSB host as information unit (IU) with a specific tag number. Upon receiving the IU, EUSB device determines whether corresponding logic pipe is available. If so, physical flash memory channels are checked to ensure the data transfer operations can be performed. Multiple commands are kept in a queue and corresponding data sector buffer in the EUSB device's controller. Data update commands (e.g., write, erase/trim) are reordered and regrouped in the queue to increase the efficiency of overall data transfer operations when data ranges of data update commands overlap each other. Parallel data transfer operations are conducted with logical memory unit (e.g., unit having a different logical unit number (LUN). Each logical memory unit can be homogeneous or heterogeneous. A Smart Storage Switch is configured for accommodating such parallel operations.

According to yet another aspect, connection between physical layer of a host and that of a flash memory device is an optical link (e.g., fiber optics). In order to transmit data signals through lights via the optical link, respective optical transceivers are included in the host and the device. Optical transceiver comprises a complementary pair of photo/light diodes that converts light to electrical signal or vice versa.

According to yet another aspect, security module/engine/ unit in the EUSB device's controller is configured for authenticating user of the device. To enable such feature, the EUSB device is manufactured with at least two partitions in its flash memory arrays, one for storing public data with another for storing read-only files that triggers an automated authentication procedure. For example, the read-only partition is formatted as Compact Disc File System (CDFS) with "autorun.inf" file stored thereon. Upon detecting the CDFS partition after the EUSB device is connected to EUSB host, an authentication session starts in accordance with instructions set forth in "autorun.inf". Within the authentication session, a number of scenarios are conducted. In one example, user is prompted to create password to be stored for future verification, when the device is accessed first time. In another, a user is prompted to enter a password to be compared with the stored password, when the device has been accessed before. Also, the authentication session can allow user to change the stored password with certain protective procedures. Only authenticated user is allowed to store and access the data to and from the device. Authentication can be set up to fool proof data security by allowing user to enter password with limited number of attempts. Content of the device would be erased with no possibility to access, when the number of attempts has exceeded a predefined limit, for example, ten consecutive incorrect password tries.

According to yet another aspect, EUSB host does not poll EUSB device because EUSB host relies on status received over the status pipe of the EUSB device to determine whether there is any data or command being transferred.

Other objects, features, and advantages of the present invention will become apparent upon examining the following detailed description of an embodiment thereof, taken in conjunction with the attached drawings.

BRIEF DESCRIPTION OF THE DRAWINGS

These and other features, aspects, and advantages of the present invention will be better understood with regard to the following description, appended claims, and accompanying drawings as follows:

FIG. 7A is a schematic diagram showing EUSB pipes;

FIG. 7B is a diagram showing specifications of fields of UAS information unit (IU);

FIGS. 15A-15D shows data structures used in a flash memory device;

FIGS. 19A-19B collectively shows examples of compacting partially overlapped data sectors;

FIGS. 23A-23I collectively show EUSB connectors and sockets having metal contact pins on just one of the surfaces of the pin substrates;

FIG. 25 is a structural diagram showing connectors of an exemplary COB (Chip-on-Board) USB drive;

FIG. 26 is a structural diagram showing connectors of a Secured Digital Card; and FIG. 27 is a diagram showing a receptacle and a connector having only high speed USB 3.0 connector pins.

DETAILED DESCRIPTION

In the following description, numerous details are set forth to provide a more thorough explanation of embodiments of the present invention. It will be apparent, however, to one skilled in the art, that embodiments of the present invention may be practiced without these specific details. In other instances, well-known structures and devices are shown in block diagram form, rather than in detail, in order to avoid obscuring embodiments of the present invention.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments mutually exclusive of other embodiments. Further, the order of blocks in process flowcharts or diagrams representing one or more embodiments of the invention do not inherently indicate any particular order nor imply any limitations in the invention.

Embodiments of the present invention are discussed herein with reference to FIGS. 2A-22D. However, those skilled in the art will readily appreciate that the detailed description given herein with respect to these figures is for explanatory purposes as the invention extends beyond these limited embodiments.

Figure 1A:
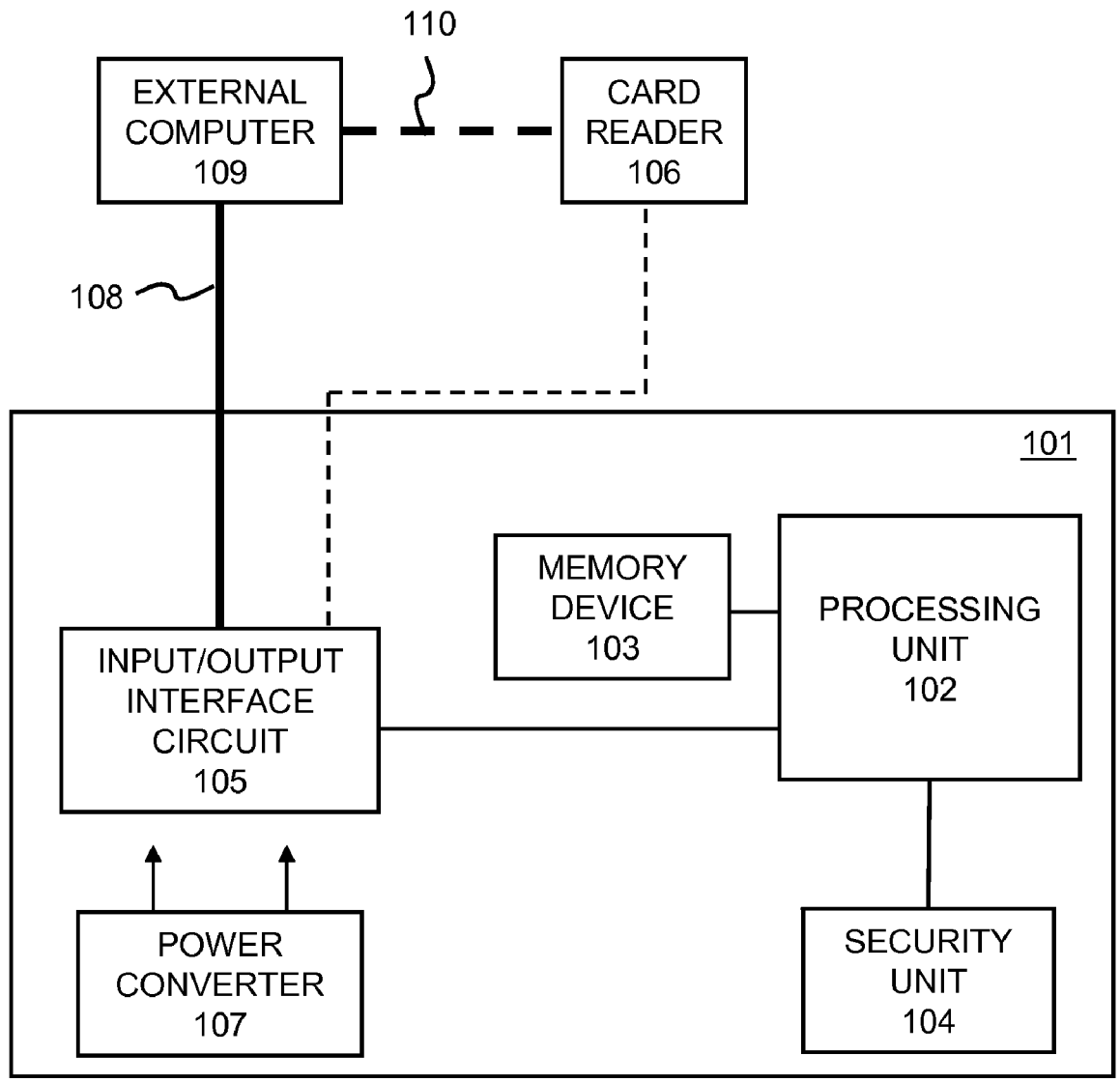
FIG. 1A is a schematic circuit block diagram illustrating an electronic data storage medium.
Figure 1B:
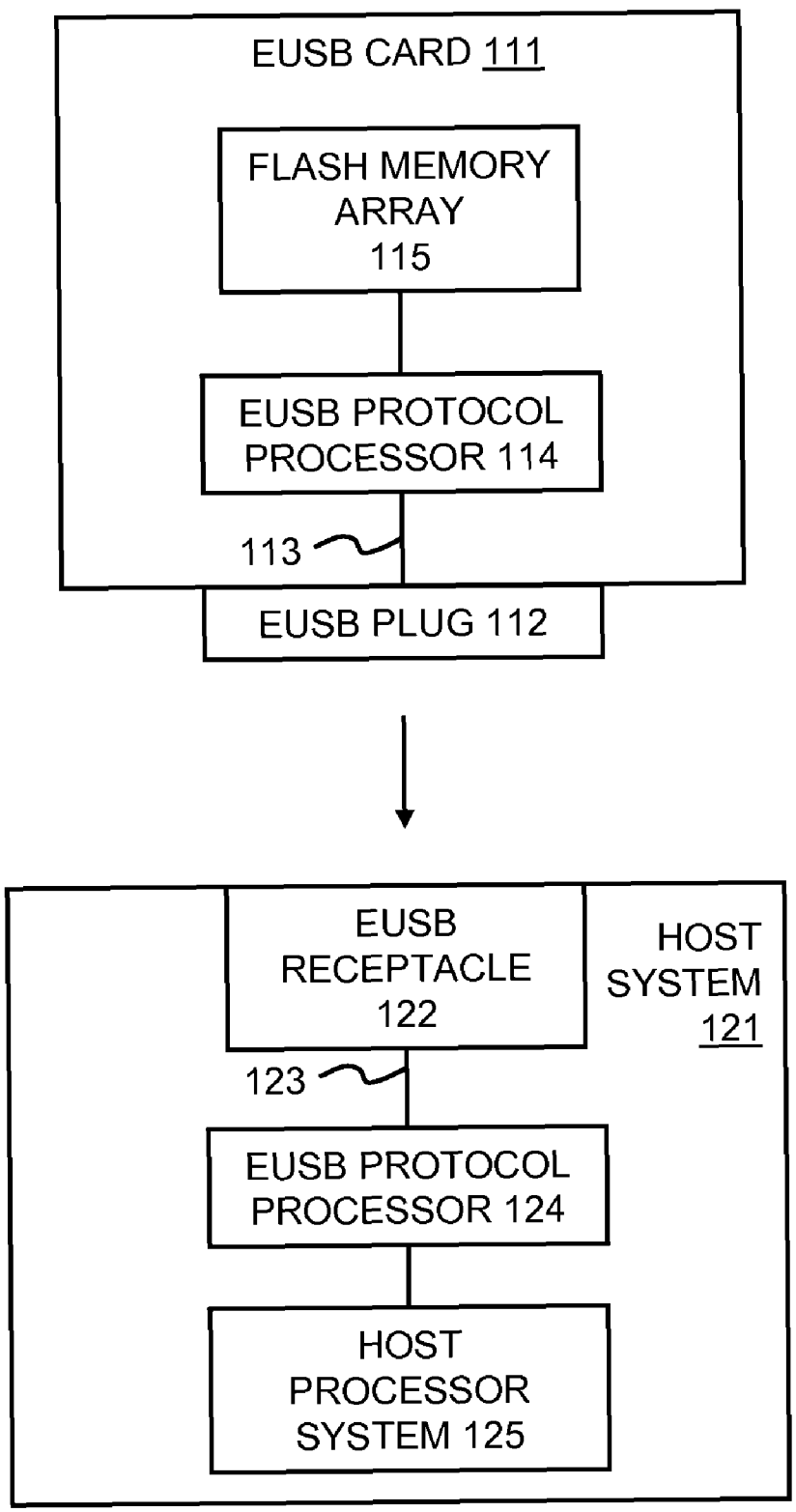
FIG. 1B is a block diagram of host with a EUSB receptacle that supports single-mode EUSB communication.
Figure 1C:
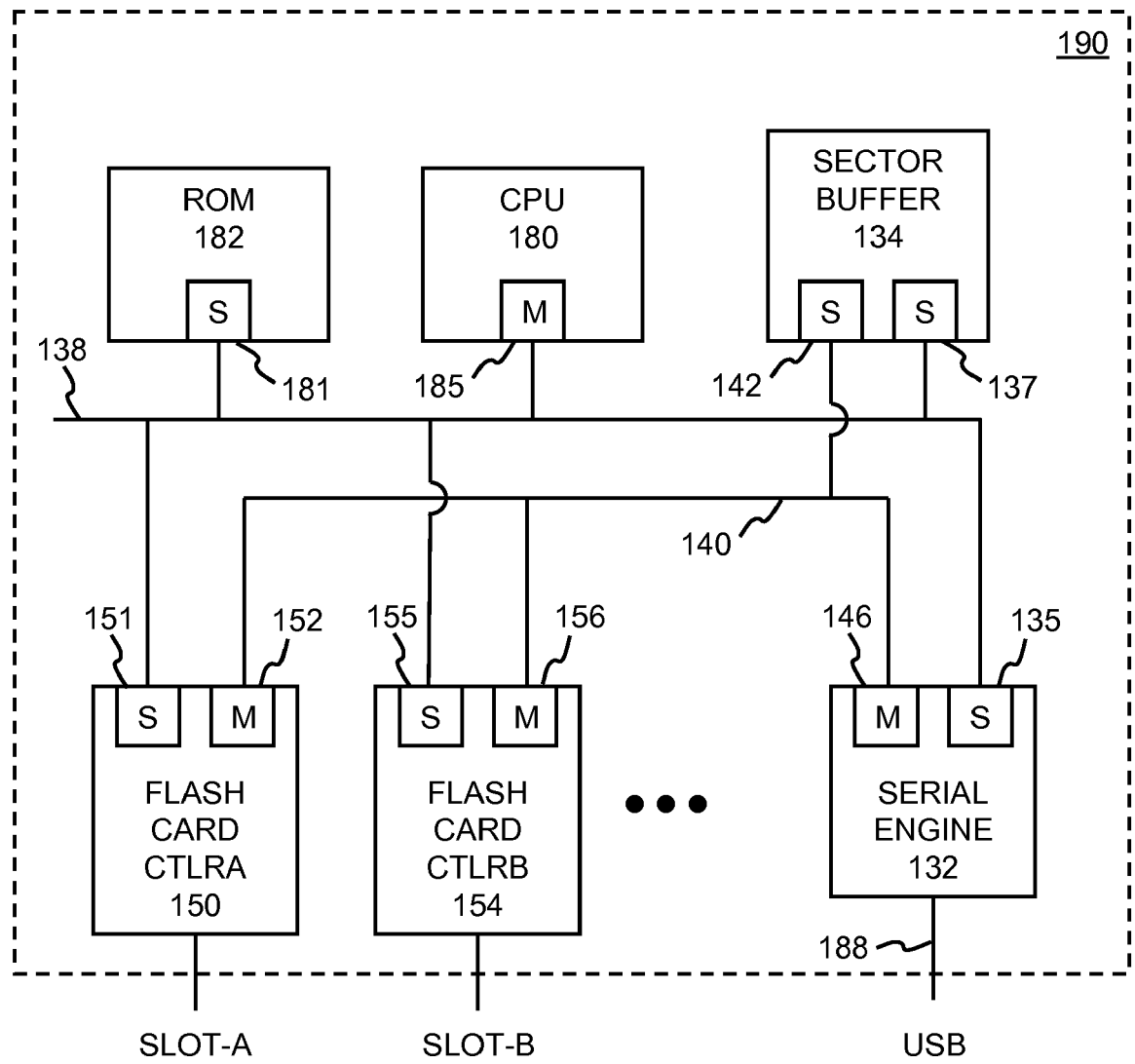
FIG. 1C is block diagram of a UAS card reader with a flash-serial buffer bus in parallel with the central processor unit bus.
Figure 2A:
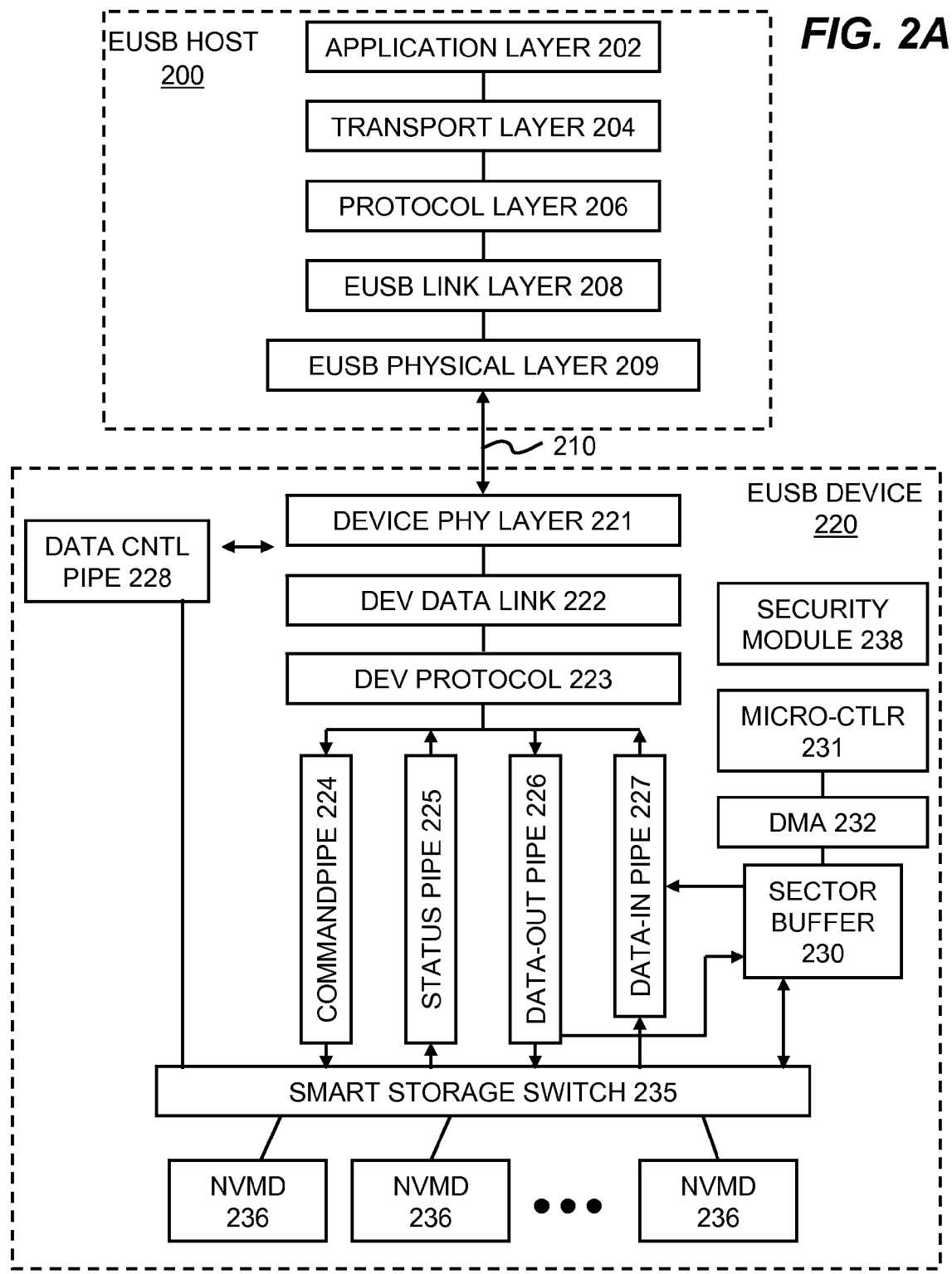
FIG. 2A is block diagram showing an EUSB device connected to an EUSB host in accordance with UAS/USB 3.0 standard.

Referring first to FIG. 2A, it is shown EUSB host 200 connected to EUSB device 220. EUSB host 200 comprises a plurality of layers configured for data transfer operations including application layer 202, transport layer 204, protocol layer 206, EUSB link layer 208 and EUSB physical layer 209.

Application layer 202 is configured for sending out information units for various data transfer operations. For example, when an application program (part of application layer 202) needs to read data stored in flash memory array on EUSB device 220, application layer 202 sends a data-read request to a device driver for the flash on transport layer 204, which activates EUSB Bulk-Only-Transfer (BOT) and UAS command on the protocol layer 206. A read command is embedded inside a EUSB data payload and header using BOT mode of USB. A cyclical-redundancy-check (CRC) checksum is also attached.

EUSB link layer 208 adds a sequence number (e.g., tag ID) and another CRC checksum, while EUSB physical layer 209 adds packet framing and performs 8- or 10-bit encoding. The framed data packet is sent from the host 200 to EUSB device 220 via the USB cable 210, which is either a twisted pair of wires under the USB 2.0 specification, or two sets of twisted pair of differential serial buses under the USB 3.0. First pair of differential serial bus is for R+ and R− pins of the EUSB connector, while the second pair for T+ and T− pins.

Device physical layer 221 of EUSB device 220 senses the data transmission from the USB cable 210, extracts the clock and sends serial data to device data link 222, which generates parallel data words. The parallel data words are examined by frame and packet detector of device protocol 223 to local frame and packet boundaries. The header and data payload are located and determined to be transported via corresponding one of the logical pipes (i.e., command pipe 224, status pipe 225, data-out pipe 226 or data-in pipe 227). These logical pipes are defined by data control pipe 228 in conjunction with IU received in device physical layer 221.

EUSB device 220 further comprises a microcontroller or processor 231, a direct memory access (DMA) engine 232 and a random-access-memory (RAM) buffer 230. Microcontroller 231 examines the headers and data payloads received and detects the read command. Then microcontroller 231 activates flash interface (e.g., Smart Storage Switch 235) to perform a read of data stored on flash memory arrays or NVMD 236. The flash data read is transferred to data sector buffer 230, which is configured for temporarily holding the data payloads (in forms of data sectors) for the data transfer commands. DMA engine 232 is included for more efficient data access than microcontroller 231 alone.

Furthermore, EUSB device 220 comprises a security module/engine/unit 238 that may perform data encryption/decryption to ensure data security. Another function of the security module 238 is to ensure data can only be accessed by authorized users. For example, a high-security device can be achieved by enforcing standard such as Advanced Encryption Standard (AES) 128/192/256 or IEEE 1667. To enable an automated authentication process that requires password to access the stored data, the EUSB device 220 is manufactured in a specific manner such that an automated authentication procedure would embark when connected to a host. And the device 220 can format itself to make its content unreadable after too many incorrect password attempts have been made (e.g., ten consecutive tries).

Although the example used in describing FIG. 2A is a data transfer operation for reading data from the flash memory, there is no limitation in the present invention as to which other types of data transfer operations (e.g., writing, erasing, etc.).

Figure 2B:
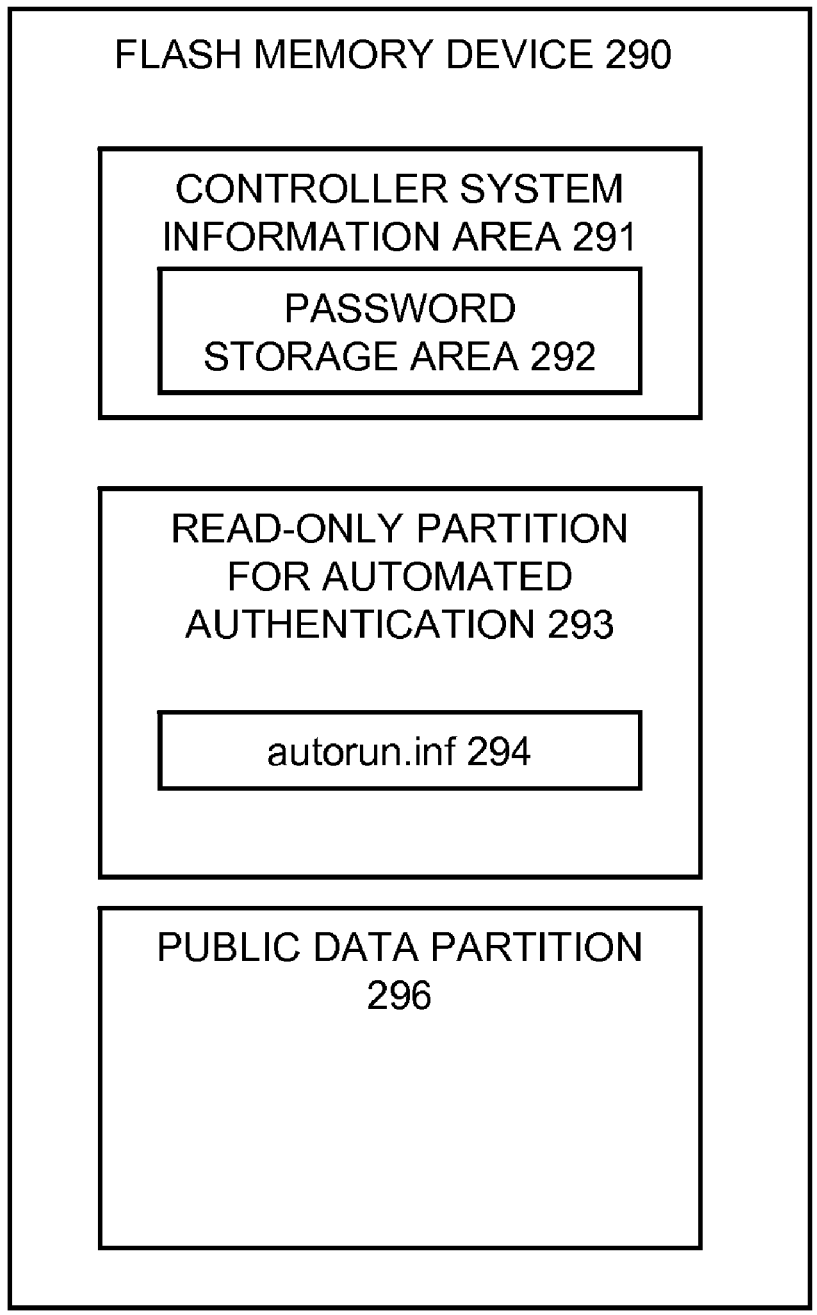
FIG. 2B is a block diagram showing a flash memory device with two partitions.

FIG. 2B is a block diagram showing an exemplary data structure of a high-security flash memory device 290. High-security flash memory device 290 in configured to include a password storage area 292 within a controller system information area 291, and at least two partitions: a public data partition 296 and a read-only partition 293 for data security. The public data partition 296 is designed for storing user data, while the read-only partition 293 is for supporting automated authentication process. In one embodiment, the read-only partition is formatted with Compact Disk File System (CDFS) with an "autorun.inf" file stored thereon. Upon detecting the CDFS partition after the EUSB device 290 is connected to EUSB host, an authentication session starts in accordance with instructions set forth in "autorun.inf".

Exemplary process 240 shown in FIG. 2B is configured for manufacturing such high-security flash memory device 290 shown in FIG. 2A. Process 240 starts by creating at least two partitions in the flash memory arrays at step 242. Next, one of the partitions is made read-only by formatting with CDFS ISO 9660 on its master boot record (MBR) at step 244. Finally, at step 246, an instruction file "autorun.inf" for the automated authentication process is stored into the CDFS partition before process 240 ends. Although this example uses specific file system CDFS and "autorun.inf", other equivalent software mechanisms for prompting an automated authentication session upon connection of an EUSB device in a host can be used instead.

Figure 2C:
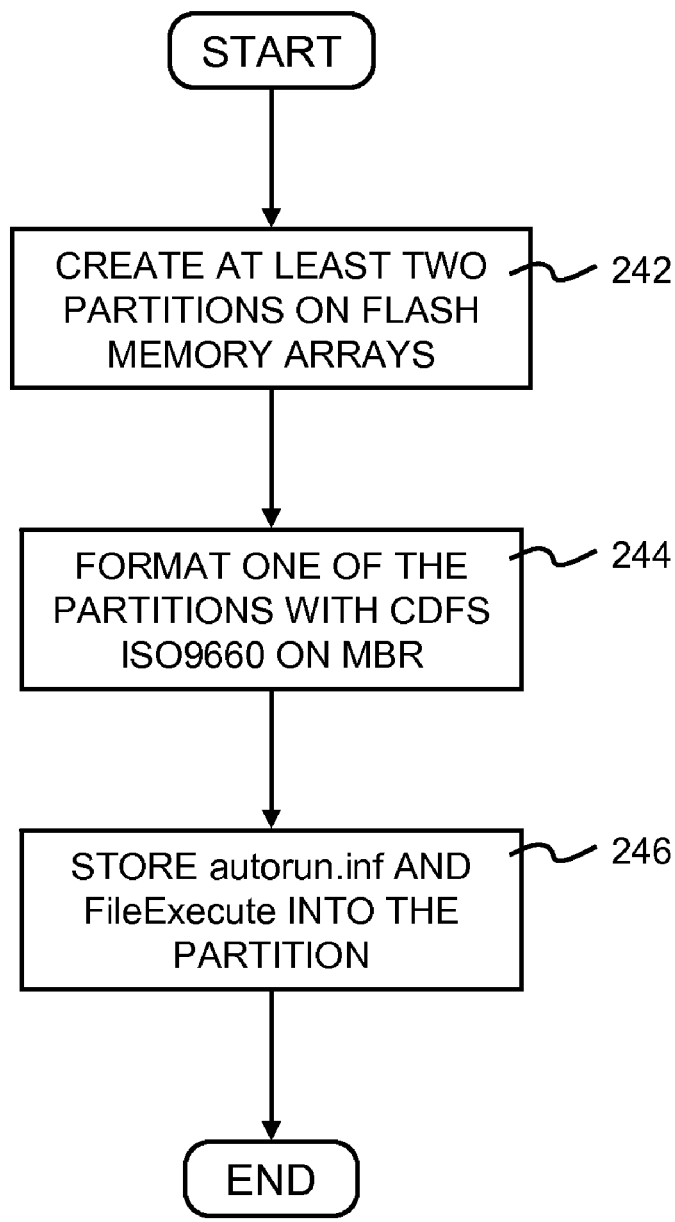
FIG. 2C is a flowchart illustrating a process of manufacturing a flash memory device with multiple partitions configured thereon.
Figure 2D:
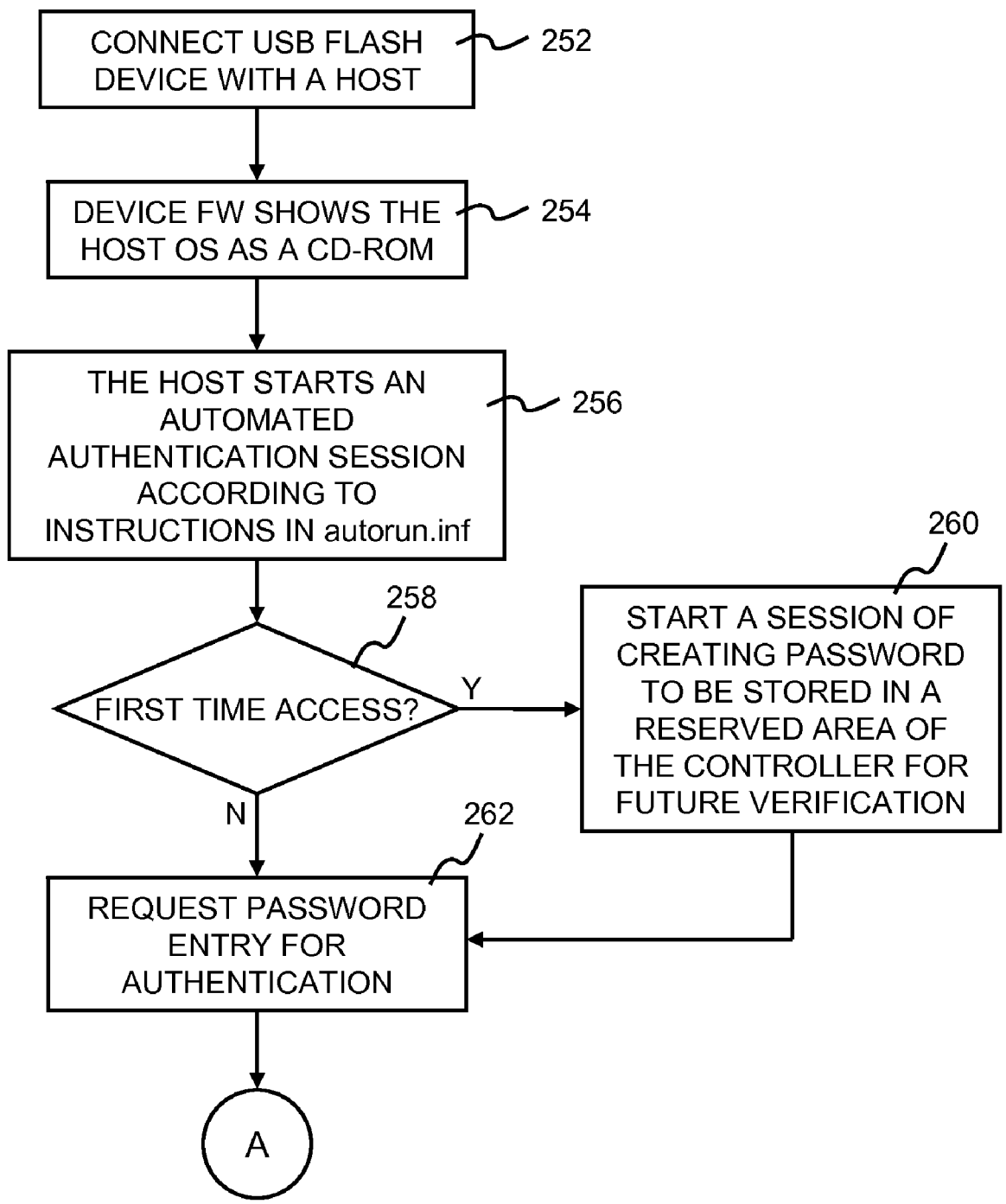
FIGS. 2D-2E collectively is a flowchart illustrating a process of authenticating a user of the flash memory device manufactured by the process shown in FIG. 2C.
Figure 2E:
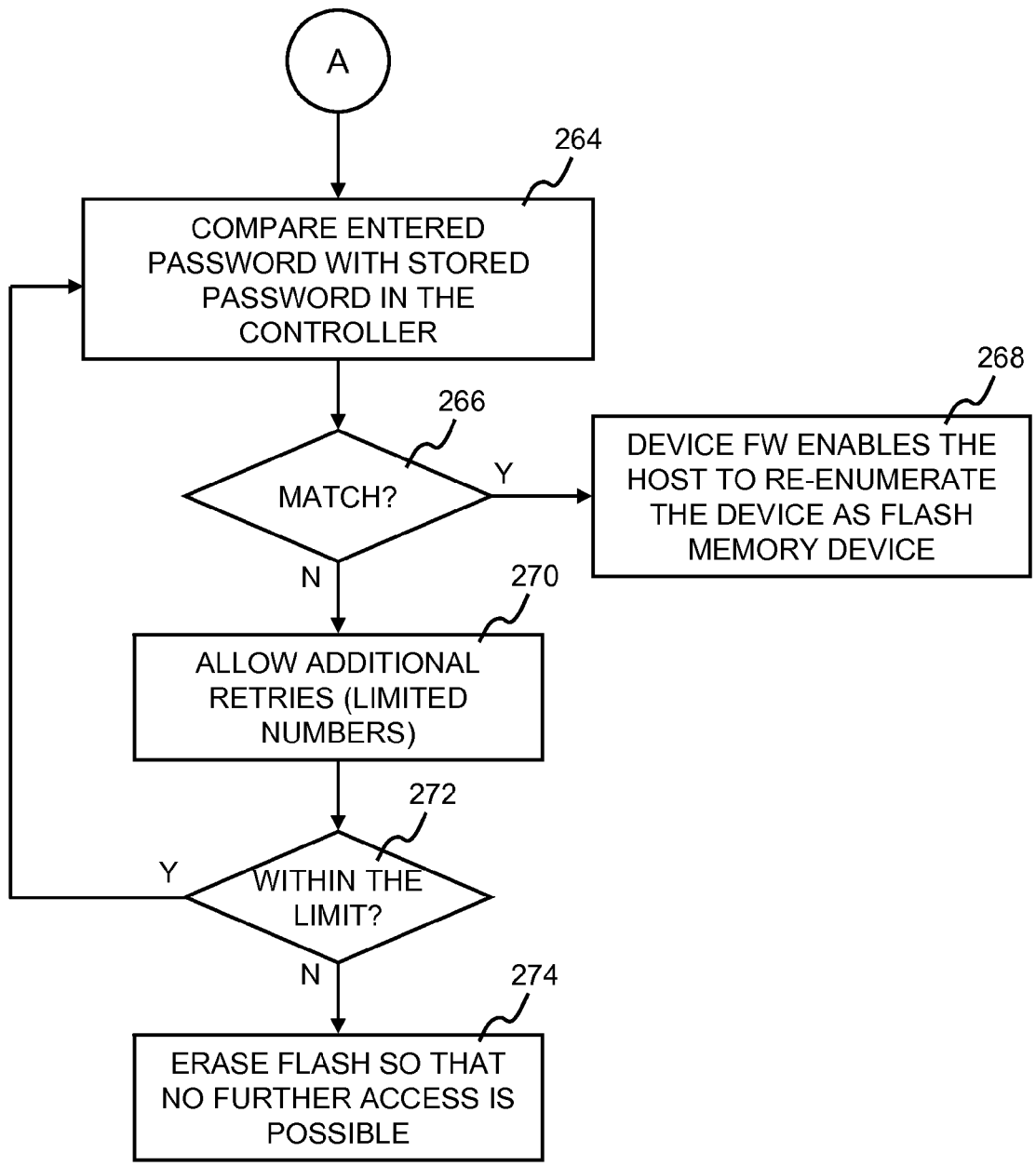

FIGS. 2C-2D collectively is a flowchart showing an exemplary process 250 of authenticating user of a flash memory device in an automated authentication procedure. Process 250 starts by connecting a flash memory device to the host at step 252 (e.g., plug a USB based device into a USB receptacle). Nest, at step 254, the device's firmware (FW) shows that the device as a compact disk read only memory (CD-ROM) to the host's operation system (OS). For example, the flash memory device manufactured in accordance with process 240 of FIG. 2B would be considered as a CD-ROM due to its CDFS partition. Then, at step 256, the host starts an automated authentication session by running an authentication program or script based on the instructions set forth in the instruction file (e.g., "autorun.inf"). In one embodiment, a pop-up window opens to prompt user for entering a password before allowing data access.

Next, at decision 258, it is determined whether the flash device is first time being accessed. If yes, process 250 following the "Y" branch to step 260. An automated authentication session starts by requiring user to create a password. The password must meet certain standard (e.g., AES 128/192/256 or IEEE 1667) to achieve high-security. Once the user created a password, it is stored in a reserved system area 292 in the controller for future verification (see FIG. 2B). Next, at step 262, the user is prompted right away to enter a password that is just created and stored at step 262.

If no at decision 258, process 250 follows the "N" branch to step 262. User is requested to enter a password to be verified with the stored password. The user entered password is compared with the one stored at step 264 to determine whether they match at decision 266. If so, process 250 moves to step 268, which allows the user to store and access data in the flash memory arrays. In order to do so, the host would have to re-enumerate the device from the read-only partition (as CD-ROM) to the public data partition.

If not matched at decision 266, process 250 moves to step 270 allowing user to reenter password. Next, at decision 272, it is determined how many attempts the user has tried to authenticate. If the number of attempts has exceeded a predefined limit (e.g., ten (10)), then process 250 moves to step 274 to erase the contents to ensure no further access is possible for this device, or other equivalent measures that severally restrict the access. Otherwise, process 250 moves back to step 264 until either a correct password is entered thus granting access or the predefined limit has reached thereby denying the access.

Figure 3A:
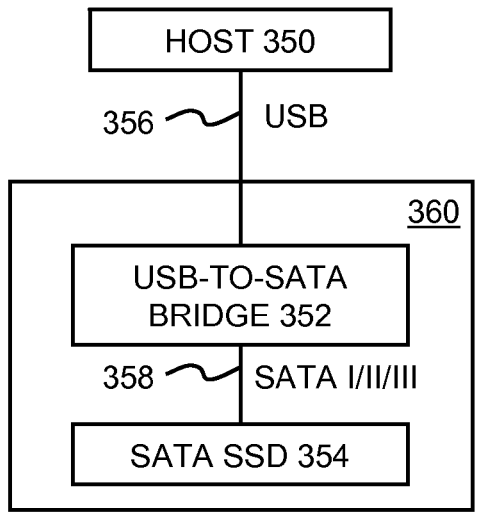
FIG. 3A is a diagram showing a host using a USB-TO-SATA bridge to access a SATA based solid state drive (SSD)

FIG. 3A shows a host 350 using a USB-to-SATA bridge 352 to access a SATA SSD 354. Host 350 uses USB 3.0 or USB 2.0 to communicate over USB physical link 356 to peripheral device 360. Peripheral device 360 stores data in SATA SSD 354. USB-to-SATA bridge 352 converts USB commands and data received over USB physical link 356 to SATA commands and data that are sent over SATA bus 358 to SATA SSD 354. SATA bus 358 can support Serial AT-Attachment (SATA) I, which operates at 1.5 Gbps, SATA II, which operates at 3 Gbps, and SATA III, which operates at 6 Gbps. SATA SSD 354 can be a SCSI drive, allowing host 350 to use a UAS mode or protocol for USB-Attached-SCSI (UAS). Alternately, Serial-Attached SCSI (SAS) may be used. Bridge 352 can be a USB-TO-SAS BRIDGE, bus 358 can be a SAS interface and SSD 354 can be SAS SSD.

Figure 3B:
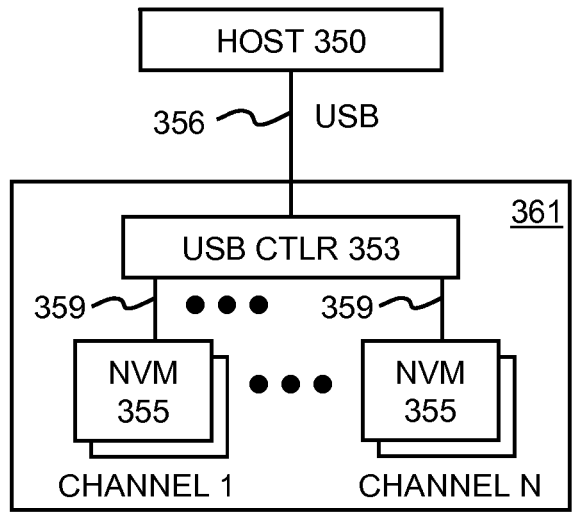
FIG. 3B is a diagram showing a host using a USB controller to access a non-volatile memory device (NVMD)

FIG. 3B shows a host 350 using a USB controller 353 to access NVM 355. Host 350 uses USB 3.0 or USB 2.0 to communicate over USB physical link 356 to peripheral device 361. Peripheral device 361 stores data in NVM 355 that are organized into two or more channels for simultaneous or overlapping access in order to increase throughput. USB controller 353 converts USB commands and data received over USB physical link 356 to flash commands and data that are sent over flash buses 359 to NVM 355. Data are mapped to the multiple channels of NVM 355 by USB controller 353 or by mapping logic (not shown).

Figure 3C:
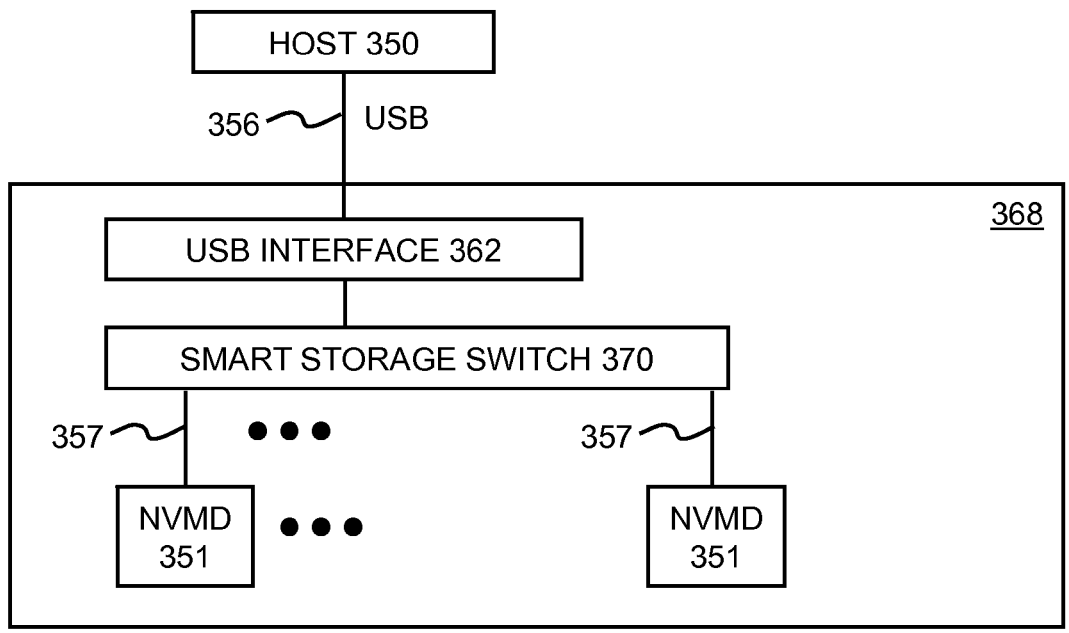
FIG. 3C is a diagram showing a host using a Smart Storage Switch to access multiple NVMDs.

FIG. 3C shows a host 350 using a Smart Storage Switch 370 to access multiple NVM Devices (NVMDs) 351. Host 350 uses USB 3.0 or USB 2.0 to communicate over USB physical link 356 to peripheral device 368. Peripheral device 368 stores data in multiple NVMD 351. USB interface 362 converts USB commands and data received over USB physical link 356 to SATA commands for Smart Storage Switch 370 and data that are sent over buses 357 to NVMD 351.

Smart Storage Switch 370 maps the data to multiple NVMDs 351 and overlaps accesses to improve throughput.

Figure 4A:
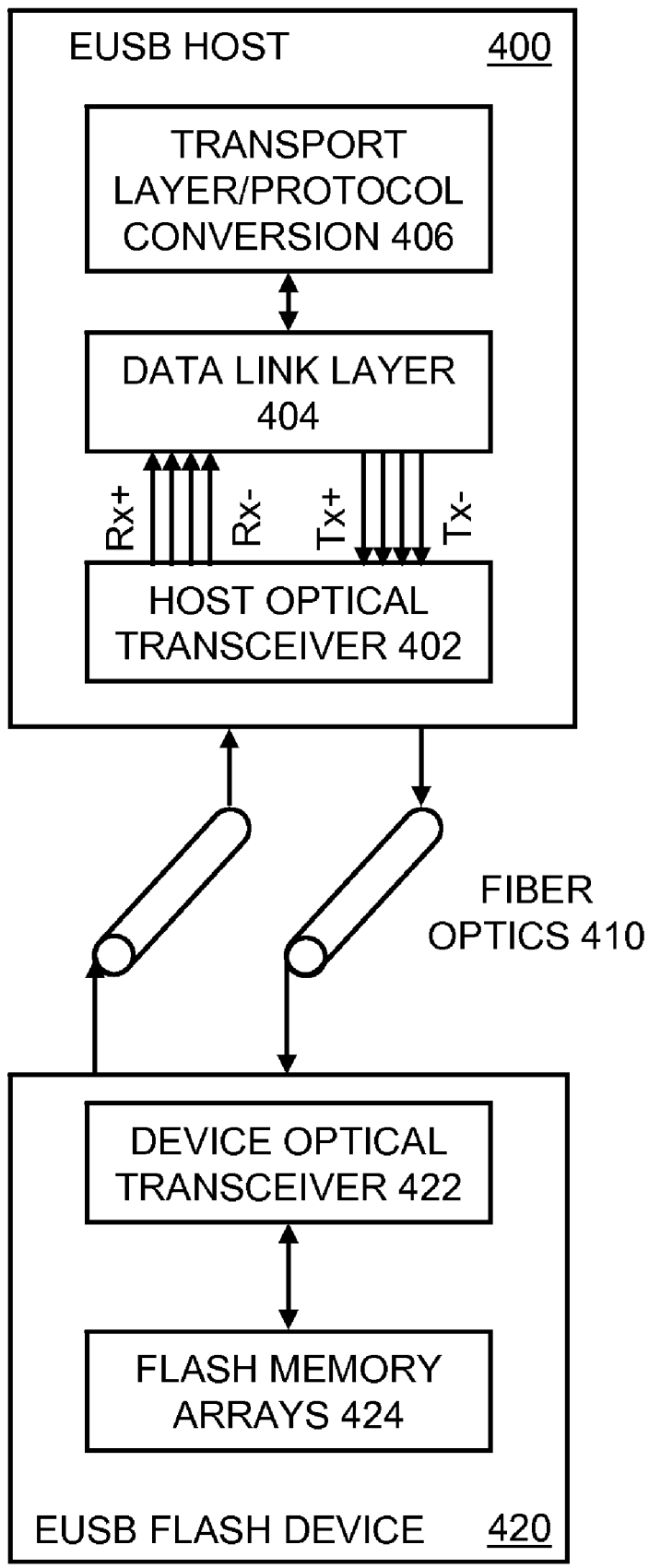
FIG. 4A is a diagram showing an EUSB host connected to an EUSB device via an optical link.

FIG. 4A shows EUSB host 400 connected to EUSB flash memory device 420 via an optical link (fiber optics 410). EUSB host 400 comprises a host optical transceiver 402, a data link layer 404 and a transport/protocol converter 406. Optical transceiver 402 is configured for converting injecting light/laser pulses to incoming electronic data signals and for converting outgoing electronic data signals to emitting light/laser pulses. Data link layer 404 is for inserting a sequence number such as tag number or ID into a header and/or trailer to the data payload, while transport/protocol converter 406 ensures desired protocol is embedded in the data signals (e.g., UASP, USB 3.0). EUSB device 420 comprises a device optical transceiver 422, a controller (not shown), and flash memory arrays 424. Device optical transceiver 422 provides substantially similar functions of the host optical transceiver 402. The two transceivers are configured for providing complementary functions (send and receive). Instead of traditional copper wiring, optical cable 210 is the physical medium facilitated for transmitting data between EUSB host 400 and EUSB flash memory device 420. Similarly, communications between silicon devices can utilize optic fiber for transmission instead of copper wires for the purpose of higher speed and bandwidth provided by optical fiber which can be made either of silica or some other materials, such as fluorozirconate, fluoroaluminate, and chalcogenide glasses.

Figure 4B:
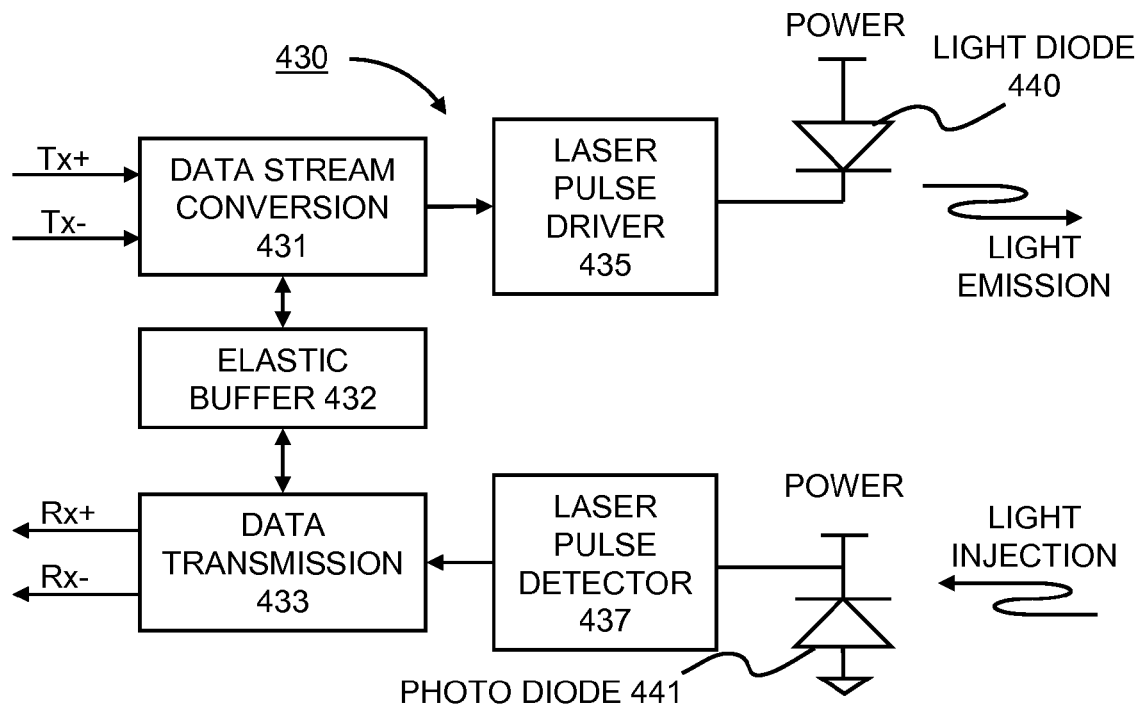
FIG. 4B is a block diagram showing salient components of an exemplary optical transceiver.

FIG. 4B is a block diagram showing salient components of an exemplary optical transceiver 430. Optical transceiver 430 comprises a light emitting diode or laser diode 440, a laser pulse driver 435, a photo diode 441, a laser pulse detector 437, a data stream converter 431, a data stream transmitter 433 and an elastic buffer 432. Laser pulse driver 435 in conjunction with laser diode 440 are configured for sending data out as outgoing laser pulses, while laser pulse detector 437 and photo diode 441 are for receiving data from incoming laser pulses. Data stream converter 431 converts data signals into light pulses, while data transmitter 433 does the opposite. Elastic buffer 432 is designated for adding a delay to data stream ensuring a smoother and more uniform data transmission.

Figure 4C:
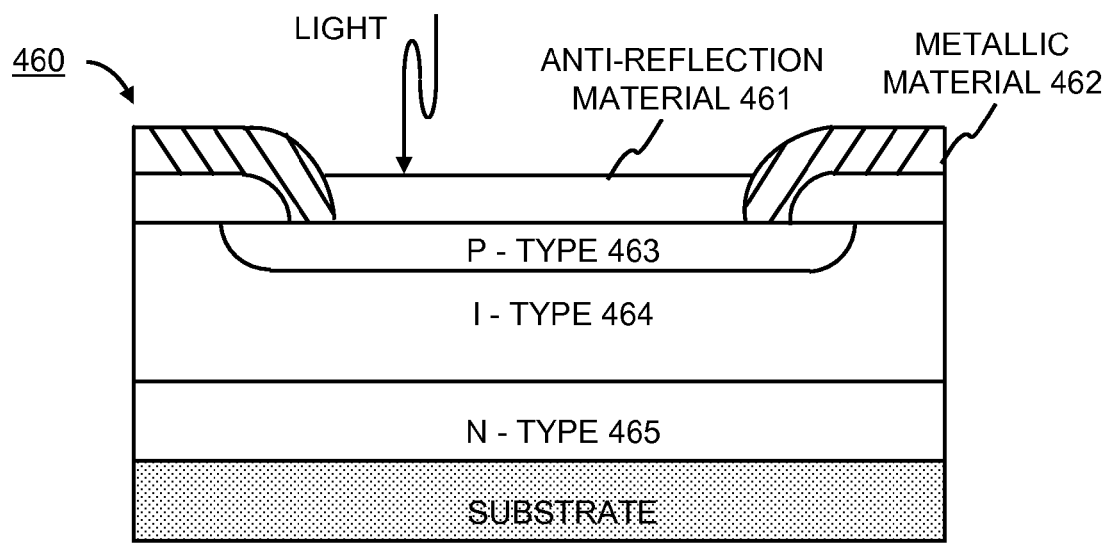
FIG. 4C is a diagram showing a P-I-N type laser diode structure.
Figure 4D:
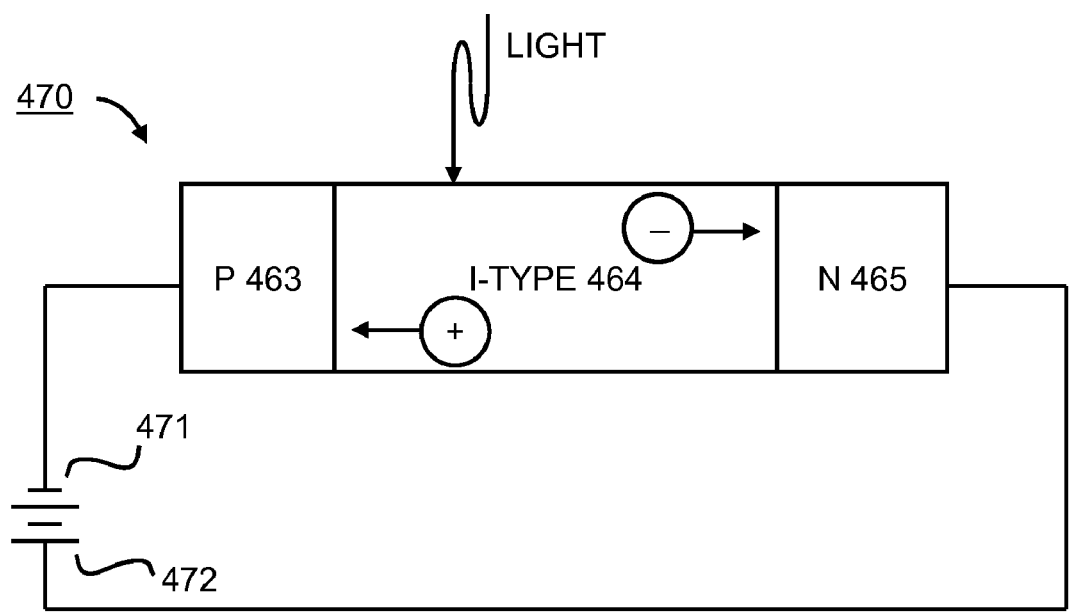
FIG. 4D is an electric circuit diagram showing a reverse biased P-I-N type laser diode.
Figure 4E:
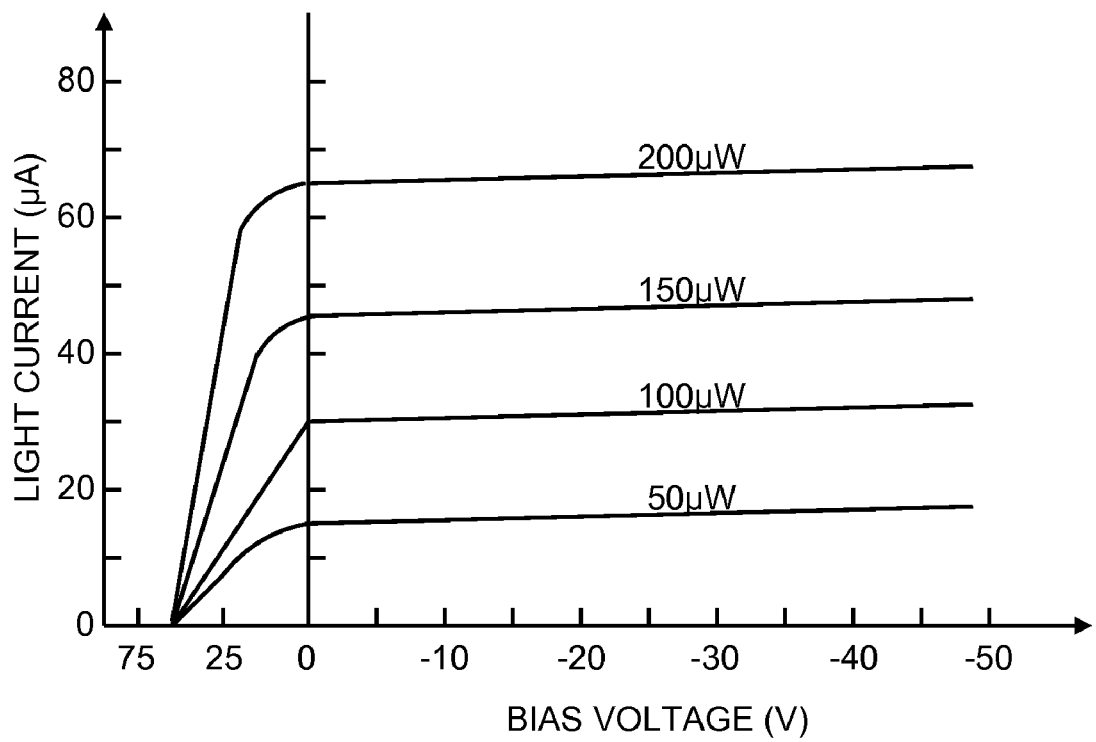
FIG. 4E is an X-Y chart showing a reverse biased P-I-N type laser diode output characteristics.

FIG. 4C shows an exemplary P-I-N type laser diode 460. FIG. 4D shows a reverse biased electric circuit diagram 470 of a P-I-N type laser diode 460. P-I-N type laser diode 460 comprises a number of substrates including an anti-reflection material 461, metallic material 462, P-type material 463, I-type material 464 and N-type material 465. P-type material 463 and N-type 464 material can be created by doping semiconductor material with holes and electrons, respectively. I-type material 464 can be undoped silicon crystal. In the electric circuit diagram 470, P-type material 463 is connected to negative end 471 of the battery and N-type material 465 to positive end 472. The diode's setup is referred to as reverse biased that prevents electric current to flow. FIG. 4E is an X-Y charts showing characteristics of bias voltage versus current in a reverse biased laser diode without any injection light.

Figure 5A:
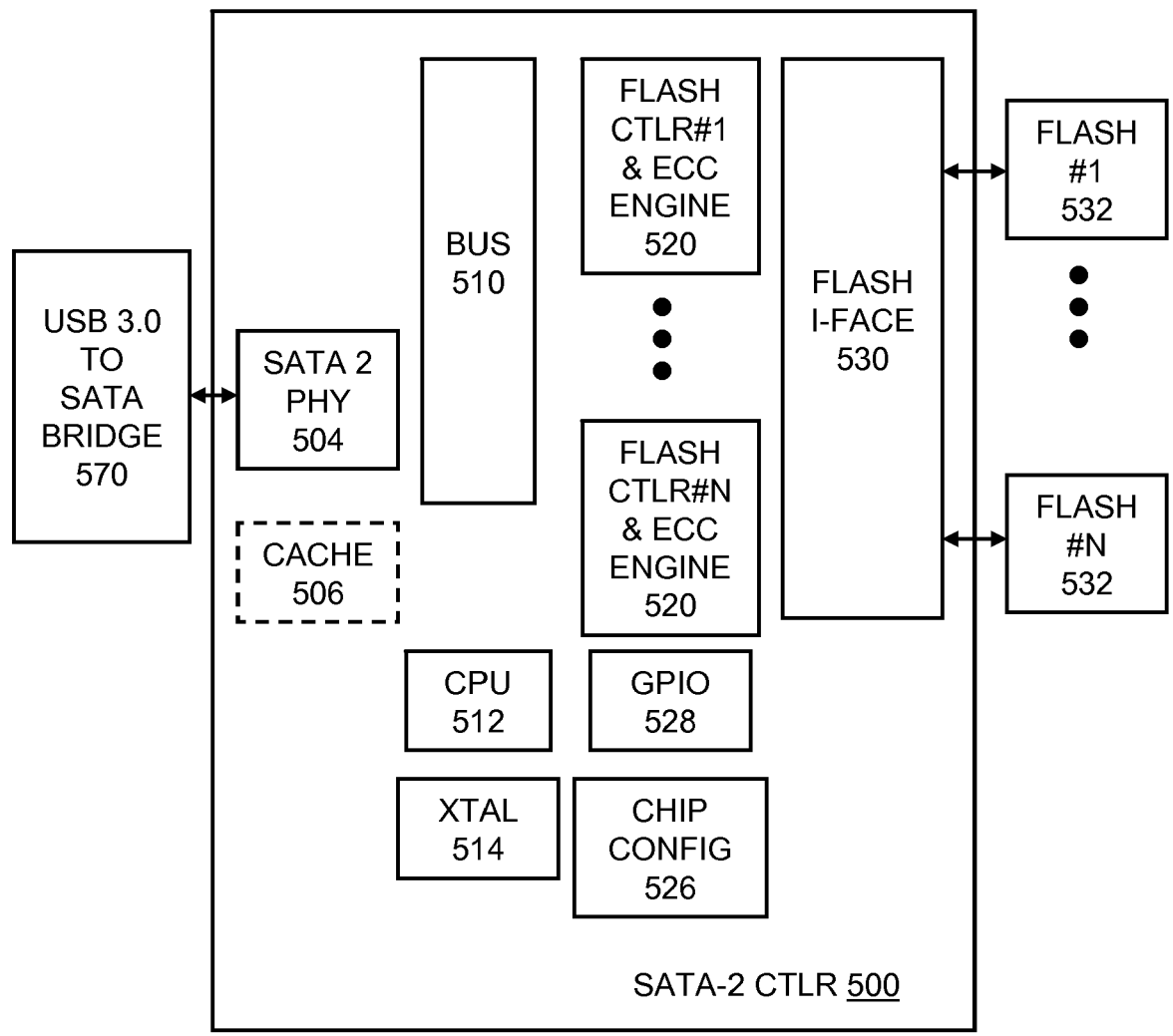
FIG. 5A is a block diagram showing a SATA-2 controller.
Figure 5B:
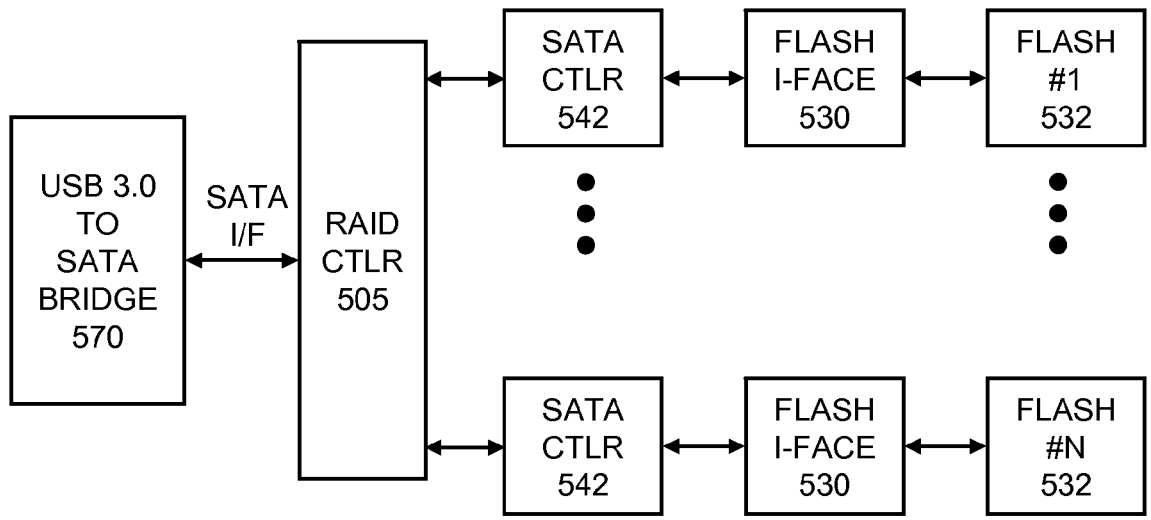
FIG. 5B is a block diagram showing a RAID based SATA system.
Figure 5C:
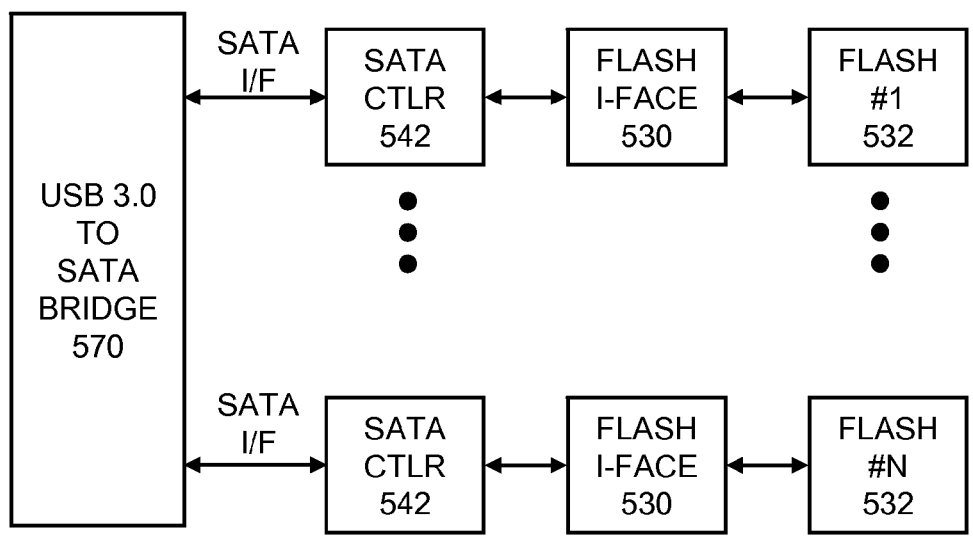
FIG. 5C is a block diagram showing a USB-to-SATA bridge to multiple SATA channels.

Referring to FIG. 5A, it is shown a SATA-2 controller 500 being connected to USB-to-SATA bridge 570 (see FIG. 5C for details) via SATA-2 physical layer 504. GPIO 528 has basic functions similar to general-purpose input-output (GPIO) 558 of FIG. 5C and provides I/O of CPU 512. Control information can change settings in chip configuration registers 526 through SATA commands. CPU 512 is clocked by crystal (XTAL) 514 and causes bus 510 to transfer data from SATA-2 physical layer 504 to multiple instances of flash controller and ECC engines 520. Flash memory arrays 532 are controlled by flash controller and ECC engines 520 through flash interface 530. Cache 506 is optional storage for buffering data to and from bus 510. FIG. 5B shows a RAID SATA system. USB-to-SATA bridge 570 connects over a SATA interface to RAID controller 505. RAID controller 505 distributes data into segments and stores data items on each of the physical devices of flash memory arrays 532. Each flash memory array 532 is accessed by a channel of SATA controller 542 and flash interface 530. According to a RAID setup, some of the channels may be used for redundancy purposes. FIG. 5C shows a USB-to-SATA bridge to multiple SATA channels. USB-to-SATA bridge 570 connects over multiple SATA interfaces to multiple channels. Each channel has SATA controller 542 and flash interface 530 to flash memory arrays 532.

Figure 5D:
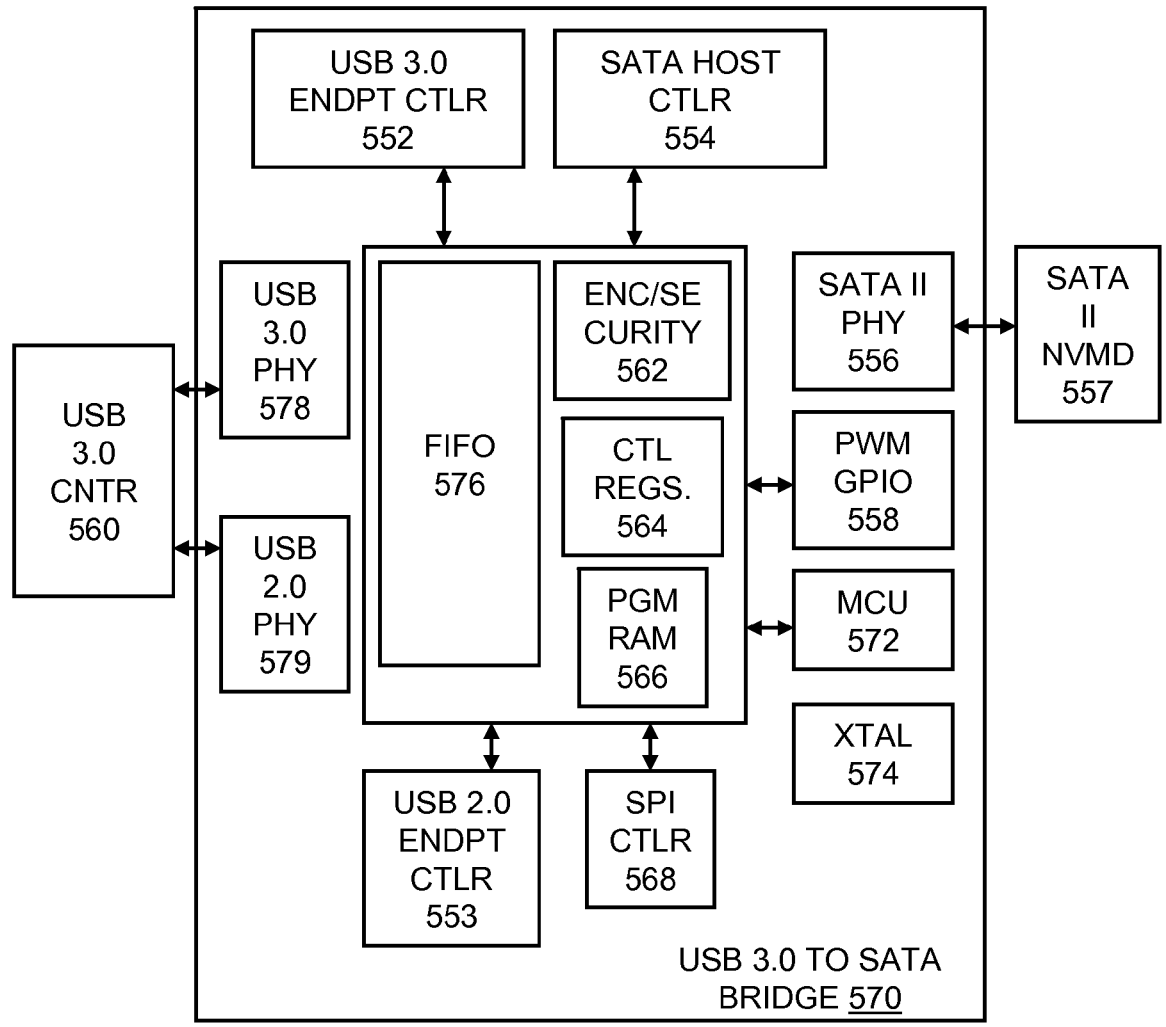
FIG. 5D is a block diagram showing a USB to SATA bridge.

FIG. 5D shows a USB to SATA bridge 570. USB connector 560 plugs into a USB host to receive USB packets that communicate with either USB 2.0 physical layer 579 or USB 3.0 physical layer 578, depending on the version of the protocol used by the host. Data is buffered by (First-In-First-Out) FIFO buffer 576 and processed by either USB 3.0 endpoint controller 552 or USB 2.0 endpoint controller 553. USB-to-SATA bridge 570 converts SATA commands and data from the USB packets once the USB headers and checksums are stripped off by USB 3.0 endpoint controller 552 or USB 2.0 endpoint controller 553. SATA host controller 554 is used to control SATA 2 PHY 556 for interface to the downstream SATA 2 SSD. Master control unit (MCU) 572 controls operation of converting SATA commands that are detected in the data payloads in FIFO 576. Program RAM 566 is the buffer and the running operating image for MCU 572. Security and encryption/decryption unit 562 can assist with AES, IEEE 1667, fingerprint, or other kinds of digital signature security functions, such as encryption and description and password verification or management. Control registers 564 can be loaded with USB and SATA control information for USB-to-SATA Bridge 570. Serial-Peripheral Interface (SPI) controller 568 provided a way for external debugging device to debug and update operating image of the USB-to-SATA Bridge 570. The general-purpose input-output (GPIO) 558, which has a programmable pulse width that is modulated for use in driving light-emitting diodes (LEDs) and other indicator lights or input signals for various debugging or detecting purposes. SATA-2 physical layer 556 performs the physical signaling needed for data transfers. Master control unit (MCU) 572 controls operation of the various components of USB-to-SATA bridge 570 using a clock from crystal (XTAL) 574.

Figure 6:
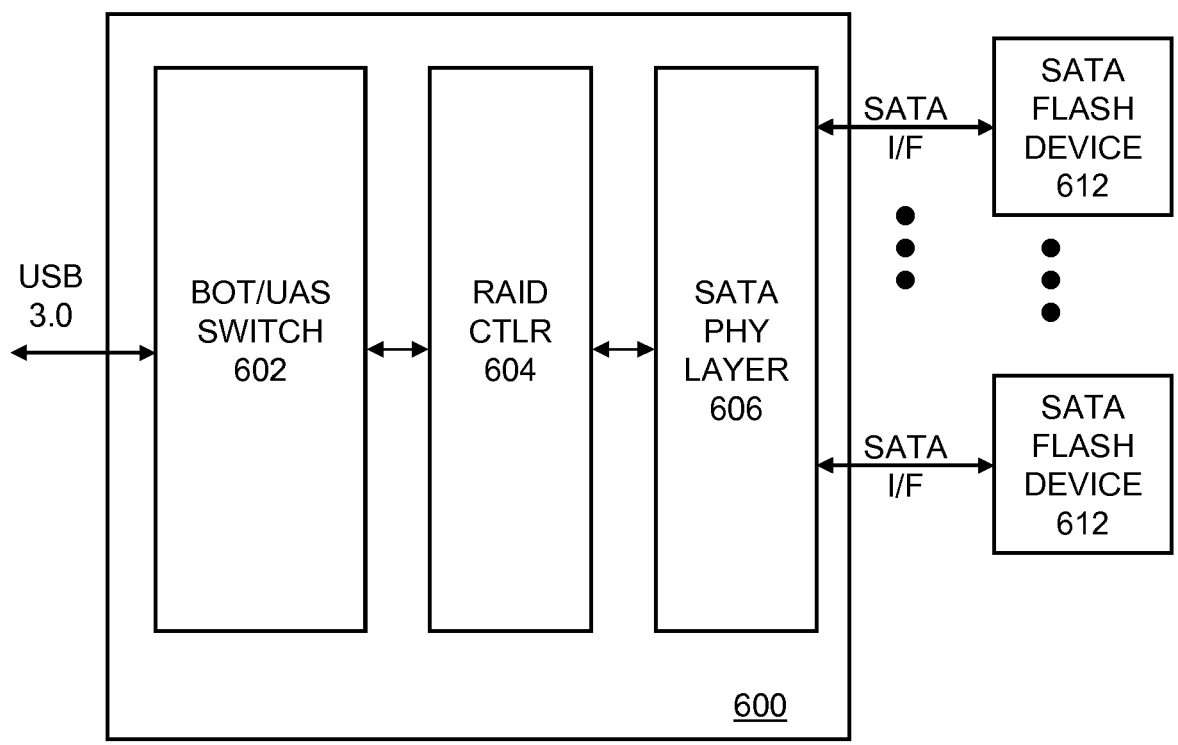
FIG. 6 is a block diagram showing an integrated bridge with a UAS/BOT switch using RAID controller to control multiple SATA channels for a USB host.

FIG. 6 shows an integrated bridge with a UAS/BOT switch using Redundant Array of Independent Disks (RAID) controller 604 to control multiple SATA channels for a USB host. RAID bridge 600 comprises BOT/UAS switch 602, RAID controller 604, and SATA physical layer 606. BOT/UAS switch 602 receives USB packets from a host and detects UAS mode or BOT mode. RAID controller 604 duplicates data for redundant storage, while SATA physical layer 606 connects to multiple SATA interfaces to multiple SATA flash devices (NVMD) 612.

FIG. 7A is a schematic diagram 700 showing EUSB pipes. Diagram 780 shows four pipes, command IU, status IU 722, data-out IU 723 and data-in IU 724, are created through respective endpoint descriptors 711-714. Command pipe 721 and data-out pipe 723 use bulk-out pipe endpoints 711, 713, while status pipe 722 and data-in pipe 724 use bulk-in endpoints 712, 714. These endpoints 711-714 are set up by interface descriptor 708. Above the interface descriptor 708, there are configuration descriptor 706, device descriptor 704 and control endpoint descriptor 702, respectively.

FIG. 7B shows the field specification of information unit (IU) in accordance with UAS. In one embodiment of the present invention, IU ID "00h" and "02h" are configured as "device reset" and "trim/erase", respectively. Trim is referred to as trimming a flash memory block, which is put into a recycle queue to be reused immediately. Erase is referred to as erasing a flash memory block in a normal manner. The erased block is not sent to the recycle queue right away, instead the block would be kept until other recycling conditions deem to make the erased block useless. Other IU IDs are set up according to UAS, for example, "01h" for command (CMD), "03h" for sense, "04h" for response, "05h" for task management, "06h" for read ready (RD RDY), and "07h" for write ready (WR RDY). Sense is a special IU configured for acknowledging completion of a command (e.g., ready or write command).

Figure 8A:
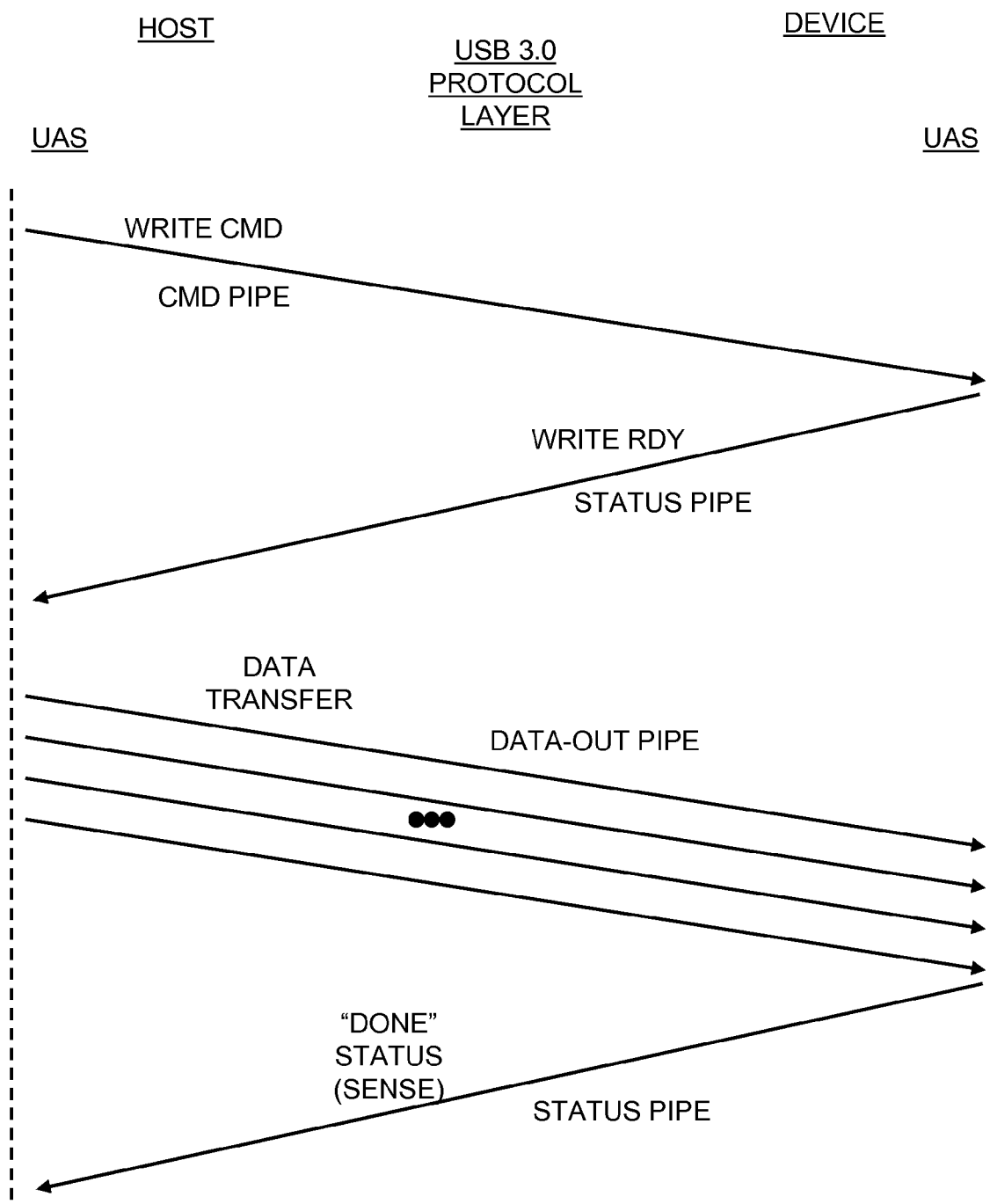
FIGS. 8A-8C collectively is a diagram showing message passing between UAS host and device.
Figure 8B:
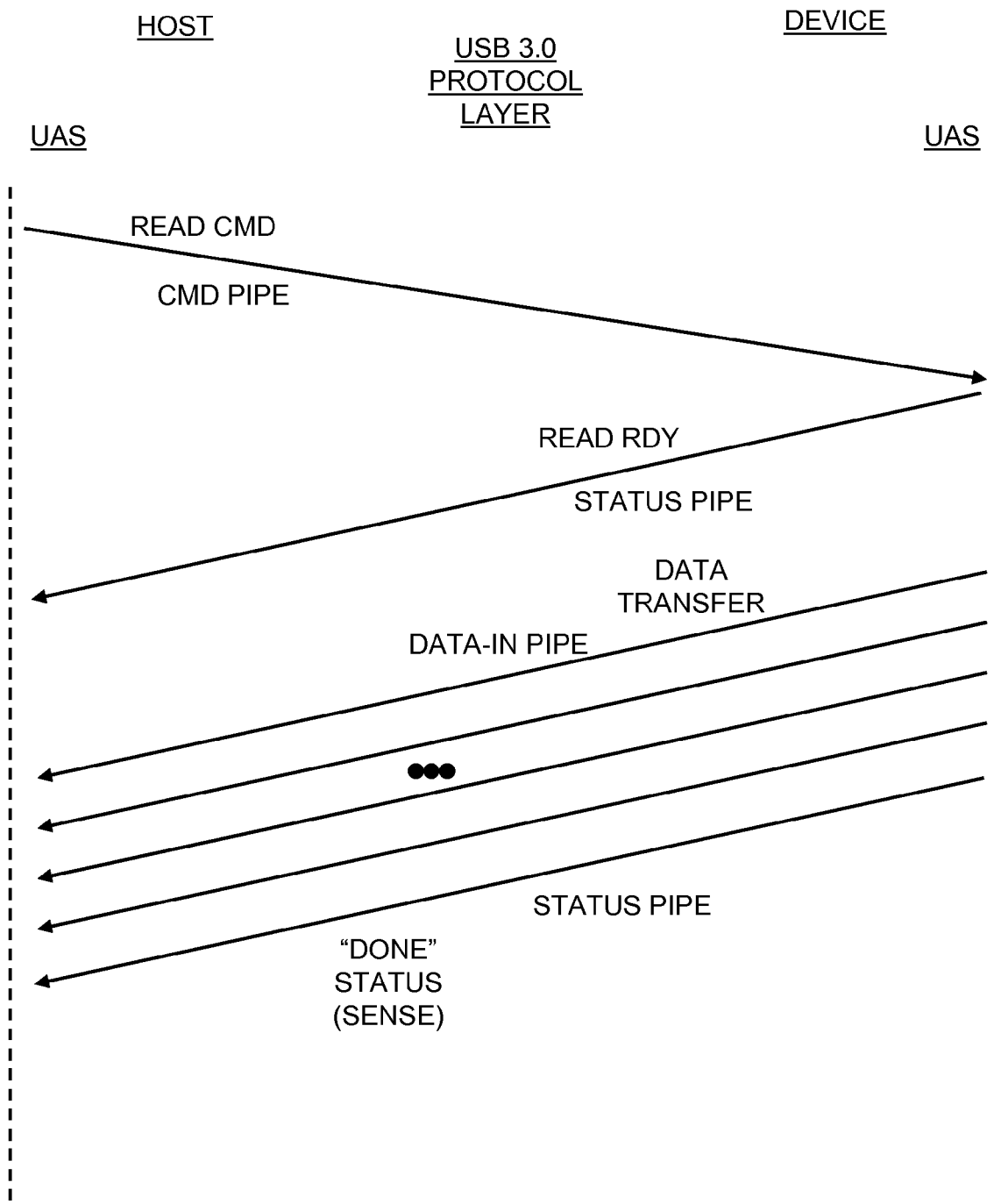

FIGS. 8A-B collectively shows an exemplary message passing scheme using UAS and USB protocols. In FIG. 8A, the host (e.g., EUSB host 200 of FIG. 2A) uses the UAS protocol to create a write command. The UAS write command is sent to a USB protocol layer 206 then creates a 1 Kilo-Byte (KB) or smaller USB data packet (DP) that is sent over the physical interface from the host 200 to the device 220. The device 220 responds by sending a USB status transaction packet (TP) back to the host 200 over the physical interface to acknowledgement receipt of the USB packet. The device 220 extracts the UAS command from the USB packet and transfers the UAS write command to the command pipe 224 to the UAS protocol layer for processing.

The UAS protocol layer 223 on the device 220 generates a ready (WRITE RDY) message that is sent through the status pipe 225 and encapsulated as a USB data packet to the host 200. The host 200 responds to this USB data packet with a USB status transaction packet (TP) back to the device 220 over the physical interface to acknowledge receipt of the USB packet. The host 200 extracts the UAS ready from the USB packet and transfers the UAS ready message to the host 200. The host 200 starts transferring the data to the device 220 via the data-out pipe 226 with one data packet at a time. When all of the data packets for the write command have been received, the device 220 issues a DONE status (i.e., "SENSE" IU) through status pipe 225 to the host 200 to confirm the completion of the data transfer operation.

In FIG. 8B, the host 200 uses the UAS protocol to create a read command and sends the command to the device 220 via a USB protocol layer substantially similar to the write command shown in FIG. 8A. In response, the device 220 sends a USB status transaction packet (TP) back to the host 200 over the physical interface. The device 220 extracts the UAS command from the USB packet and transfers the UAS read command to the command pipe 224 to the UAS protocol layer for processing.

The UAS protocol layer 223 on the device 220 generates a ready (READ RDY) message that is sent through the status pipe 225 and encapsulated as a USB data packet to the host 200. The device 220 then sends out requested data sectors set forth in the read command one data packet at a time through data-in pipe 227. When all of the data packets for the read command have been sent, the device 220 issues a DONE status (i.e., "SENSE" IU) through status pipe 225 to the host 200 to confirm the completion of the data transfer operation.

Figure 8C:
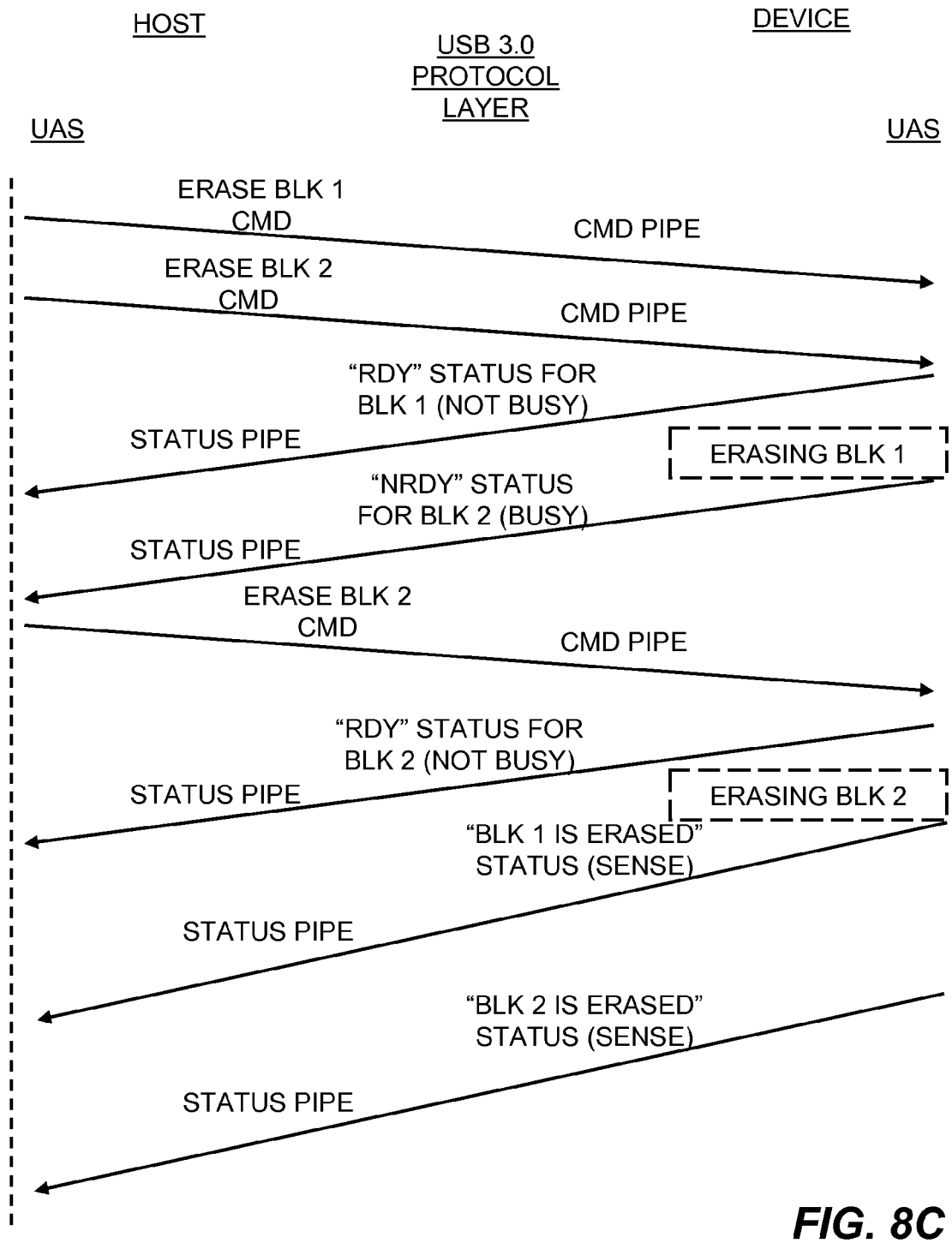

FIG. 8C shows messages for erase commands. The host 200 is operating in the UAS mode. The host 200 sends a message with an "ERASE BLK 1" command to the device 220, followed by another message with an "ERASE BLK 2" command. The device 220 receives these commands in command pipe 224. The device 220 then determines that block 1 is not being used thus ready, while block 2 is busy with another access therefore not ready. The device 220 generates a "RDY" message for the "ERASE BLK 1" command and a not ready ("NRDY") for the "ERASE BLK 2" command, and both messages are loaded through status pipe 225 and sent to the host 200. The device 220 begins erasing block 1 of flash memory.

After some time, the host 200 retries the "ERASE BLK 2" command by sending another command message to the device 220. This command is also placed in command pipe 224. The device 220 now finds that block 2 is no longer busy and generates a "RDY" message for the "ERASE BLK 2" command that is loaded into status pipe 225 and sent to the host 200. The device 220 begins erasing block 2 of flash memory. The erase operation is generally a length operation. Eventually, block 1 has been erased and the device 220 generates a DONE ("SENSE") message for the "ERASE BLK 1" command that is loaded into status pipe 225 and sent to the host 200. Later, block 2 is also erased and the device 220 generates a DONE ("SENSE") message for the "ERASE BLK 2" command that is loaded into status pipe 225 and sent to the host 200. Other commands could be processed during this time, such as reads and writes of other blocks or of cached data.

Figure 9A:
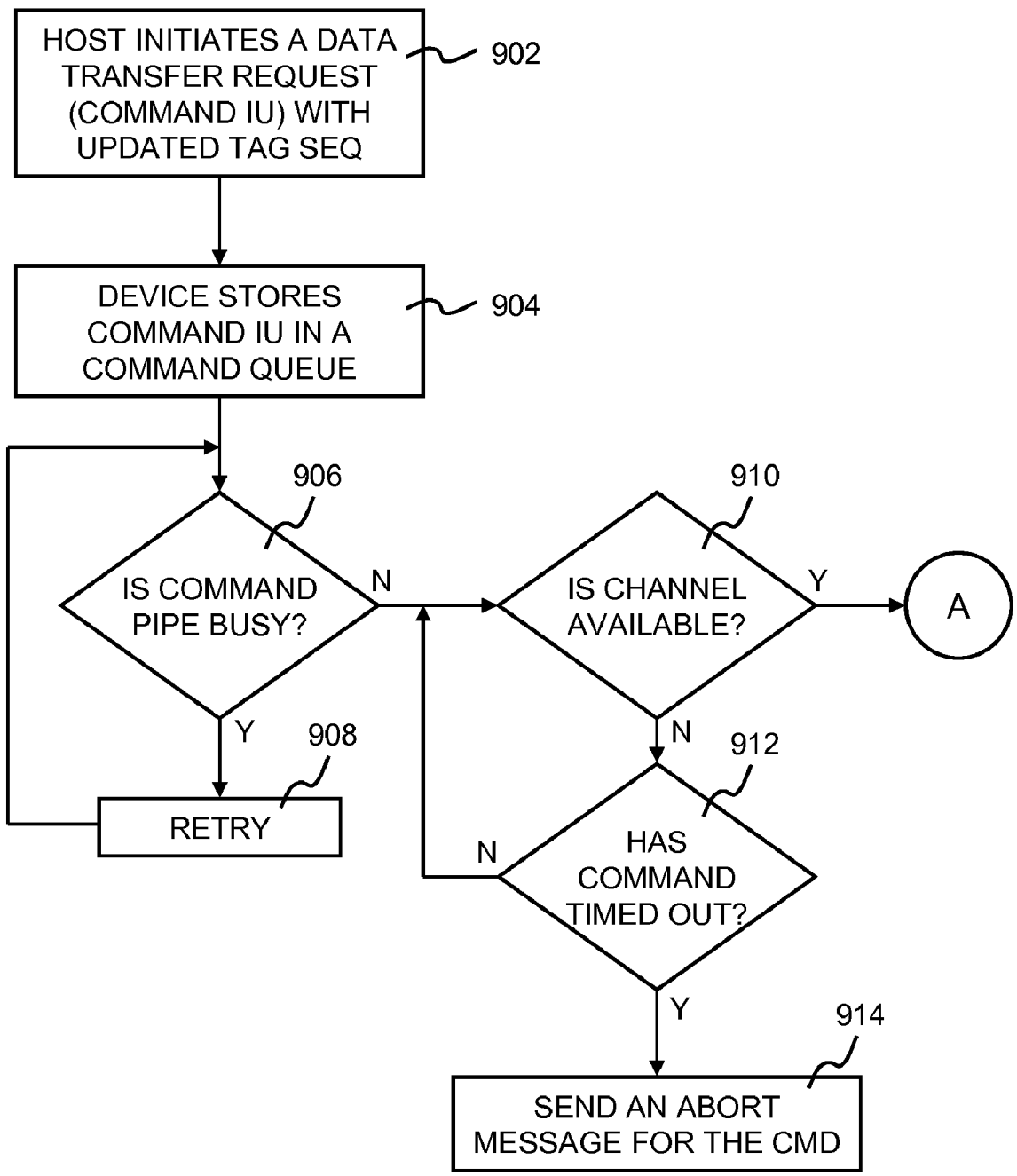
FIGS. 9A-9C collectively is a flowchart showing a process of conducting data transfer operations between EUSB host and device.
Figure 9B:
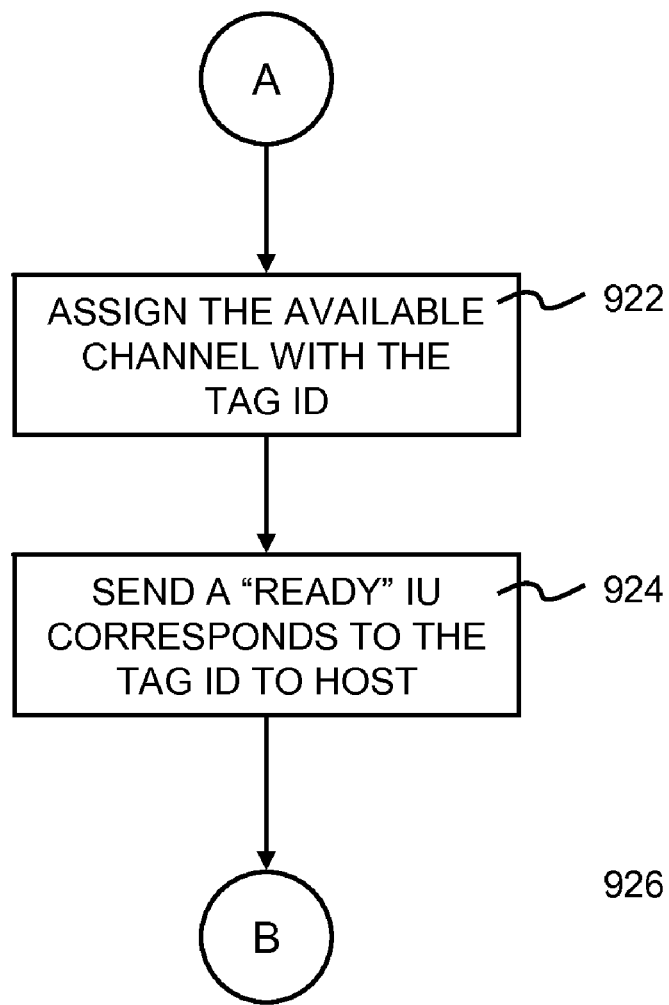
Figure 9C:
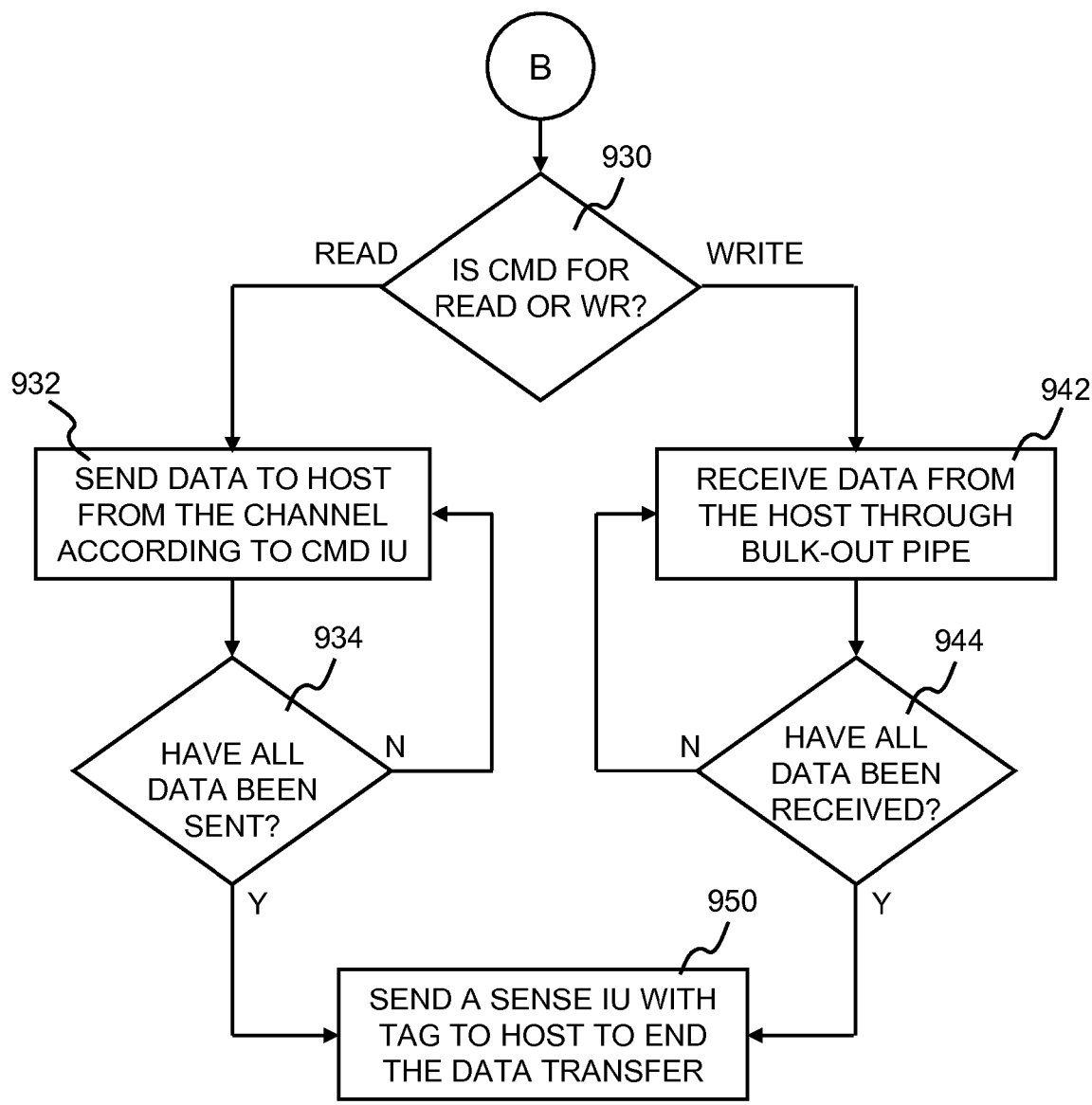

FIGS. 9A-9C collectively is a flowchart illustrating a process 900 of conducting data transfer operations in a UAS flash memory device. Process 900 starts with the host (e.g., EUSB host 200 of FIG. 2A) initiates a data transfer operation in forms of UAS command information unit (IU) at step 902. Each IU is associated with a tag number or sequence as an identifier. At step 904, the device (e.g., EUSB flash memory device 220) stores the received command information in a command queue. The received command information is extracted from the command IU, for example shown in FIG. 11A, command type, start logical sector address (LSA), sector count (SC) or data sector range, and etc. Command queue is generally implemented in software (e.g., firmware (FW)) and run on microcontroller 231 with data stored in a corresponding data sector buffer 230. Next, at decision 906, the device's firmware checks whether command pipe 224 is busy. If busy, process 900 retries at step 908 until the command pipe 224 becomes available. Then, process 900 follows the "N" branch to another decision 910, in which it is determined whether any of the data channels of the flash memory arrays of the device 220 is available. If not, process 900 moves to another decision 912 to determine whether the command has been timed out (i.e., has been issued longer than a predefined threshold wait time). If so, the device 220 sends out a message to abort the command at step 914. Otherwise, process 900 rechecks decision 910. When any of the data channels is available, the device's FW assigns the available channel to associate with the tag number of the command at step 922. And then, at step 924, sends out a ready IU for the associated command/tag to the host 200.

Next, at decision 930 (shown in FIG. 9C), it is determined whether the command is a data access (i.e., read) or data update (i.e., write or erase/trim). For data write command, process 900 moves to step 942 in which the device 220 starts receiving data packets from the host 200 through bulk-out pipe 226. Process 900 moves to decision 944 to determine whether all data has been received. If not, the device 220 continues waiting for additional data packets. When all data have been received, the device 220 sends out a DONE ("SENSE" IU) message along with the corresponding tag number/sequence to the host 200 to signal the end of this particular data transfer operation. If the command is determined to be a data access command (i.e., read) at decision 930, the device 220 starts sending requested data in forms of data packets to the host 200 at step 932. Next, at decision 934, it is determined whether all data have been sent out. If so, process 900 moves to step 950 by sending out the DONE message to end the data transfer operation. Otherwise, the device 220 continues sending out the request data sectors through the channel at step 932 until all data have been sent. Since data transfer commands are held in the queue and corresponding data sector buffer before dumping to the flash memory arrays, both data access and data update commands must account for the locations of the most current data.

For any data update command to data still held in the data sector buffer, most efficient method is to overwrite the contents in the buffer. For any data access command, data held in data sector buffer are more current than those stored in the flash memory arrays. To ensure data temporarily held in data sector buffer are timely dumped to the flash memory arrays, a flash dump flag is inserted in the queue. The flash dump flag is designated as a trigger indicator for the device's FW to flush the data held in the buffer into the flash memory arrays.

Figure 10:
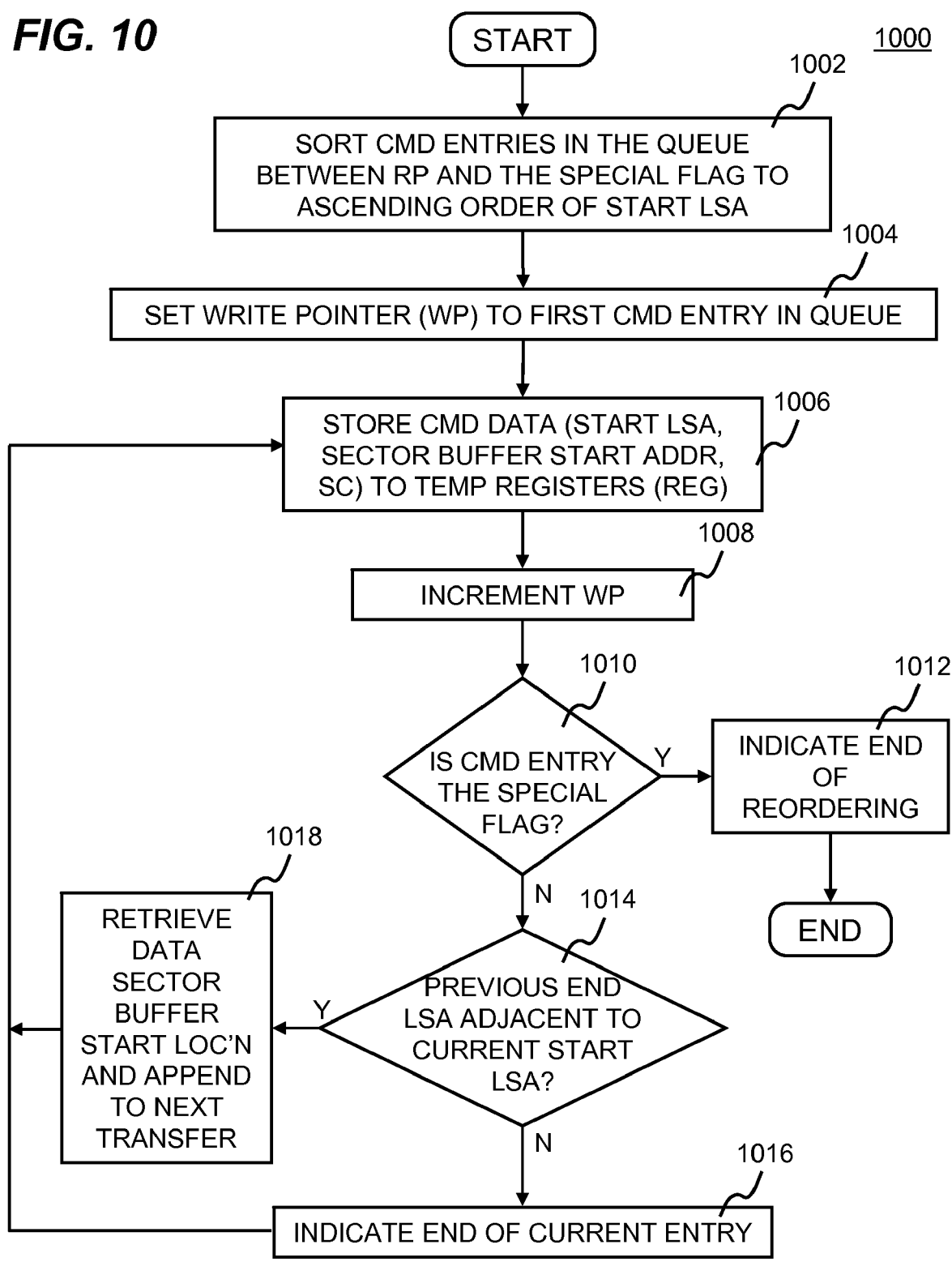
FIG. 10 is a flowchart illustrating a process of reordering data update commands in a command queue of an EUSB device.

FIG. 10 is a flowchart showing a process 1000 of reordering commands stored in the command queue of UAS based flash memory device. Process 1000 is preferably understood in conjunction with other figures particularly FIGS. 11A-11B and 15A-15C.

Process 1000 starts by sorting command entries in the command queue to an ascending order of command's start logical sector address (LSA) at step 1002. LSA is graphically described in an example shown in FIGS. 15A-15B. Sorting operations are performed for those command entries located between read pointer of the queue and a location indicated by a flash dump flag (e.g., "FF33" in one implementation). At step 1004, a write pointer (WP) is set to point to the first data update command entry of the queue. Command's data sector range is stored into temporary registers or memory locations for sorting operation at step 1006. Typical command data includes start LSA, data sector buffer start pointer, sector counts or data sector range, etc. Next, at step 1008, WP is incremented to the next entry in the queue. At decision 1010, it is determined whether the command entry pointed by WP contains the flash dump flag. If so, process 1000 ends the reordering operation at step 1012. Otherwise, process 1000 moves to another decision 1014 to determine whether end LSA of the previous command is adjacent to the current command's start LSA. If not, process 1000 ends processing of the current command entry at step 1016 before moving back to step 1006 to repeat. Otherwise, process 1000 moves to step 1018 to regroup data sectors stored in data sector buffer 230 by retrieving the start location and appending it with next transfer before moving back to step 1006 to repeat the steps described herein.

USB 3.0 supports more complex transfer sequences that are used for UAS mode. The host (e.g., EUSB host 200 of FIG. 2A) can dispatch several commands without having to wait for the device (e.g., EUSB device 220) to service the last command. The host-to-device USB bus is much more efficiently utilized since new commands can be transferred while waiting for the device to complete a command. An example shown in FIGS. 11A-11B and 12 demonstrates this aspect.

Figure 11A:
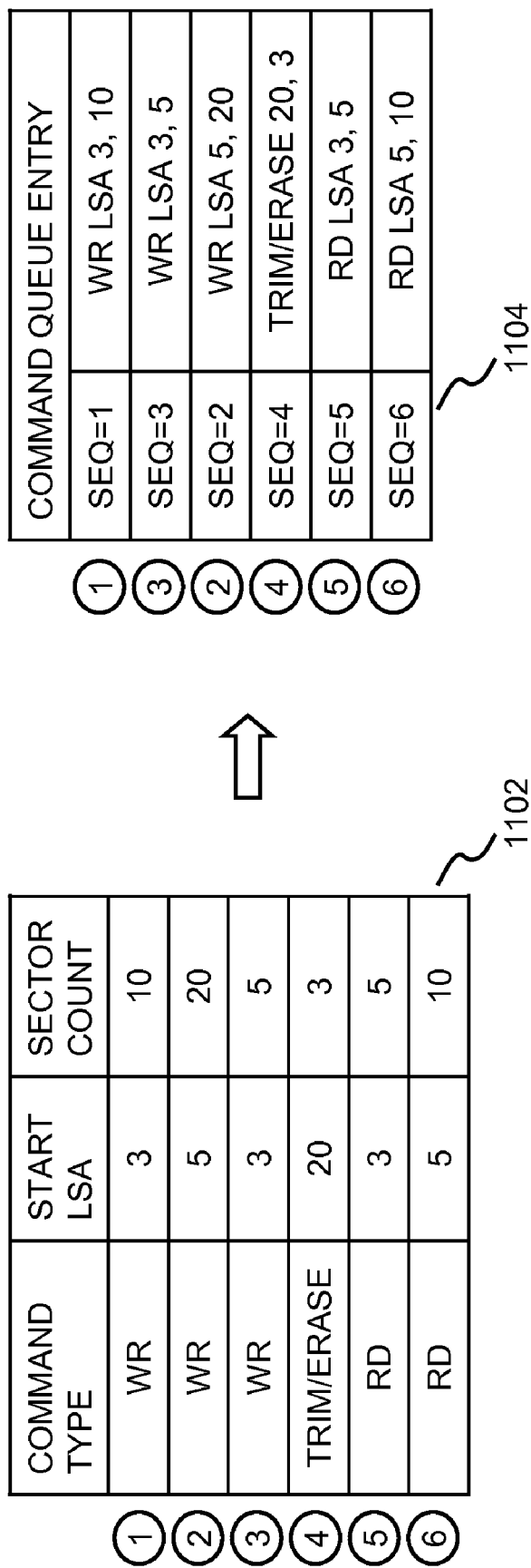
FIGS. 11A-11B collectively shows an example of command reordering process shown in FIG. 10.
Figure 11B:
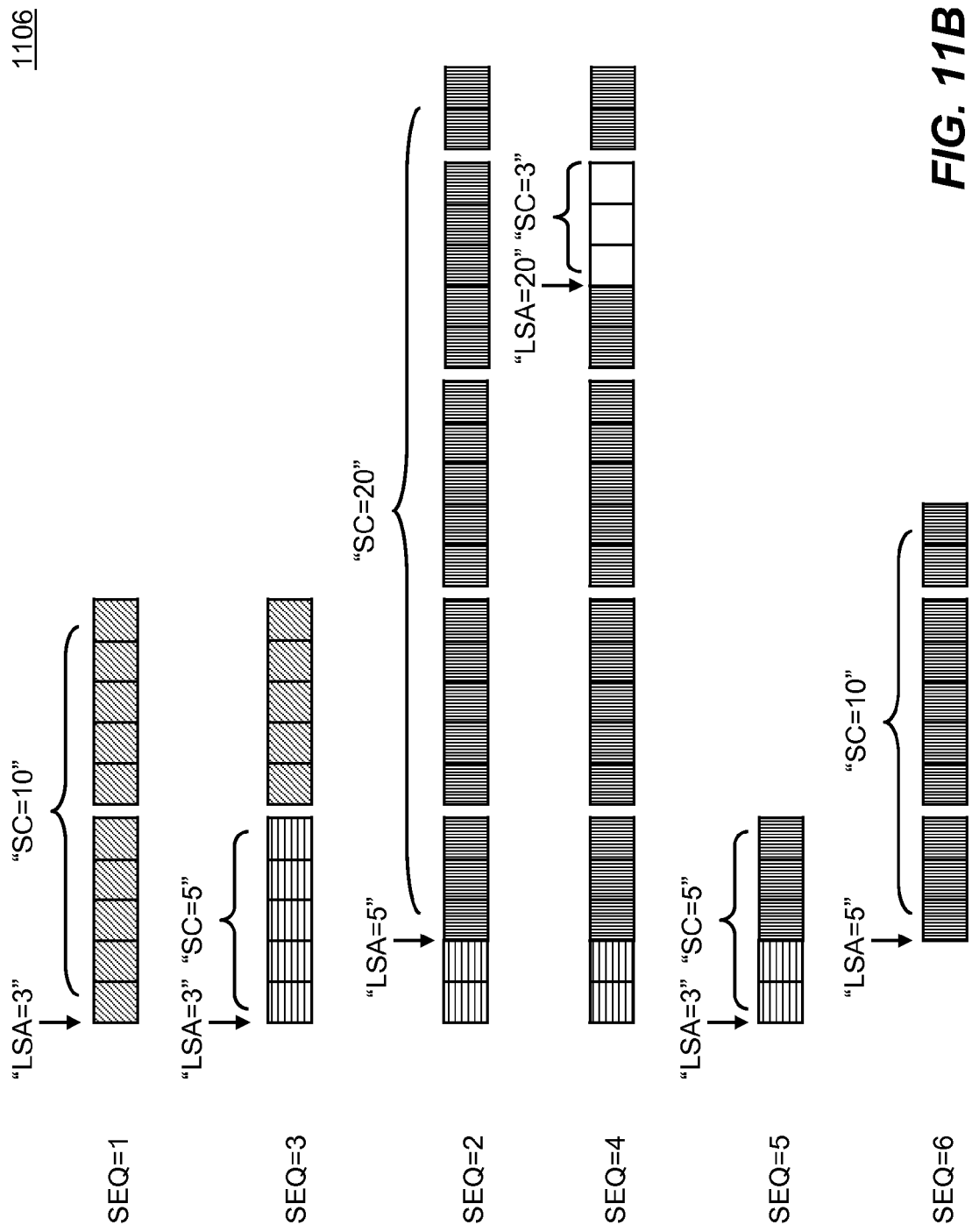

FIGS. 11A-11B collectively shows an example of command queue reordering process 1000 shown in FIG. 10. Since only data update commands can be reordered in the queue, command entries are sorted and separated into two groups: data update and data access. For example, the command queue 1102 comprises six commands including four data update commands (indicated by circle numbers 1-4) and two data access commands (read commands 5 and 6). Each command includes three information fields: command type, start LSA and sector count (SC). Sector count is also referred to as the data range of the command. In other words, each command operates in the specified data range starting at "start LSA", for example, command 1 is a write command for writing 10 data sectors started from LSA of 3 (see graphical example corresponds to SEQ=1 in diagram 1106 of FIG. 11B). After reordering, the queue 1104 shows orders of commands 2 and 3 are reversed. That is because data range of command 3 is fully-overlapped with that of command 1. Command 3 has start LSA of 3 and sector count of 5, which is covered by the start LSA of 3 and sector count of 10 of command 1 in its entirety. Data range of command 2 is partially overlapped with that of command 1. The reordering operations makes a more efficient execution of these data transfer operations because overlapped data update can be performed as a memory overwrite operation in data sector buffer 230 instead of flash memory arrays (e.g., NVM 232) programming. Flash memory update or programming is a much slower or inefficient operation due to the nature of flash memory can only be updated in a data page based order sequentially. Diagram 1106 shows sequences of data update operations in data sector buffer 230 for the commands listed in the command queue 1104 that has bas reordered.

For command 1 (SEQ=1), data sectors corresponded to "LSA=3" and "SC=10" are shown in the first row as shaded boxes with diagonal lines. Next for command 3 (SEQ=3), five boxes from "LSA=3" are updated (shaded with horizontal lines). Then for command 2 (SEQ=2), data sectors associated with "LSA=5" and "SC=20" are updated (shown as vertically shaded boxes). For command 4 (SEQ=4), three unshaded boxed represents data sectors trimmed/erased starting at "LSA=20". Last two data access or read commands (SEQ=5 and SEQ=6) are shown in the last two rows.

Figure 12:
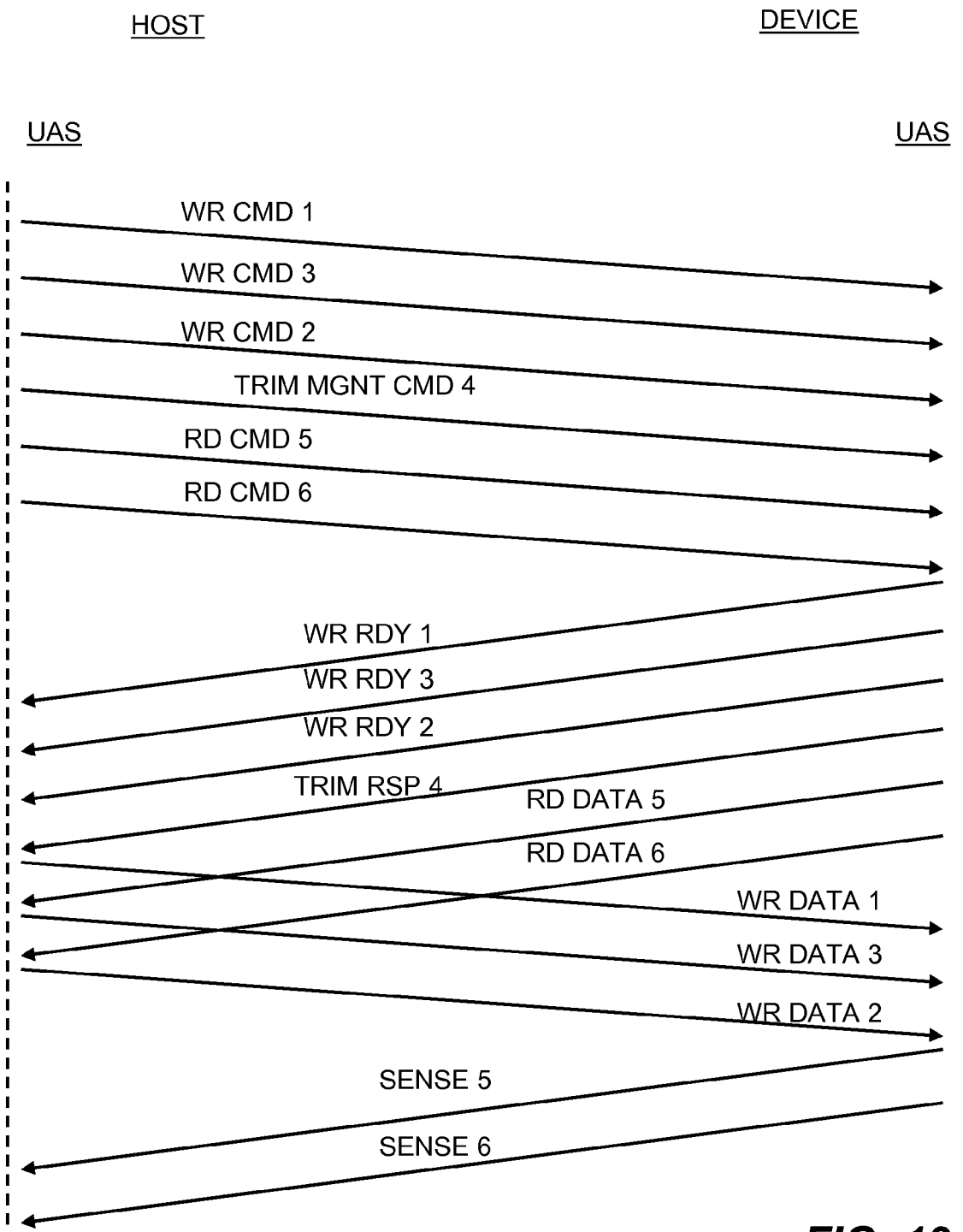
FIG. 12 is a diagram showing a message passing between UAS host and device corresponded to the example shown in FIGS. 11A-11B.

FIG. 12 shows a message passing diagram corresponded to the example shown in FIGS. 11A-11B. According to one aspect, the EUSB device has flexibility in processing commands. Once data of a command has been stored in a data sector buffer, it can be sent to flash memory at any later time, and in any order, subject to any data dependencies, such as the same LSA being written twice. The device can send back read data in any order, not just in the order the commands were received. The USB bus between the host and device is efficiently used, since additional commands are transferred while the device is still processing earlier commands. A much higher throughput is therefore possible.

Figure 13A:
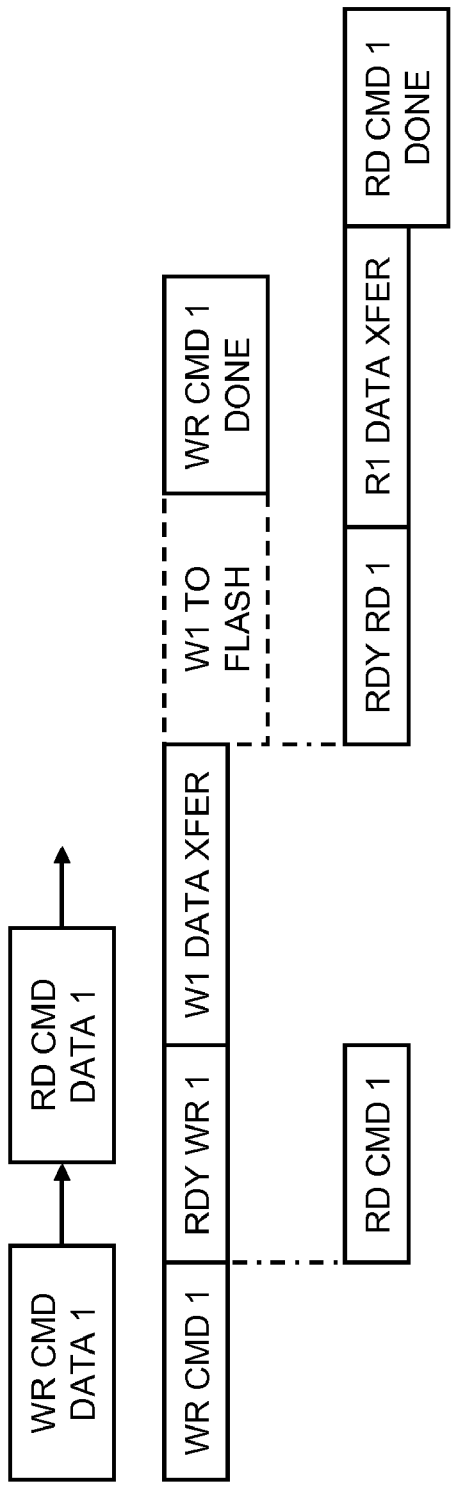
FIG. 13A is a diagram showing data dependency between write and read commands of same data range.

FIG. 13A shows a data dependency among two commands with the same start LSA and sector counts. A sequence of commands from the host includes WR CMD DATA 1 (shown as "WR CMD 1") followed by RD CMD DATA 1 (shown as "RD CMD 1"). Both are accessing the same data ("DATA 1"), such as for a read-back after the host writes data to verify the data write. The sequences of messages for the write command begins with "WR CMD 1" from the host, which is responded to by the device with "RDY WR 1". The host then sends the data in one or more messages as "W1 DATA XFER". The device stores this data in a buffer (e.g., data sector buffer 230 of FIG. 2A) and later writes the data to flash. Once the data is stored in the buffer, the device generates a "WR CMD 1 DONE" message to the host. The sequences of messages for the read command begins with "RD CMD 1" from the host, which is responded to by the device with "RDY RD 1". The host then waits for the device to send the data in one or more messages as "R1 DATA XFER". However, since the read data overlaps the write data, as detected by the start LSA and sector counts of the write and read commands, the device waits to respond to the read command until all the data has been stored in the internal buffer from the write command.

Once "W1 DATA XFER" has completed, the device generates one or more packets with the read "DATA 1" and sends them to the host as "R1 DATA XFER". The host stores the read data. Once the data is transferred to the host, the device generates a "RD 1 DONE" message to the host.

Figure 13B:
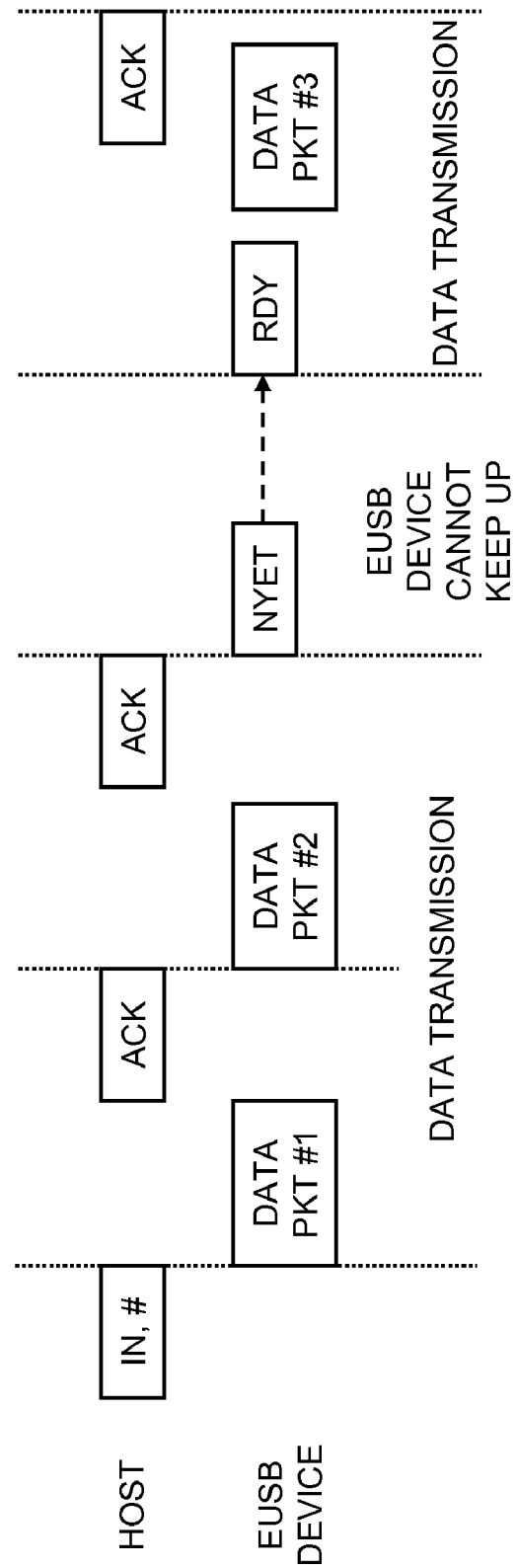
FIGS. 13B-13C are packet-timing diagrams showing sequences of packets being sent to and received from the ESUB device.
Figure 13C:
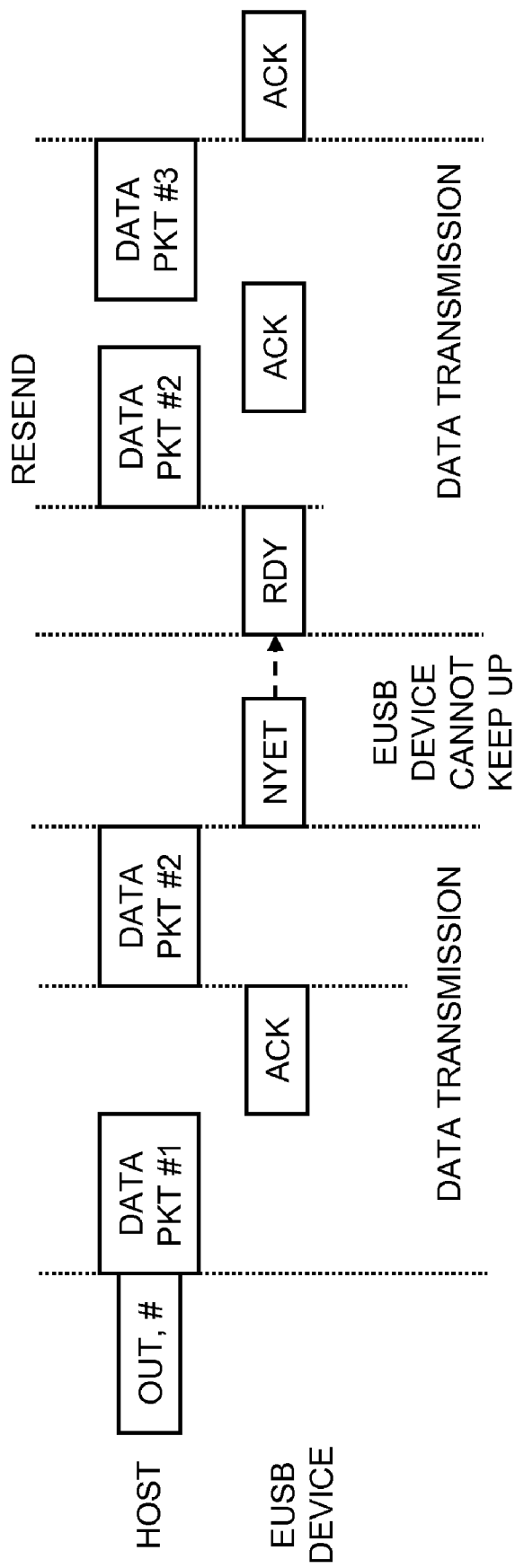

FIGS. 13B-13C are packet-timing diagrams showing sequences of packet being sent to and received from the EUSB device. In FIG. 13B, the host sends a request to read data stored in flash memory arrays of the EUSB device. The read request is embedded inside an IN packet that also contains a number of packets of data to read.

The EUSB device receives the IN packet and begins reading the data. The data may already be buffered in a cache or other buffers, such as when read-ahead caching occurs from an earlier read access. The EUSB device forms the first part of the requested data into data packet #1, which is send back to the host.

The host sends an acknowledgement (ACK) to acknowledge receipt of data packet #1, and to request that the next packet be sent. The EUSB device reads the next data, forming data packet #2, which is also sent to the host.

The host sends another acknowledgement to acknowledge receipt of data packet #2, and to request that the next packet be sent. However, the EUSB device cannot keep up with the pace of the host. The EUSB device sends is a "not-yet" (NYET) packet or signal to the host since the next data is not yet ready.

The host responds to NYET signal by waiting. The host does not poll the EUSB device, but simply waits. After some time, the EUSB device catches up, and sends a ready (RDY) signal to the host. The EUSB device reads the next data, forming data packet #3, which is also sent to the host. The host sends an acknowledgement (ACK) to acknowledge receipt of data packet #3. Since only three packets are requested with the IN packet, the IN transaction ends.

In FIG. 13C, the host sends a request to write flash memory in an EUSB device. The write request is embedded inside an OUT packet that also contains a number of packets of data to write. The host forms the first part of the write data into data packet #1, which is sent to the EUSB device after the OUT packet is sent.

The EUSB device receives the OUT packet and begins writing the data from data packet #1. The data may first be buffered in a cache or other buffers before writing to flash memory.

The EUSB device sends an acknowledgement (ACK) to acknowledge receipt of data packet #1, and to request that the next packet be sent. The host forms the next data into data packet #2, which is also sent to the EUSB device.

The EUSB device buffer is now full. The EUSB device cannot keep up with the pace of the host. The EUSB device sends a not yet (NYET) packet to the host since the data sector buffer is full, and the EUSB device cannot receive data any more data.

The host responds to the NYET signal by waiting. The host does not poll the EUSB device, but simply waits. After some time, the EUSB device catches up, and sends a ready (RDY) signal to the host. Since the EUSB device does not acknowledge receipt of data packet #2, the host resends data packet #2. The EUSB device buffers this data, and sends an acknowledgement (ACK) for the resent data packet #2.

The host forms data packet #3, which is also sent to the EUSB device. The EUSB device sends an acknowledgement (ACK) to acknowledge receipt of data packet #3. Since only three packets are requested with the OUT packet, the OUT transaction ends.

Figure 14:
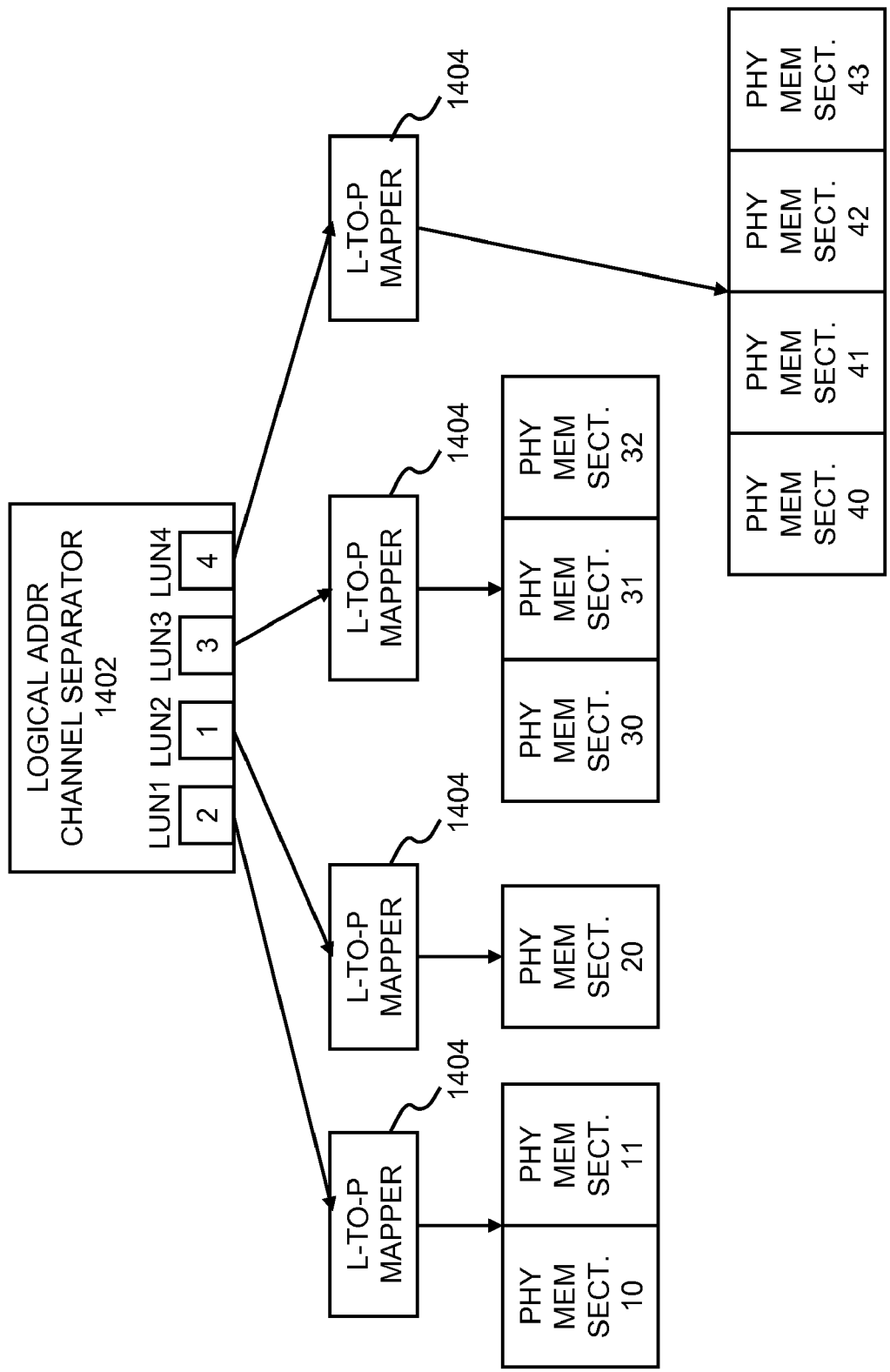
FIG. 14 is a schematic diagram showing controlling multiple logical units.

FIG. 14 shows a schematic diagram 1400 showing an example of controlling multiple logical units. In this example, a logical address channel separator 1402 controls four channels. Each channel can be assigned with a different logical unit. For example, channels associated with logical unit number (LUN1, LUN2, LUN3, and LUN4) are assigned two-, one-, three-, and four-sectors of data. Logical address (e.g., LSA) for each channel is then converted to a physical address via a Logical-To-Physical address mapper (L-TO-P mapper) 1404. Physical memory location for each channel can be different, for example, LUN1 is associated with physical memory sectors 10 and 11, LUN2 with sectors 20, LUN3 with sectors 30-32, and LUN4 with sectors 40-43. Furthermore, LUN1, LUN2, LUN3 and LUN4 can be different partitions on a physical device or different physical devices (homogeneous or heterogeneous). In one embodiment, L-TO-P mapper is implemented in Smart Storage Switch 235 of FIG. 2A.

To demonstrate other aspects, FIG. 15A shows an exemplary flash memory device's data structure 1500 to be used in examples of this document. For illustration and explanation simplicity, the exemplary flash structure is divided by a number of data blocks. Each data block contains four data pages, four data sectors per data page and each sector contains 512-byte of data.

An exemplary data structure of a logical sector address (LSA) is shown in FIG. 15B. LSA includes three components: a starting logical block address (LBA), page offset and sector offset. Used herein as an example, LSA (5,3,3) represents a logical sector address of starting LBA of '5' with page offset '3' and sector offset '3'. FIG. 15B lists the calculation, of LSA (5,3,3), which represents LSA of '95'. FIG. 15C shows an exemplary command queue data structure in accordance with UAS. Command queue comprises at least the following fields: tag ID, command type, start LSA, sector count or data sector range, start data sector buffer pointer (SID).

Figure 15D:
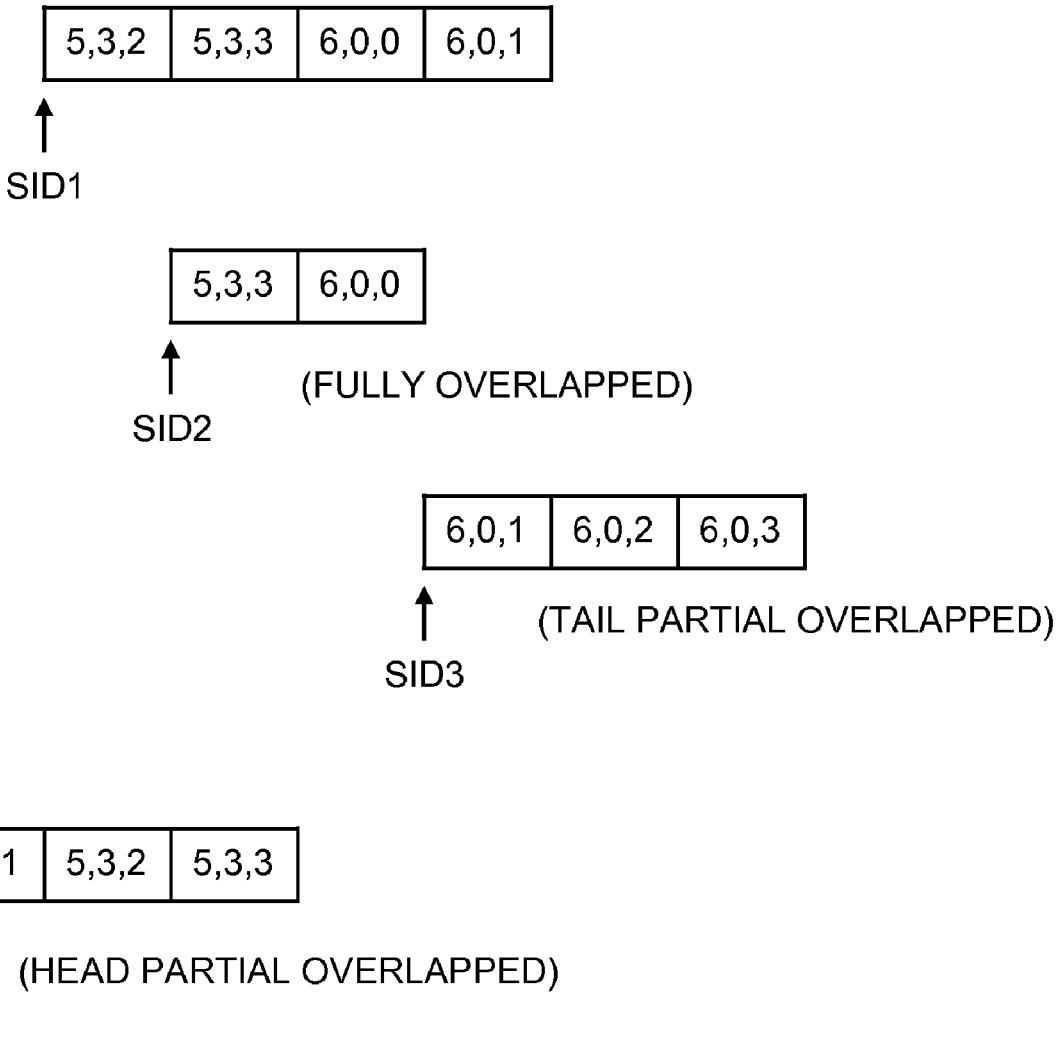

FIG. 15D shows examples to demonstrate overlapped data sectors in a data sector buffer. At data sector buffer point SID1, there is shown four data sectors started at LSA (5,3,3) and ended at LSA (6,0,1) based on the exemplary flash data structure shown in FIG. 15A. Next, at data sector buffer pointer SID2, two sectors (LSA (5,3,3) and LSA (6,0,0)) are shown. Since both data sectors are in the first data range pointed by SID1, this situation is referred to as fully overlapped data range. Other two data ranges pointed by SID3 and SID4 have only partially overlapped data range with the first data range. The overlapped data regions are areas that can be regrouped in data sector buffer to improve performance of data transfer operation in accordance with UAS protocol and USB 3.0 specification. Additionally, due to practical limitation of the RAM, the queue and correspond data sector buffer are implemented with a limited size. To ensure the incoming data and commands can be kept in the queue and data sector buffer, a full indicator is configured for indicating the queue is full.

Flash memory data structure 1500 is used in first and second examples of command regrouping operation shown in FIGS. 16A-16B and 17A-17B, respectively. In the first example, the first command (indicated by circle number 1) has a data sector range between LSA (5,3,2) and LSA (6,0,1), which corresponds to start LSA (5,3,2) and sector count of four. These four data sectors are placed in data sector buffer referenced by a pointer "SID1". The second command has a data range between LSA (5,3,3) and LSA (6,0,0) stored in data sector buffer referenced by "SID2". Similarly, "SID3" for the third command and "SID4" for the fourth command.

Based on the overlapping data range definitions of FIG. 15D, data ranges between first and second commands are fully overlapped. Data ranges between first and third commands are partially overlapped. Data ranges between first and fourth commands are fully overlapped, while data ranges between third and fourth commands are partially overlapped. As shown in FIG. 16B, these overlapped data ranges can be compacted together to reduce the command queue entries therefore increasing efficiency of data transfer operations in UAS based flash memory device.

Figure 16A:
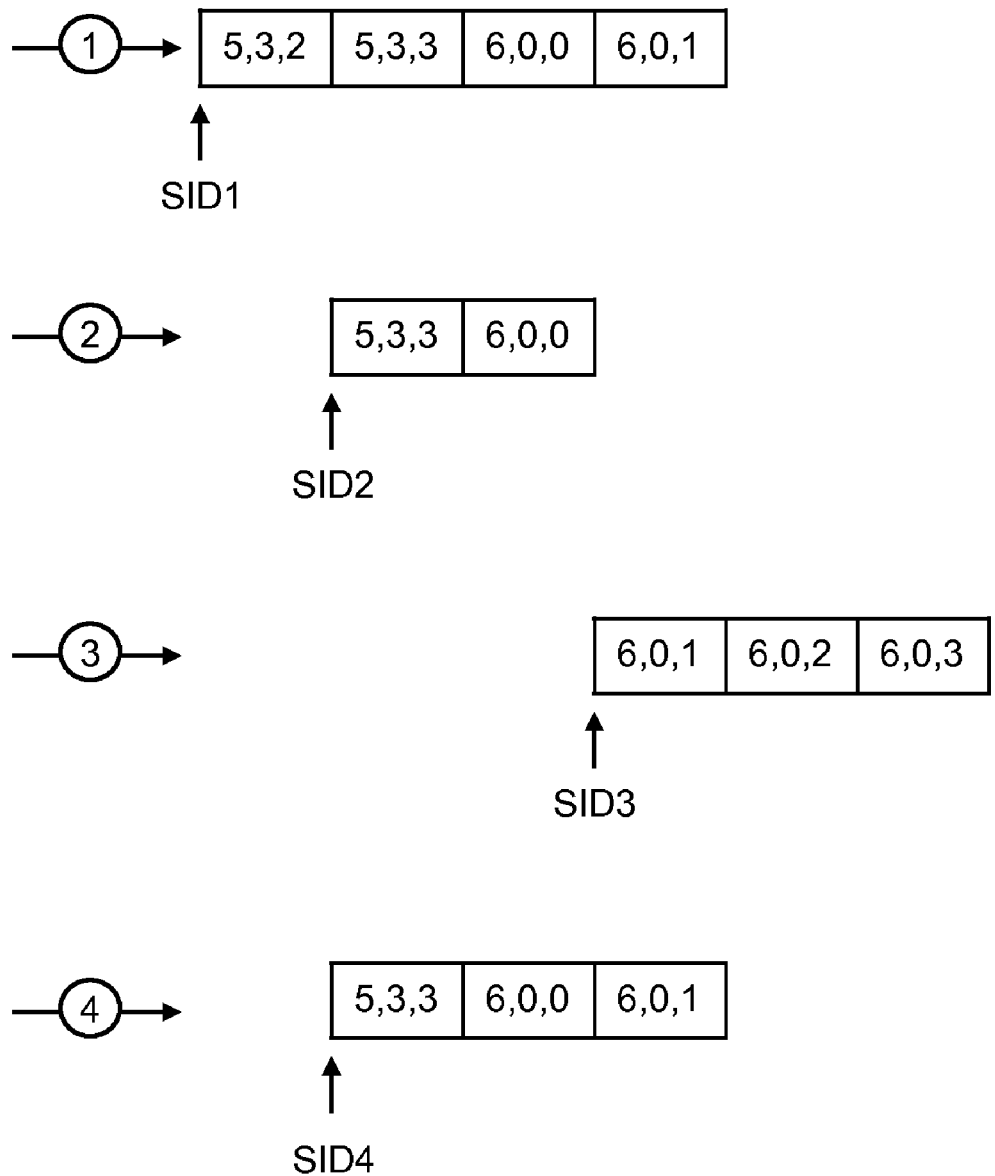
FIGS. 16A-16B shows an example of compacting overlapped data sectors in command queue of an EUSB device.
Figure 16B:
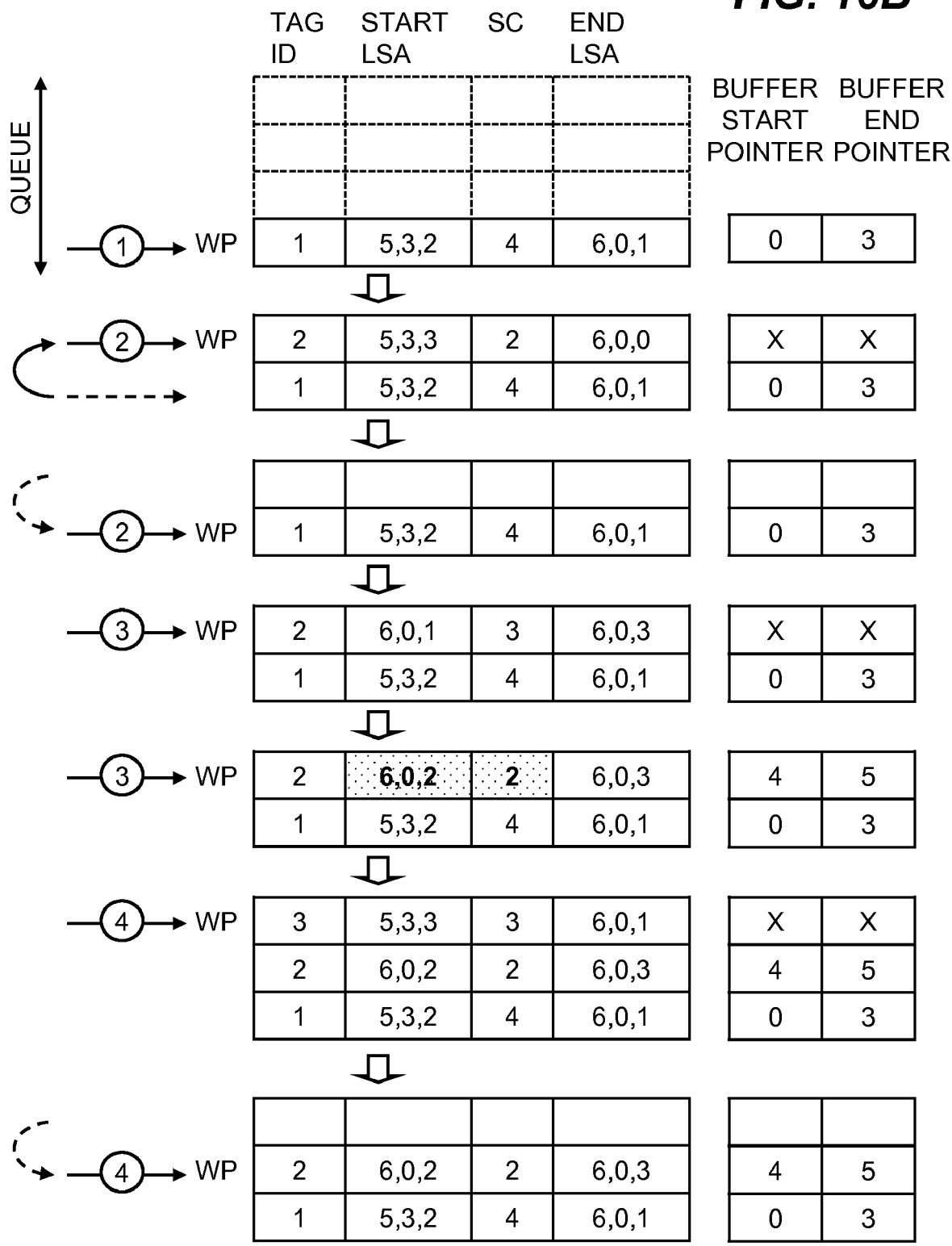

Shown in FIG. 16B is the relevant information (i.e., tag ID, start LSA, SC and end LSA) in the command queue for regrouping operations of the four commands of FIG. 16A. Also included in FIG. 16B are start and end pointers of data sector buffer corresponding to respective commands.

For the first command (indicated by circled number 1), start LSA (5,3,2) with of '4' and end LSA (6,0,1). A write pointer (WP) points initially to the entry corresponds to the first command in the queue. Start and end pointers/addresses of data sector buffer are shown as '0' and '3' in this example. The command is assigned tag ID of '1'. For those of ordinary skill in the art would know, the pointer to data sector buffer can be other values, for example, '41' and '44'. As long as the number of consecutive data sectors matches the data sector range of the command, it would accomplish the purpose.

Next, the second command (indicated by circled number 2) is placed in the queue indicated by WP and initially assigned tag ID of '2'. Since the data range of the second command is fully overlapped with the previous data range (first command), there is no need to store the data sectors of the second command in a separated location in data sector buffer. Overwriting of data sectors correspond to LSA (5,3,3) and LSA (6,0,0) in data sector buffer is sufficient. In other words, data sector for LSA (5,3,3) is written to data sector buffer pointer '1', and LSA (6,0,0) to pointer '2'. Since there is no need to store this command in the queue, WP moves back to original location (i.e., first command entry).

The third command (indicated by circled number 3) is placed in the queue assigned with a tag ID of '2'. Since there is a partial overlapped data range with previous data range, the overlapped data sectors can be written to corresponding location in data sector buffer. In this command, data sector for LSA (6,0,1) is the overlapped sector. Start LSA for the third command (tag ID=2) is then modified to LSA (6,0,2) and sector count to '2' shown as shaded entries. As a result, two data sectors need to be kept in separate locations in data sector buffer (denoted as start and end pointers '4' and '5', respectively).

Finally, the fourth command (indicated by circled number 4) is placed in the queue assigned a tag ID of '3' initially. Again the data range is fully overlapped with that of the first command. So instead of keeping the fourth command as a separate entry in the queue, updating of corresponding data sectors in data sector buffer is sufficient.

It is evident that command regrouping operation allows commands to be combined in the queue and data sectors compacted in the data sector buffer, thereby saving memory space. Also updating memory in data sector buffer is much more efficient than updating flash memory, which leads to faster execution of data transfer operations.

Figure 17A:
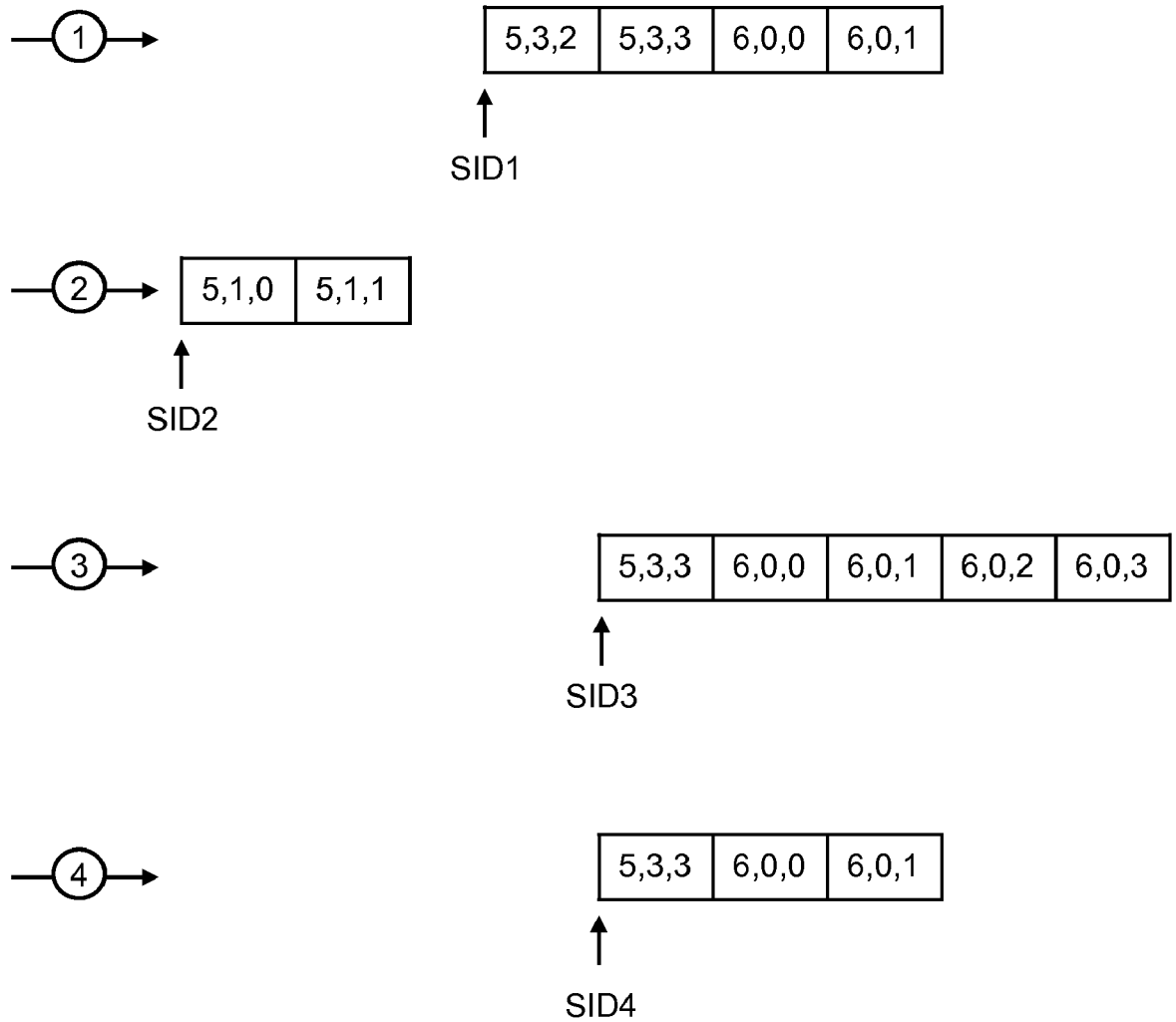
FIGS. 17A-17B shows another example of compacting overlapped data sectors in command queue of an EUSB device.
Figure 17B:
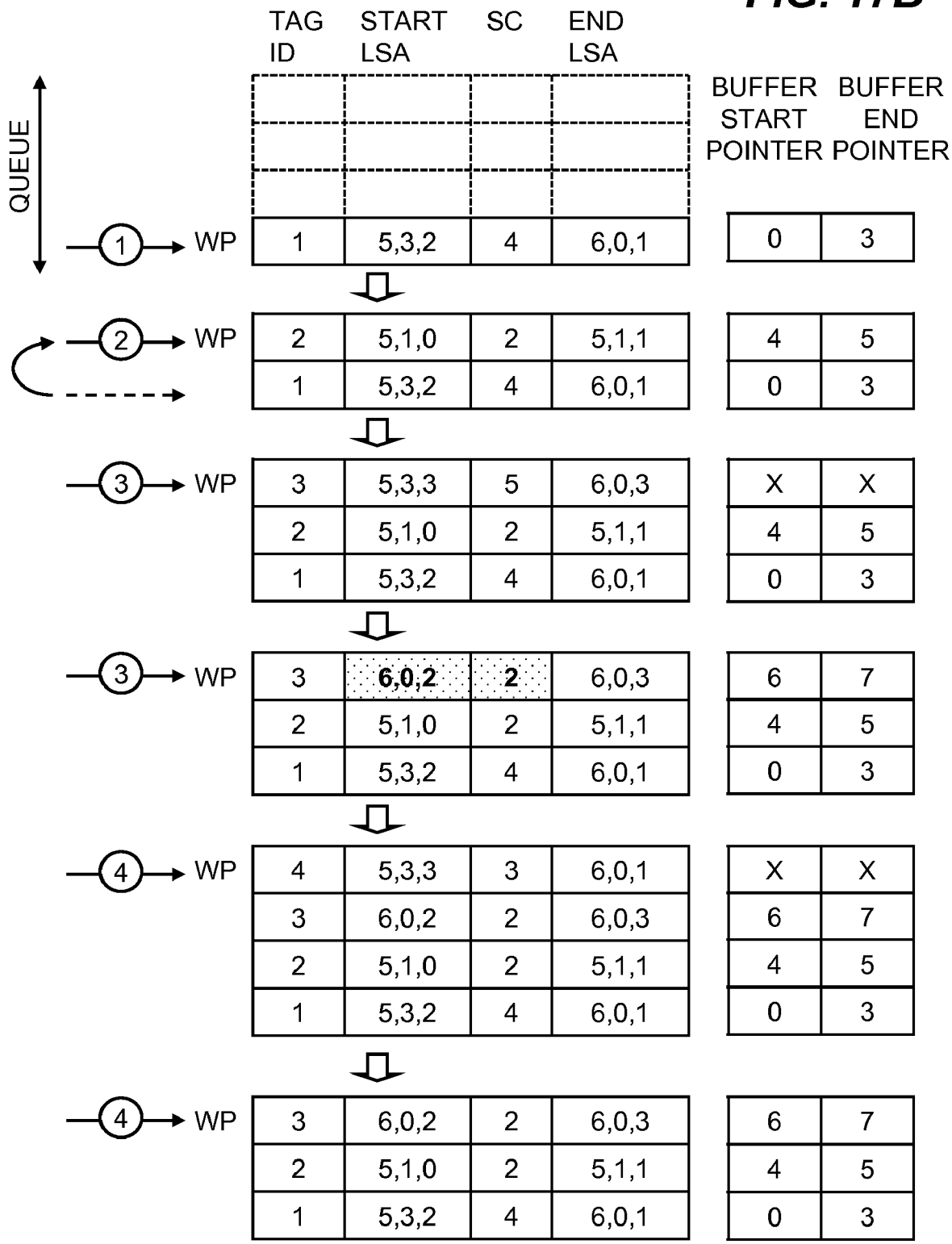

The first command of the second example shown in FIGS. 17A-17B is the same as the one in the first example. The second command is different, it does not have any overlapped data range with the first command. The third command is partially overlapped with the first, while the fourth command is fully overlapped with the first. The regrouping operation sequence shown in FIG. 17B shows both data ranges are stored in data sector buffer for the first and second commands because of no overlapped data range. Due to partially overlapped data range, only portion of data range of the third command is stored. The fourth command is not kept, corresponding data sectors in data sector buffer are updated or overwritten.

Figure 18A:
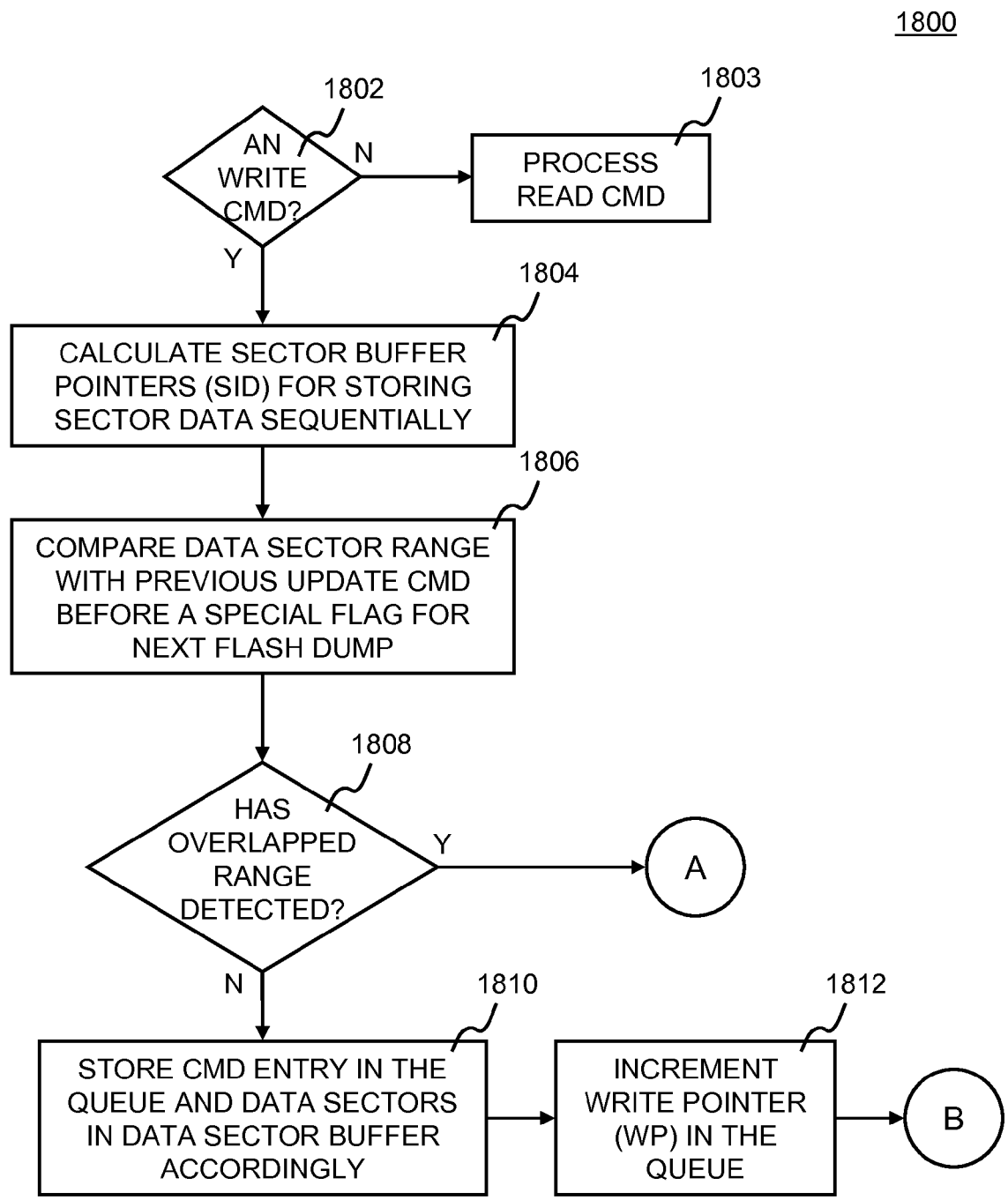
FIGS. 18A-18C collectively is a flowchart showing a process of command regrouping operations in command queue of an EUSB device.
Figure 18B:
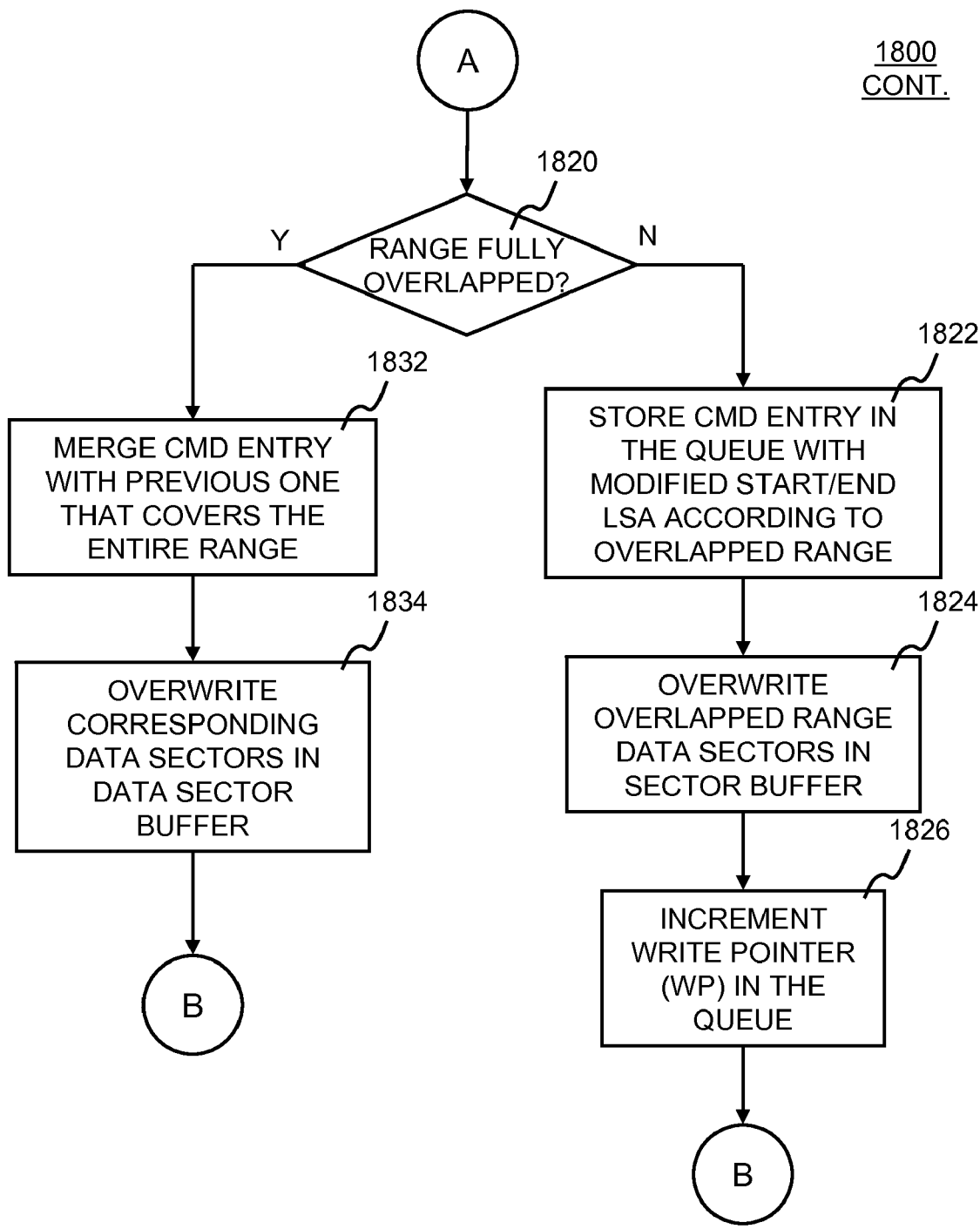
Figure 18C:
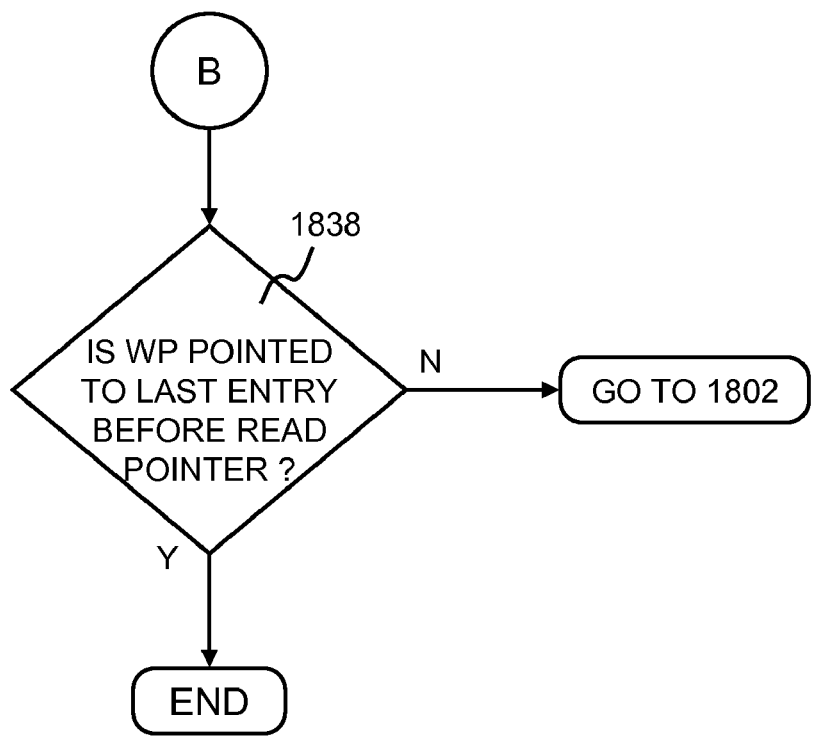

FIGS. 18A-18C collectively is a flowchart showing a process 1800 of command regrouping operations in a command queue of a UAS based flash memory device. Process 1800 is preferably understood with other figures especially FIGS. 2A, 16A-16B, 17A-17B, 19, and 22A-D Process 1800 starts at decision 1802, it is determined whether the received command (i.e., command IU received through command pipe 224) in the queue of the UAS based flash memory device is a data update (i.e., write or erase/trim) command. If not, process 1800 moves to step 1803 to process a read command. Otherwise, at step 1804, the device's firmware calculates start and end pointers of corresponding data sector buffer 230 (see examples in FIGS. 16A-B, 17A-B) for sequentially storing data sectors associated with the received command. For example, sector count (i.e., data sector range) of the command indicates the number of data sectors that need to be stored. Next, at step 1806, data sector range of the current command is compared with previous commands before a flash dump flag (e.g., "FF33 ") in the queue to determine whether there is any overlapped data range at decision 1808. If no overlapped is detected (e.g., between first and second commands of FIG. 17B), process 1800 moves to step 1810 by storing the data sectors of the current command to the data sector buffer according to the start/end pointers calculated in step 1804. Then the write pointer (WP) is incremented to the next command entry in the queue at step 1812 (see examples in FIGS. 16A-B, 17A-B). Next, at decision 1838 (FIG. 18C), the WP is checked against the read pointer (RP) of the queue to determine whether the WP points to last entry before RP (see FIGS. 22A-D). If so, there is no more command to be regrouped, process 1800 ends. Otherwise, process 1800 goes back to step 1802 for another command.

Referring back to decision 1808, if any overlapped data range has been detected. Process 1800 moves to next decision 1820 to determine whether the data range is fully overlapped. If so, process 1800 follows the "Y" branch to step 1832, in which the current command entry is merged with the previous one that has overlapped data range. And, at step 1834, data sectors are written to corresponding locations of data sector buffer to overwrite. Again, process 1800 moves to decision 1838 (FIG. 18C) to perform the operations described above.

If, however, the data range is partially overlapped, process 1800 moves to step 1822. The command entry is stored in the queue with a modified data range with corresponding modified start or end LSA. Next, at step 1824, data sectors of the overlapped data range are overwritten in the data sector buffer. The WP is incremented to the next entry in the queue at step 1826 before process 1800 moves to decision 1838 (FIG. 18C) to perform the same operations described above.

FIGS. 19A-19B show two alternative examples of how partially overlapped data range is compacted and overwritten in the data sector buffer. Again, the examples are based on the flash data structure 1500 of FIG. 15A.

In example 1 shown in FIG. 19A, the partially overlapped data range (shown as shaded region) is a data sector corresponded to LSA (5,3,2), which is stored in the data sector buffer indicated by pointer "1". There are two commands in the example 1; earlier command has start LSA (5,3,1) and end LSA (5,3,2), while the second command has start LSA (5,3,2) and end LSA (6,0,1).

The earlier command occupies the data sector buffer data sectors pointed by "0" and "1". Overlapped data sector "1" is overwritten when the later command is placed in the queue. Instead of adjusting start LSA of the later command, end LSA of the earlier command is adjusted to LSA (5,3,1).

For alternative example 2 shown in FIG. 19B, a similar regrouping operation by compacting date sectors in the data sector buffer is performed to free up data sector indicated by "0", because the later command's data sector "5" replaces data sector "0" in the example 2.

Figure 20:
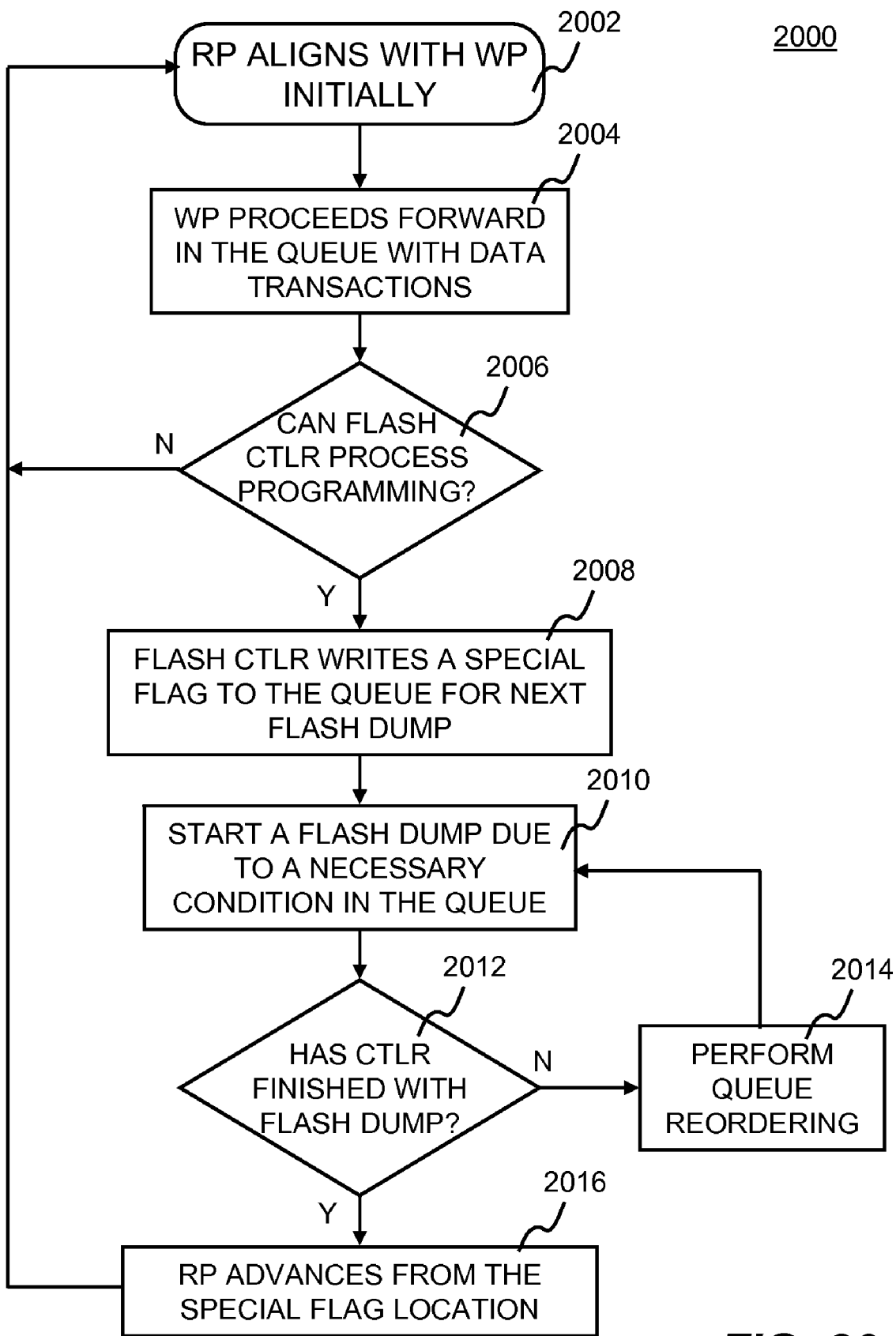
FIG. 20 is a flowchart illustrating a process of locating read pointer of the command queue.

FIG. 20 is a flowchart showing a process 2000 of locating read pointer of the queue of a UAS based flash memory device. Process 2000 starts when the read pointer (RP) is aligned with the write pointer (WP) initially at step 2002. Next, at step 2004, WP proceeds forward in the queue, as additional data transactions are received and placed in the queue. Next, at decision 2006, it is determined whether the flash memory device's controller can process a data programming (i.e., data write operation). If not, process 2000 moves back to initial step 2002. Otherwise, process 2000 moves to step 2008 with a flash dump flag (e.g., "FF33") written into the queue. The flash dump flag is configured as an indicator for UAS based flash memory device to flush (i.e., write) data from the data sector buffer to the flash memory arrays. Next, at step 2010, a flash dump is performed due to a necessary condition (e.g., a request required updated data in flash memory arrays). At decision 2012, it is determined whether the flash dump has finished. If so, RP is advanced forward from the flash dump flag location at step 2016 and process 2000 moves back to the initial step 2002. Otherwise, a queue reordering operation is performed at step 2014 in conjunction with the flash dump operation.

Figure 21:
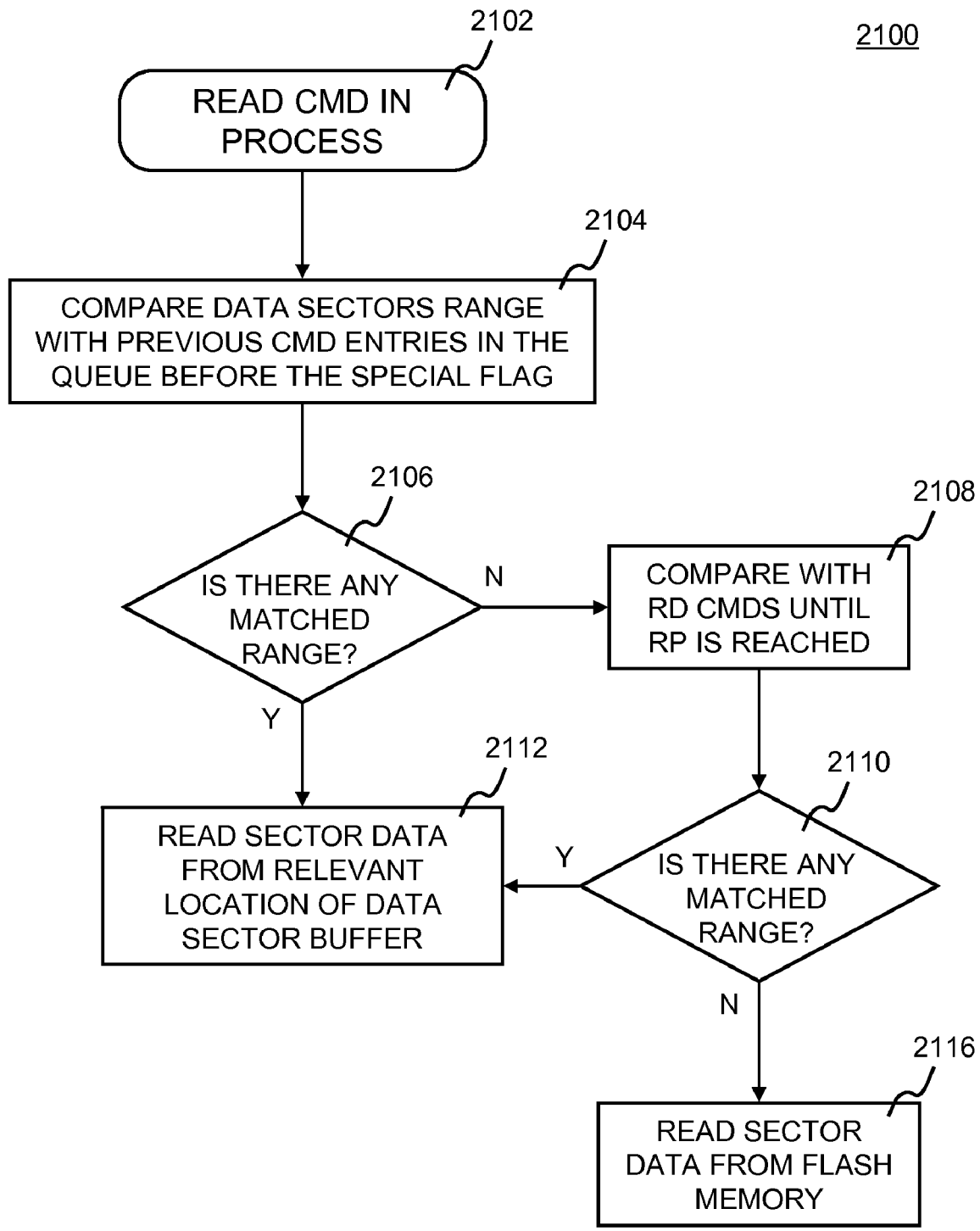
FIG. 21 is a flowchart showing a process of conducting a read command.

FIG. 21 is a flowchart showing a process 2100 of read command in a UAS based flash memory device. Process 2100 starts at step 2102 by receiving a read command in the queue. At step 2104, data sectors associated with the command are compared with previous write command entries in the queue before the flash dump flag. (zone A of FIG. 22A) At decision 2106, it is checked if there is any matched data range. If so, data sectors are read from corresponding locations from the data sector buffer at step 2112. Otherwise, process 2100 compares data ranges of read command entries (zone B of FIG. 22A) at step 2108. At decision 2110, it is checked again whether there is any matched data range. If so, the data sectors are read from corresponding locations from the data sector buffer. Otherwise, data sectors are read from the flash memory arrays at step 2116.

Figure 22A:
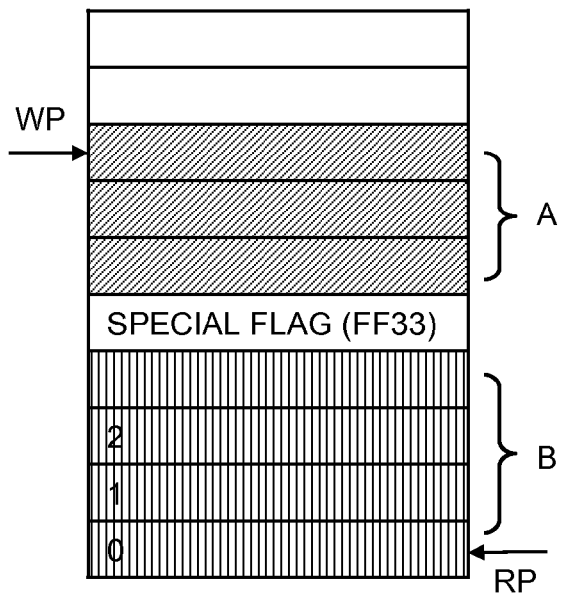
FIGS. 22A-22D collectively show various situations of the command queue.
Figure 22C:
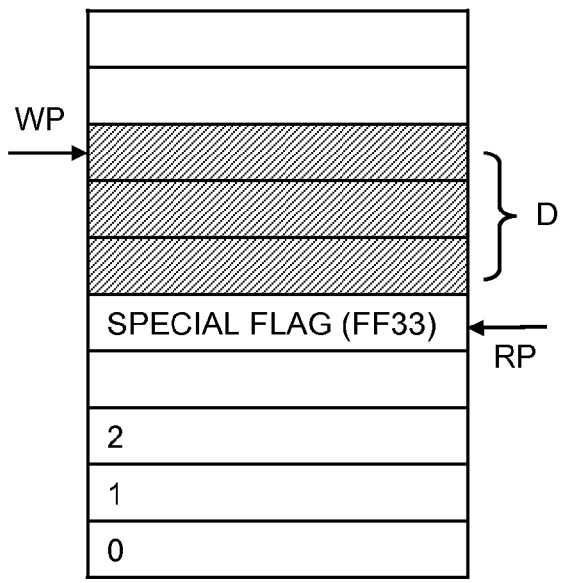
Figure 22B:
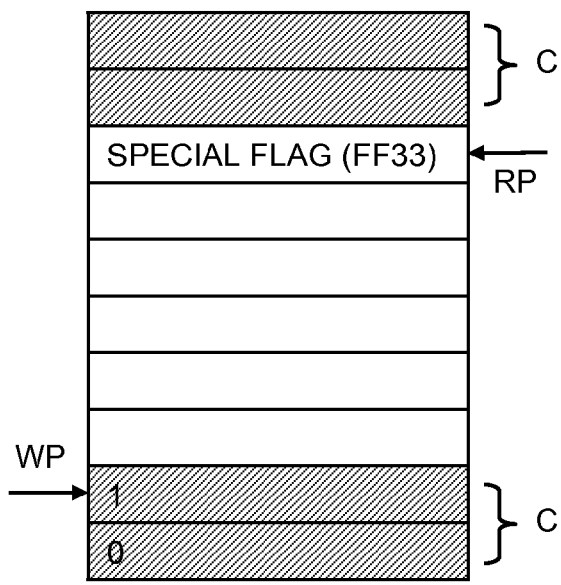

FIGS. 22A-22D show various relative positions of WP, RP and flash dump flag in the queue. In FIG. 22A, command entries in zone A (area with diagonal shade lines) are data update commands (i.e., write, erase/trim), while entries in zone B (area with vertical shade lines) are date read commands. In FIG. 22B, command entries in zone C (area with diagonal shade lines) are data update commands, and no data access (i.e., read) commands are in the queue. This is a situation where a flash dump operation just finished, RP points to the special flag. Zone C is a logical continuous region in the queue due to a circular queue data structure.

Figure 22D:
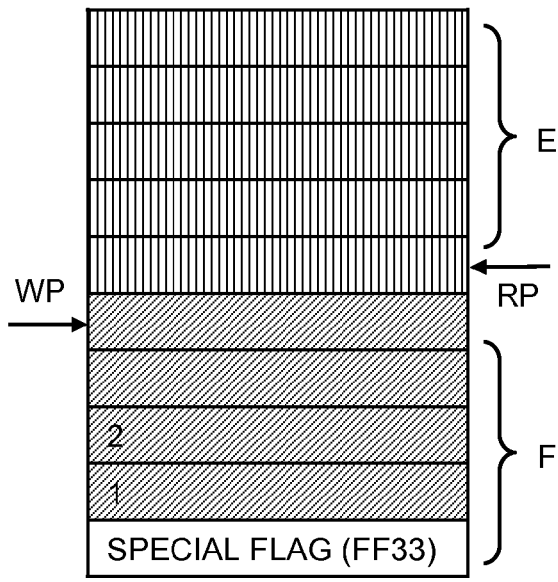

In FIG. 22C, command entries in zone D (area with diagonal shade lines) are data update commands. In FIG. 22D, WP points to a last entry before RP. Command entries in zone E (area with vertical shade lines) are for read commands, while command entries in zone F (area with diagonal shade lines) are for data update commands.

Figure 23A:
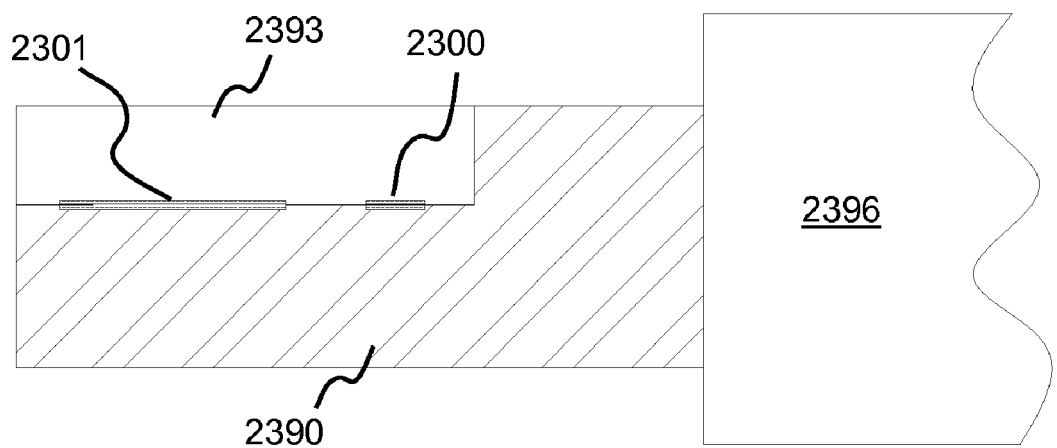

FIGS. 23A-I show a second embodiment of extended USB connectors and sockets having metal contact pins on just one of the surfaces of the pin substrates. FIG. 23A illustrates an extended 9-pin USB connector plug having four metal pins and five extended metal pins on a top surface of pin substrate. In FIG. 23A, the extended connector has plastic housing 2396 that the user can grip when inserting the connector plug into a socket. Pin substrate 2390 supports metal contact pins 2300, 2301 on the top surface. Pin substrate 2390 is an insulator such as ceramic, plastic, or other material. Metal leads or wires can pass through pin substrate 2390 to connect metal contact pins 2300, 2301 to wires inside plastic housing 2396 that connect to the peripheral device.

The length of pin substrate 2390 is longer than that of a prior-art USB connector. The extension in length can be 2-5 millimeters. Tip-end metal contact pins 2301 are located mostly in the extension region beyond L2. Metal cover 2393 is a rectangular tube that surrounds pin substrate 2390 and has an open end.

Figure 23B:
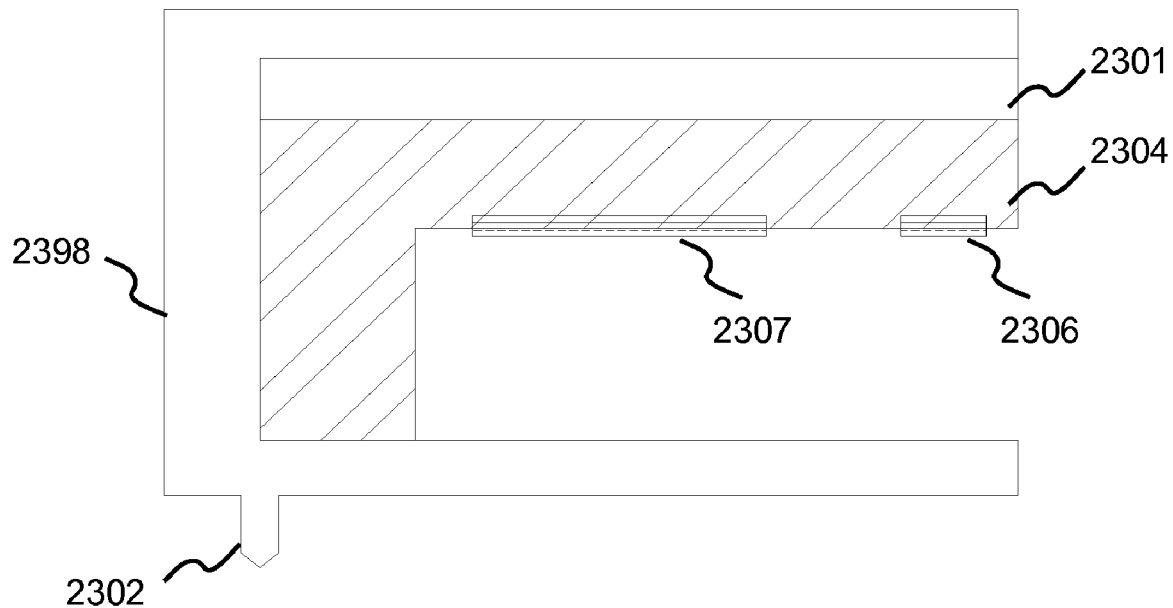

FIG. 23B shows an extended-USB socket having four metal contact pins and five extended metal pins on just one of the surfaces of the pin substrate. Pin substrate 2304 has metal contact pins 2306, 2307 formed on a bottom surface facing a cavity that pin substrate 90 of the connector fits into.

Metal cover 2398 is a metal tube that covers pin substrate 2304 and the opening underneath. Metal cover 2393 of the USB connector fits in gaps 2301 between metal cover 98 and the top and sides of pin substrate 104. Mounting pin 2302 can be formed on metal cover 98 for mounting the extended USB socket to a PCB or chassis.

FIG. 23C shows an extended 9-pin USB connector plug inserted into the 9-pin USB socket. The metal contact pins 2307 and 2306 formed on the bottom surface of the pin substrate 2304 of the socket are in contact with the metal pins 2301 and 2300, respectively, on the pin substrate 230.

FIG. 23D shows the bottom surface of socket pin substrate 2304, which supports metal contact pins 2306, 2307. Primary metal contact pins 2306 are in a first row of five pins that are closest to the socket opening. Secondary metal contact pins 2307 are in a second row of 4 pins that are farthest from the socket opening.

Secondary metal contact pins 2307 include the four USB pins. The primary metal contact pins 2306 include extension pins for supporting other interface standards, such as PCI-Express.

When the extended USB connector is fully inserted into the extended USB socket, the tip of pin substrate 2390 fits into the cavity under pin substrate 2304 of the extended USB socket. On the upper surface of connector pin substrate 90, metal contact pins 2300 make contact with the six primary metal contact pins 2306 of socket pin substrate 2304, and metal contact pins 2301 at the tip of the top surface of pin substrate 90 make contact with secondary extension metal contact pins 2307 on the downward-facing surface of pin substrate 104.

Figure 23F:
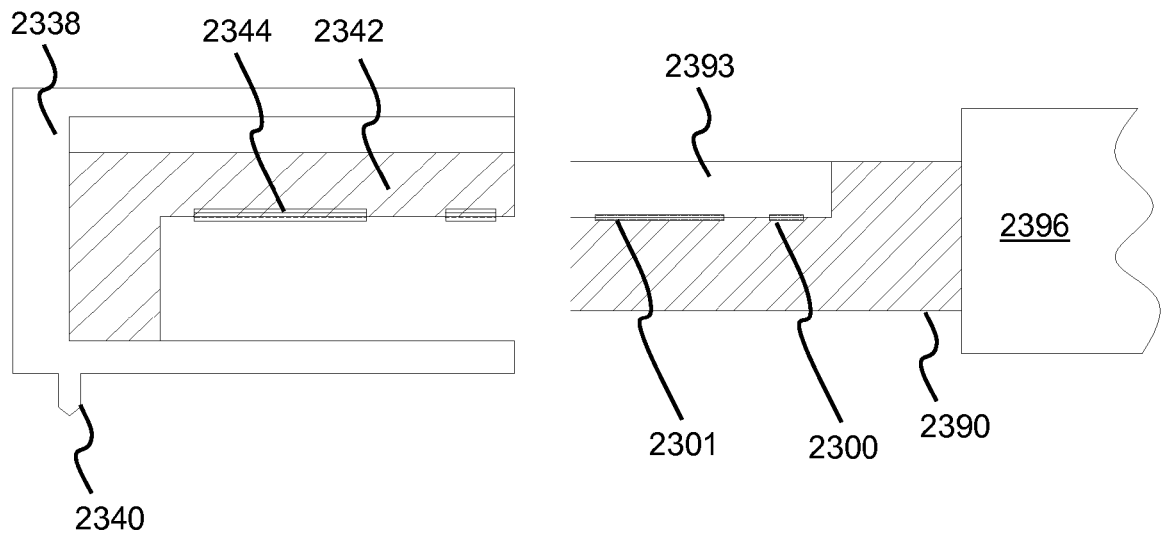
Figure 23G:
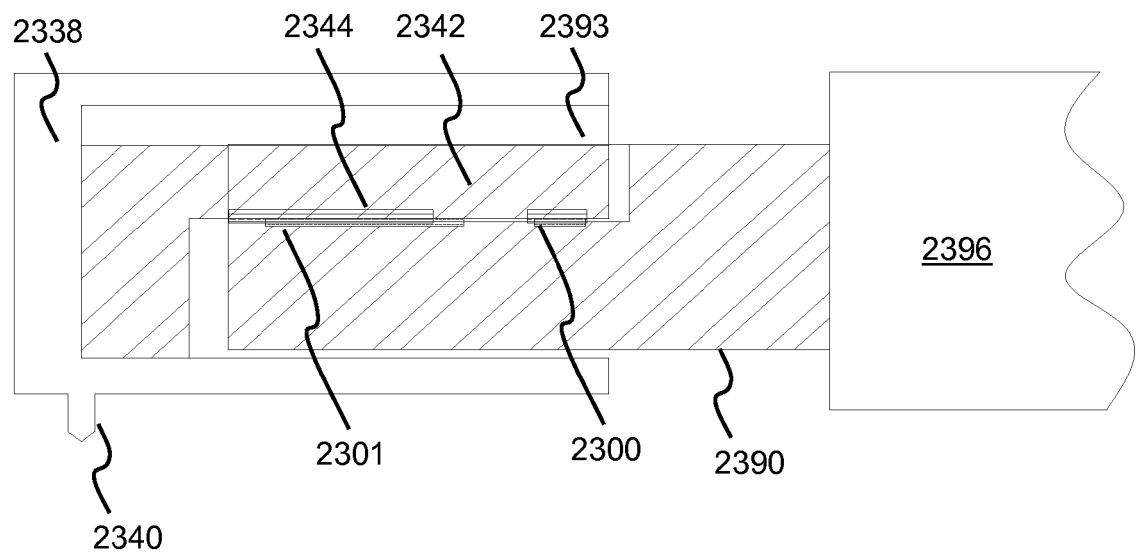

FIG. 23F shows an extended 9-pin USB connector plug just before insertion into a standard 4-pin USB socket. When fully inserted, as shown in FIG. 23G, the tip of pin substrate 2390 fits under socket pin substrate 2342. On the upper surface of connector pin substrate 2390, the 1st, 3rd, 4th, and 6th of tip-end metal contact pins 2301 make contact with the four USB metal contact pins 2344 of socket pin substrate 2342. The back-end row of metal contact pins 2300 on the top surface of pin substrate 2390 do not make contact with socket metal cover 2338 or any metal contacts since they are too far back on connector pin substrate 2390. Thus only the four standard USB pins (metal contact pins 2344, 2301) are electrically contacted.

Figure 23H:
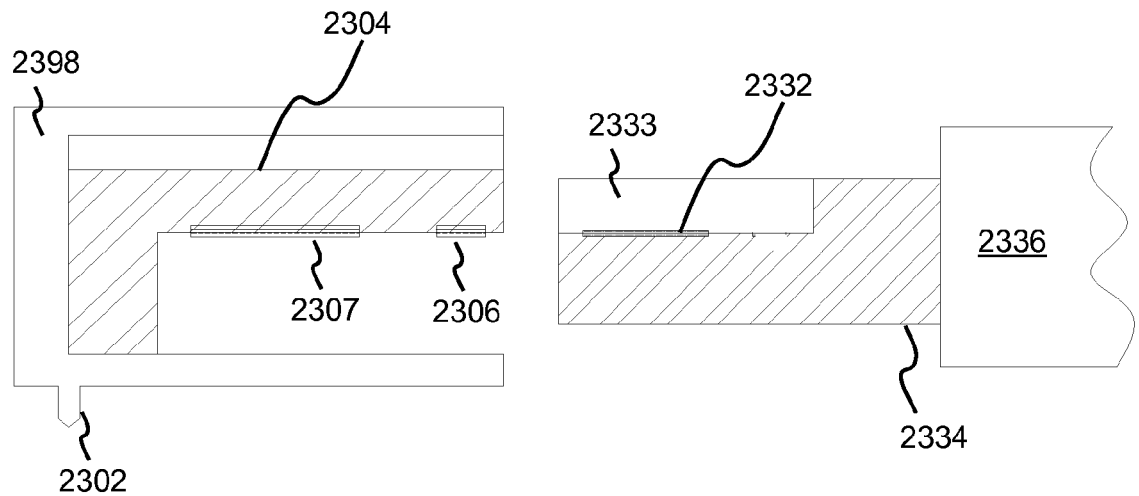
Figure 23I:
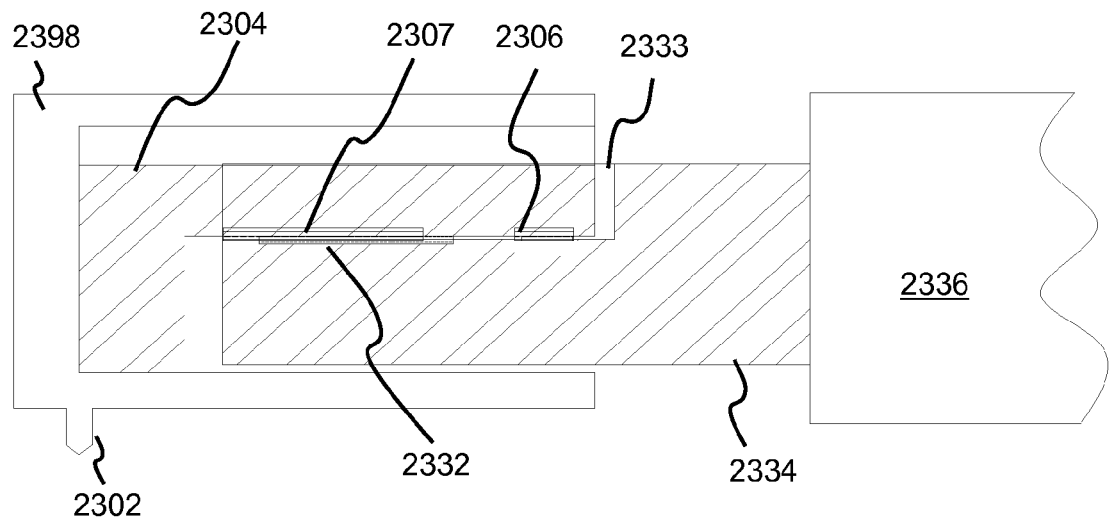

FIG. 23H shows a standard 4-pin USB connector plug just before insertion into an extended 9-pin USB socket. When fully inserted, as shown in FIG. 23I, the tip of connector pin substrate 2334 fits under socket pin substrate 2304, but does not reach the back of the socket cavity. On the upper surface of connector pin substrate 2334, metal contact pins 2332 make contact with the 1st, 3rd, 4th, and 6th of the four primary metal contact pins 106 of socket pin substrate 2304. Secondary metal contact pins 2307 on substrate 104 do not touch connector metal cover 2333 since the depth of the extended USB socket is greater than the length of the prior-art USB connector. Thus only the four standard USB pins (metal contact pins 2332, 2306) are electrically contacted. As illustrated in FIGS. 23F-23I, the extended 9-pin USB connector plugs and socket are electrically and mechanically compatible with standard prior-art 4-pin USB sockets and connector plugs.

Figure 24:
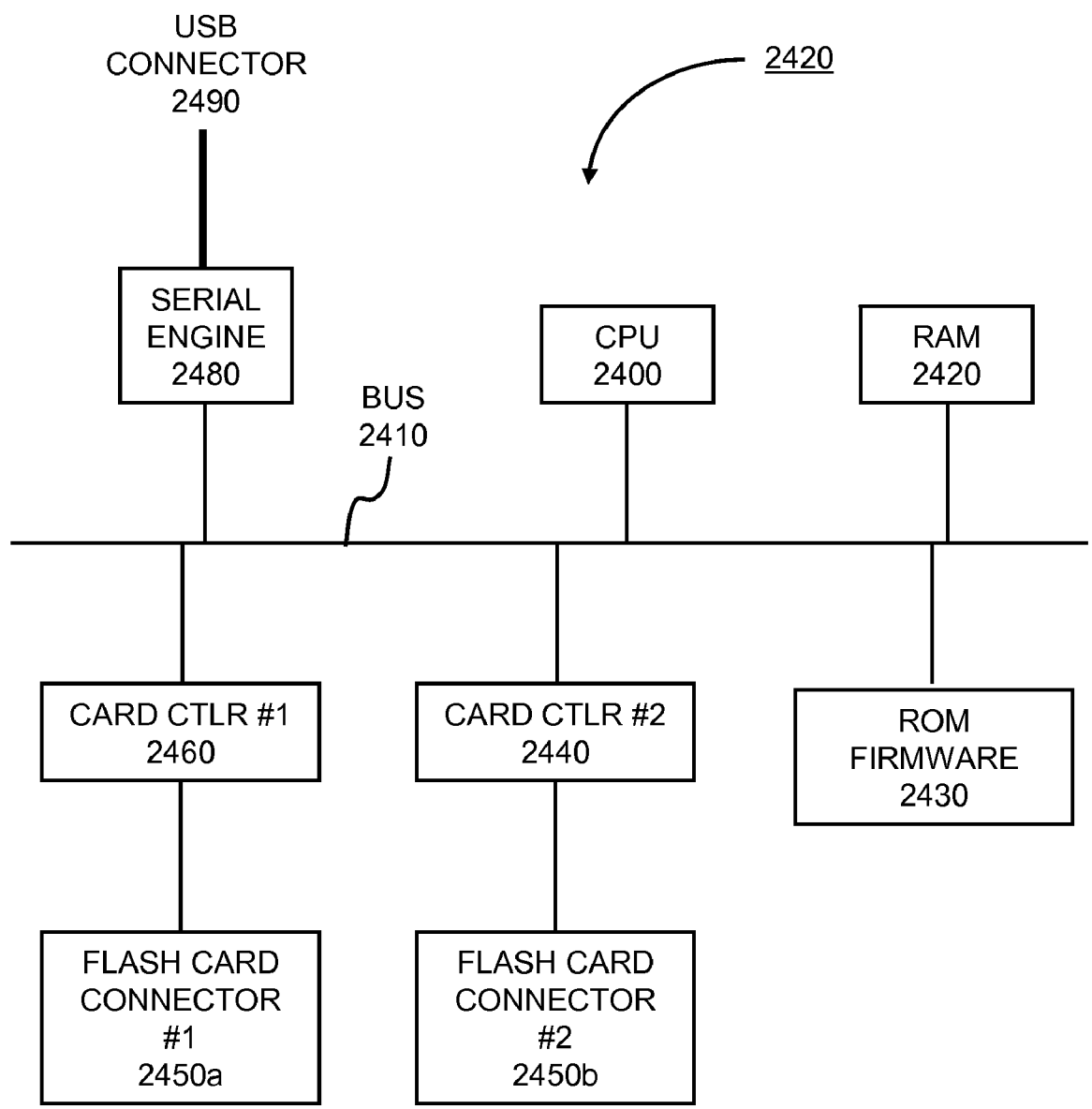
FIG. 24 is a block diagram showing a USB card reader.

FIG. 24 shows a USB card reader 2420. USB card reader 2420 includes a processor 2400 coupled to a bus 2410. Additionally, a random access memory (RAM) device 2420 and a read-only memory device (ROM) 2430 may be coupled to the bus 2410. A USB serial engine 2480 may be coupled to bus 2410 including a USB connector 2490. A pair of card controllers 2440 and 2460 may be coupled to bus 2410 including flash card connectors 2450a-b, respectively. Card controllers 2440 and 2460 may include controller adapted to interface with flash memory cards having different connections such as a proprietary connection, Multi Media Card (MMC), Secure Digital (SD), Memory Stick (MS), Smart Media (SM), Compact Flash (CF), XD, PCI Express, SATA, SCSI and IEEE 1394. Although only two card controllers are shown, those skilled in the art will appreciate that a plurality of card controllers can be coupled to bus 2410. The USB connector 2490 includes two pairs of differential serial buses:
 (i) first pair differential serial bus with a first pin carry "+" signal and a second pin carry "−" signal, and;
 (ii) second pair differential serial bus with a first pin carry "+" signal and a second pin carry "−" signal.

FIG. 25 shows a structural diagram showing connector pins of COB (Chip On Board) USB drive. There are seven pins on the COB USB drive 2520. Host 2510 is configured for receiving the connector pins of COB USB drive 2520. The card is not limited to COB package, the connector pins is also not limit to seven pins, and it can be other technologies and other mechanical outlines. For example, in one of other embodiments, FIG. 26 shows a structural diagram showing connector pins of Secured Digital (SD) card. There are nine pins disposed on the SD card 2620. Host 2610 can be the same host 2510 with different receptacle that accepts the SD card 2620. FIG. 27 shows a USB 3.0 only connector 2720 and receptacle 2710. It is noted that USB 3.0 only connector comprises seven pins including super speed transfer pins (i.e., pins for 5 Gb/sec data rate). USB 2.0 compatible pins are removed thereby not backward compatible. Furthermore, the USB 3.0 only device not only has a super speed (5 Gb/sec) bandwidth, it also saves power over the USB 2.0 standard, which requires constant polling of the flash device thereby wasting energy. Correlation between USB 3.0 connectors and those of other types (e.g., MMC, SD, etc.) is shown in the following two tables.

TABLE 1

Nine-Pin Structure

| PIN | MMC | SD | USB3.0 DUAL | USB 3.0 ONLY |
|---|---|---|---|---|
| 1 | — | DAT3 | DAT2/Tno | VSSp |
| 2 | CMD | CMD | CMD/Tp0 | VSS |
| 3 | VSS1 | VSS1 | VSS1 | Tp0 |
| 4 | VDD | VDD | VDD | Tn0 |

TABLE 1-continued

Nine-Pin Structure

| PIN | MMC | SD | USB3.0 DUAL | USB 3.0 ONLY |
|---|---|---|---|---|
| 5 | CLK | CLK | CLK | VSS |
| 6 | VSS2 | VSS2 | VSS2 | Rp0 |
| 7 | DAT0 | DAT0 | DAT0 | Rn0 |
| 8 | — | DAT1 | DAT1/Rp0 | VSS |
| 9 | — | DAT2 | DAT2/Rn0 | VDDp |

TABLE 2

Seven-Pin Structure

| PIN | USB 3.0 ONLY |
|---|---|
| 1 | VDDp |
| 2 | VSSp |
| 3 | Tp0 |
| 4 | Tn0 |
| 5 | VSS |
| 6 | Rp0 |
| 7 | Rn0 |

Connectors shown in FIGS. 25-27 are thin connectors that can be placed or inserted into a consumer electronic device (hosts 2510, 2610, 2710), for example, digital camera, camcorder, security monitoring system, cellular telephone, etc.

The algorithms and displays presented herein are not inherently related to any particular computer or other apparatus. Various general-purpose systems may be used with programs in accordance with the teachings herein, or it may prove convenient to construct more specialized apparatus to perform the required method operations. The required structure for a variety of these systems will appear from the description below. In addition, embodiments of the present invention are not described with reference to any particular programming language. It will be appreciated that a variety of programming languages may be used to implement the teachings of embodiments of the invention as described herein.

Although the present invention has been described with reference to specific embodiments thereof, these embodiments are merely illustrative, and not restrictive of, the present invention. Various modifications or changes to the specifically disclosed exemplary embodiments will be suggested to persons skilled in the art. For example, whereas RAM has been shown and described to be used in volatile memory buffer, other volatile memories suitable to achieve the same functionality may be used, for example, DDR, DDR2, DDR3, DDR4, Dynamic RAM, Static RAM. Furthermore, whereas exemplary flash memory data structure has been described and shown with certain limited numbers (e.g., four) of pages and sectors in its non-volatile memory array for illustration simplicity, other numbers of blocks, pages and sectors may be used for accomplishing the same, for example, a UAS based flash memory device can comprise eight sectors per page, 128 pages per block, 64 blocks per die and two dies per chip. Finally, the non-volatile memory device has been shown and described to comprise two or four flash memory modules, other numbers of modules may be used, for example, 8, 16, 32 or any higher numbers that can be managed by embodiments of the present invention. In summary, the scope of the invention should not be restricted to the specific exemplary embodiments disclosed herein, and all modifications that are readily suggested to those of ordinary skill in the art should be included within the spirit and purview of this application and scope of the appended claims.

We claim:

1. A USB-Attached-SCSI (UAS) and Bulk-Only-Transfer (BOT) flash-memory card comprising:

a printed circuit board having a controller and a plurality of non-volatile memory arrays mounted thereon, the controller comprises at least a microprocessor and a random-access-memory (RAM), the RAM being configured as a queue and a corresponding data sector buffer for enabling data transfer operations in parallel and in duplex via two pairs of logical pipes between a host and the plurality of non-volatile memory arrays;

a Universal-Serial-Bus (USB) connector for connecting to a host;

a physical layer, coupled to the USB connector, for generating and receiving physical signals through the USB connector means configured to connect to first and second pairs of differential serial buses, wherein the first pair of differential serial bus comprises a first pin carrying "+" signal and a second pin carrying "−" signal, while the second pair of differential serial bus comprises a first pin carrying "+" signal and a second pin carrying "−" signal;

whereby a not-yet signal is transmitted over the second pair of differential serial bus to the host, when the requested data is not ready to be read from the non-volatile memory arrays or the data sector buffer is full;

a data link layer, coupled to the physical layer, for arranging data packets in a sequence sent through the USB connector;

a protocol layer, coupled to the data link layer, for extracting data and commands from data packets received through the USB connector, and for sending data and status messages through the USB connector;

a UAS/BOT detector for signaling a UAS mode when a UAS identifier and a UAS operation code are detected in a command received by the protocol layer;

a data-out pipe, coupled to receive data packets from the protocol layer, for storing data packets received from the host through the USB connector;

a data-in pipe, coupled to send data packets to the protocol layer, for storing data packets for transmission to the host through the USB connector;

a command pipe, coupled to receive commands from the protocol layer when the UAS mode is signaled, for storing commands received from the host through the USB connector when operating in UAS mode; and a status pipe, coupled to send status messages commands to the protocol layer when the UAS mode is signaled, for storing status messages for transmission to the host through the USB connector when operating in UAS mode;

wherein the data-out pipe is further for storing commands when the UAS mode is not signaled and the UAS/BOT flash memory device is operating in a BOT mode;

wherein the data-in pipe is further for storing status messages when the UAS mode is not signaled and the UAS/BOT flash memory device is operating in the BOT mode, whereby commands are stored in the command pipe when the UAS mode is signaled, and are stored in the data-out pipe when the UAS mode is not signaled.

2. A USB-Attached-SCSI (UAS) and Bulk-Only-Transfer (BOT) host socket comprising:

Universal-Serial-Bus (USB) connector means for connecting to an electronic flash-memory card;

physical layer means, coupled to the USB connector means, for generating and receiving physical signals through the USB connector means configured to connect to first and second pairs of differential serial buses, wherein the first pair of differential serial bus comprises a first pin carrying "+" signal and a second pin carrying "−" signal, while the second pair of differential serial bus comprises a first pin carrying "+" signal and a second pin carrying "−" signal;

data link layer means, coupled to the physical layer means, for arranging packets in a sequence for transmission through the USB connector means;

protocol layer means, coupled to the data link layer means, for inserting data and commands into packets for transmission through the USB connector means, and for receiving data and status messages from the USB connector means;

mode detector means for signaling a USB-Attached-SCSI (UAS) mode and generating a UAS identifier and a UAS operation code in a command for transmission by the protocol layer means;

data-in pipe means, coupled to receive data packets from the protocol layer means, for storing data packets received from the electronic flash-memory card through the USB connector means;

data-out pipe means, coupled to send data packets to the protocol layer means, for storing data packets for transmission to the electronic flash-memory card through the USB connector means;

command pipe means, coupled to send commands to the protocol layer means when the UAS mode is signaled, for storing commands sent from the host through the USB connector means when operating in UAS mode; and status pipe means, coupled to receive status messages commands to the protocol layer means when the UAS mode is signaled, for storing status messages received from the electronic flash-memory card through the USB connector means when operating in UAS mode;

wherein the data-out pipe means is further for storing commands when the UAS mode is not signaled and the electronic flash-memory card is operating in a Bulk-Only-Transfer (BOT) mode;

wherein the data-in pipe means is further for storing status messages when the UAS mode is not signaled and the electronic flash-memory card is operating in the BOT mode;

whereby commands are stored in the command pipe means when the UAS mode is signaled, and are stored in the data-out pipe means when the UAS mode is not signaled.

* * * * *